United States Patent
You et al.

(10) Patent No.: US 9,330,913 B2
(45) Date of Patent: May 3, 2016

(54) SEMICONDUCTOR DEVICE AND METHOD OF FABRICATING THE SAME

(75) Inventors: Jang-Hyun You, Seoul (KR); Jong-Min Lee, Ulsan (KR); Dong-Hwa Kwak, Suwon-Si (KR); Tae-Yong Kim, Osan-Si (KR); Jong-Hoon Na, Seongnam-Si (KR); Young-Woo Park, Seoul (KR); Dong-Sik Lee, Yongin-Si (KR); Jee-Hoon Han, Hwaseong-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 789 days.

(21) Appl. No.: 12/912,744

(22) Filed: Oct. 27, 2010

(65) Prior Publication Data

US 2011/0316165 A1 Dec. 29, 2011

(30) Foreign Application Priority Data

Jun. 28, 2010 (KR) ........................ 10-2010-0061267

(51) Int. Cl.
| | |
|---|---|
| *H01L 29/40* | (2006.01) |
| *H01L 21/033* | (2006.01) |
| *H01L 21/28* | (2006.01) |
| *H01L 21/308* | (2006.01) |
| *H01L 21/3213* | (2006.01) |
| *H01L 21/762* | (2006.01) |
| *H01L 27/115* | (2006.01) |
| *H01L 29/66* | (2006.01) |

(52) U.S. Cl.
CPC ...... *H01L 21/0337* (2013.01); *H01L 21/28273* (2013.01); *H01L 21/3086* (2013.01); *H01L 21/32139* (2013.01); *H01L 21/76229* (2013.01); *H01L 27/11521* (2013.01); *H01L 27/11536* (2013.01); *H01L 29/66825* (2013.01)

(58) Field of Classification Search
CPC ................... H01L 21/0337; H01L 21/28273; H01L 21/3086; H01L 21/76229; H01L 21/32139; H01L 29/66825; H01L 27/11521; H01L 27/11536
USPC ............ 257/773, E21.575, E23.169; 438/618
See application file for complete search history.

(56) References Cited

U.S. PATENT DOCUMENTS

| | | | |
|---|---|---|---|
| 5,635,748 A | 6/1997 | Nishizaka | 257/390 |
| 6,071,789 A * | 6/2000 | Yang | H01L 28/60 257/E21.009 |
| 6,638,441 B2 | 10/2003 | Chang et al. | 216/46 |
| 7,291,560 B2 | 11/2007 | Parascandola et al. | 438/689 |
| 7,312,158 B2 | 12/2007 | Miyagawa et al. | 438/737 |

(Continued)

OTHER PUBLICATIONS

Japanese Patent Publication No. JP2009-094379 with Publication date of Apr. 30, 2009.

(Continued)

*Primary Examiner* — Vongsavanh Sengdara
(74) *Attorney, Agent, or Firm* — Monica H. Choi

(57) ABSTRACT

A semiconductor device includes first, second, and third conductive lines, each with a respective line portion formed over a substrate and extending in a first direction and with a respective branch portion extending from an end of the respective line portion in a direction different from the first direction. The branch portion of a middle conductive line is disposed between and shorter than the respective branch portions of the outer conductive lines such that contact pads may be formed integral with such branch portions of the conductive lines.

16 Claims, 92 Drawing Sheets

(56) References Cited

U.S. PATENT DOCUMENTS

| | | |
|---|---|---|
| 7,611,944 B2 | 11/2009 | Tran et al. .................. 438/241 |
| 7,648,919 B2 | 1/2010 | Tran et al. .................. 438/738 |
| 7,727,889 B2 | 6/2010 | Choi et al. .................. 438/669 |
| 7,776,683 B2 | 8/2010 | Tran et al. .................. 438/241 |
| 8,003,544 B2 | 8/2011 | Sato et al. .................. 438/717 |
| 8,008,211 B2 | 8/2011 | Tamura et al. .............. 438/717 |
| 8,110,506 B2 | 2/2012 | Min et al. ................... 430/730 |
| 8,142,986 B2 | 3/2012 | Sim et al. ................... 430/313 |
| 8,158,476 B2 | 4/2012 | Tran et al. .................. 438/241 |
| 8,216,947 B2 | 7/2012 | Lee et al. ................... 438/717 |
| 8,507,341 B2 | 8/2013 | Tran et al. .................. 438/241 |
| 8,859,362 B2 | 10/2014 | Tran et al. .................. 438/241 |
| 9,147,608 B2 | 9/2015 | Tran et al. .................. 438/241 |
| 2006/0234166 A1 | 10/2006 | Lee et al. |
| 2007/0123037 A1 | 5/2007 | Lee et al. |
| 2007/0210449 A1* | 9/2007 | Caspary ............... H01L 27/105 257/734 |
| 2007/0261016 A1* | 11/2007 | Sandhu ................. B82Y 10/00 716/50 |
| 2008/0084729 A1* | 4/2008 | Cho ........................ G11C 8/08 365/72 |
| 2009/0176374 A1 | 7/2009 | Tamura et al. |
| 2009/0176376 A1 | 7/2009 | Yi et al. |
| 2009/0263749 A1 | 10/2009 | Sim et al. |
| 2009/0269924 A1 | 10/2009 | Choi et al. |
| 2010/0096719 A1 | 4/2010 | Lee et al. |
| 2010/0155959 A1* | 6/2010 | Park .................. H01L 21/0337 257/773 |
| 2010/0285409 A1* | 11/2010 | Tanaka ............... H01L 21/0337 430/315 |
| 2011/0117745 A1 | 5/2011 | Sato et al. |
| 2012/0252185 A1 | 10/2012 | Lee et al. |

OTHER PUBLICATIONS

Japanese Patent Publication No. JP2009-260309 with Publication date of Nov. 5, 2011.
Japanese Patent Publication No. JP2010-118529 with Publication date of May 27, 2010.
Japanese Patent Publication No. JP2011-108812 with Publication date of Jun. 2, 2011.
Chinese Patent Publication No. CN101276818 with Publication date of Oct. 1, 2008.
Chinese Patent Publication No. CN101728332 with Publication date of Jun. 9, 2010.
U.S. Appl. No. 2007/218627 to Lattard et al., having Publication date of Sep. 20, 2007.
Chinese Patent Publication No. CN101079385 with Publication date of Nov. 28, 2007.
Chinese Patent Publication No. CN101151720 with Publication date of Mar. 26, 2008.
U.S. Appl. No. 2006/240361 to Lee et al., having Publication date of Oct. 26, 2006.
Japanese Patent Publication No. JP2009164205 with Publication date of Jul. 23, 2009.
Korean Patent Publication No. KR20100019798 with Publication date of Feb. 19, 2010.

* cited by examiner

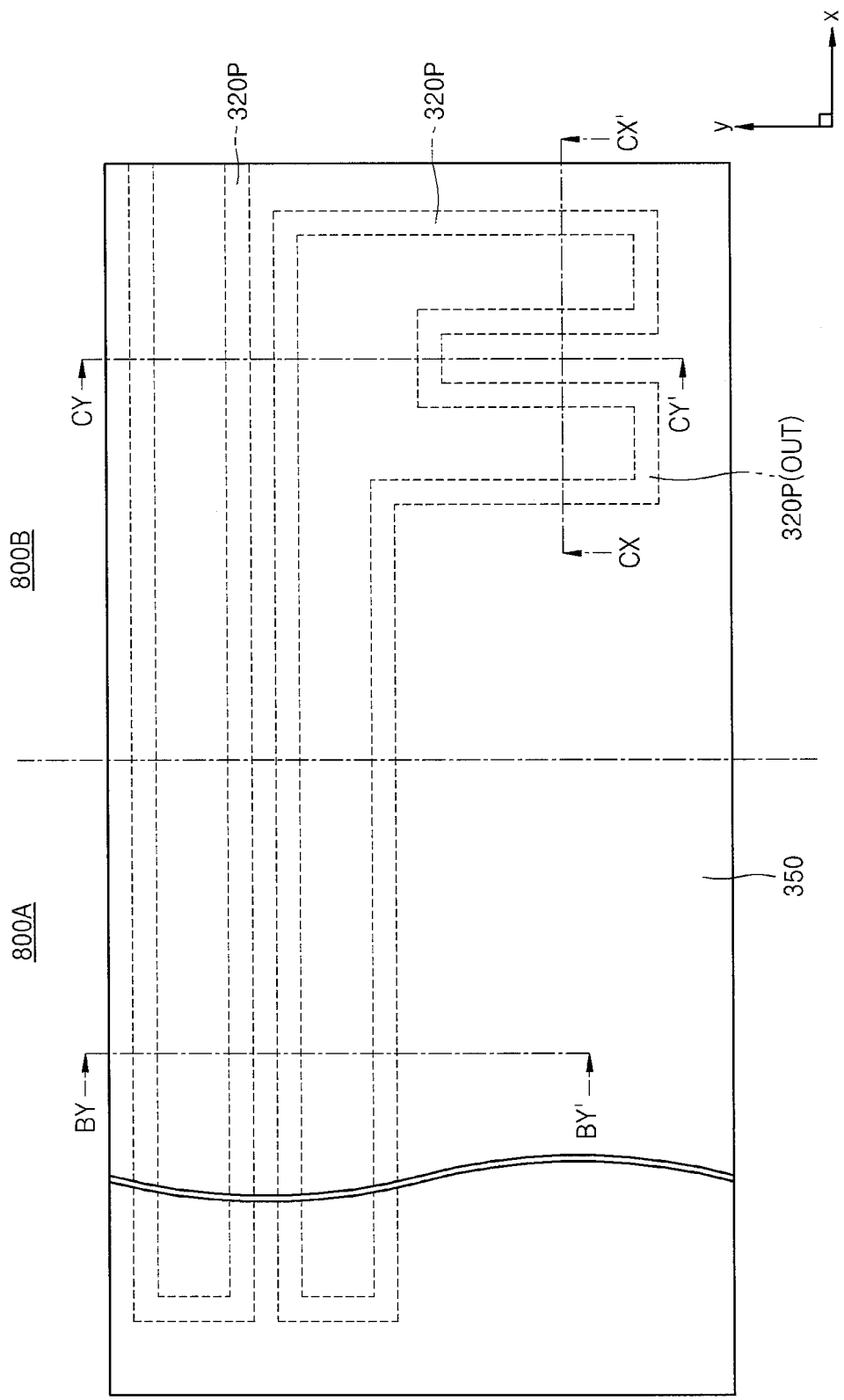

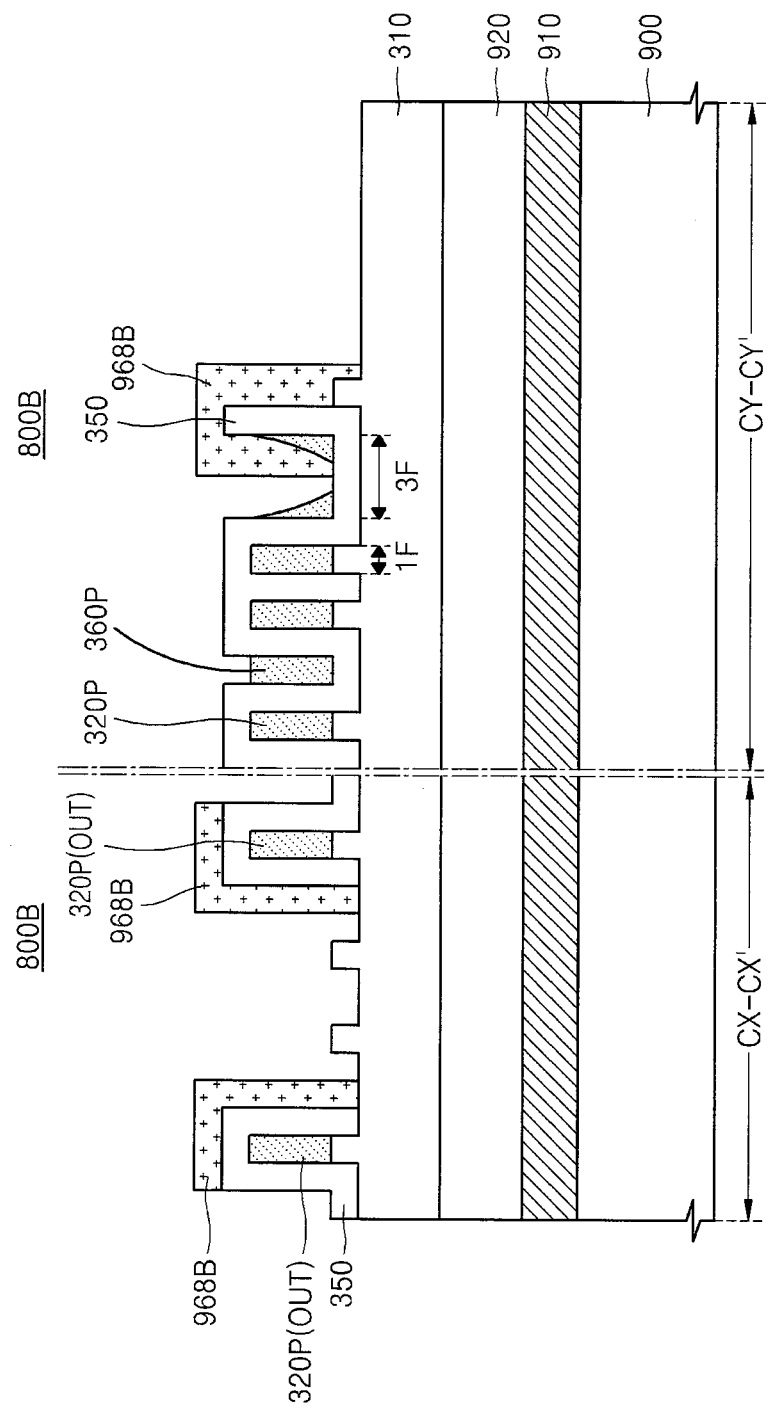

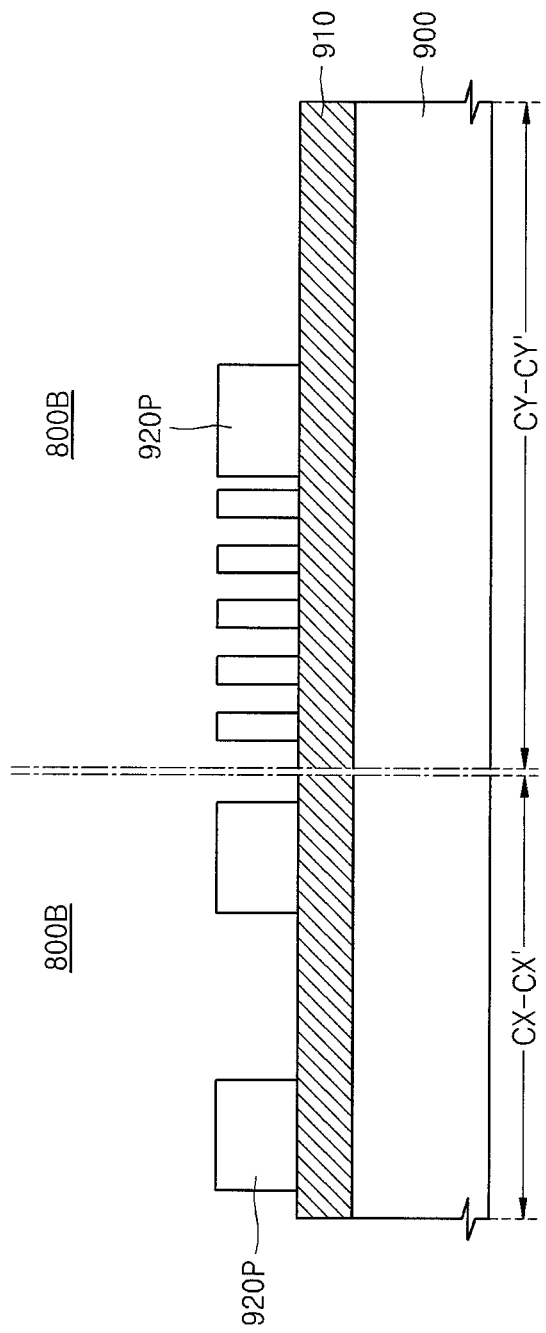

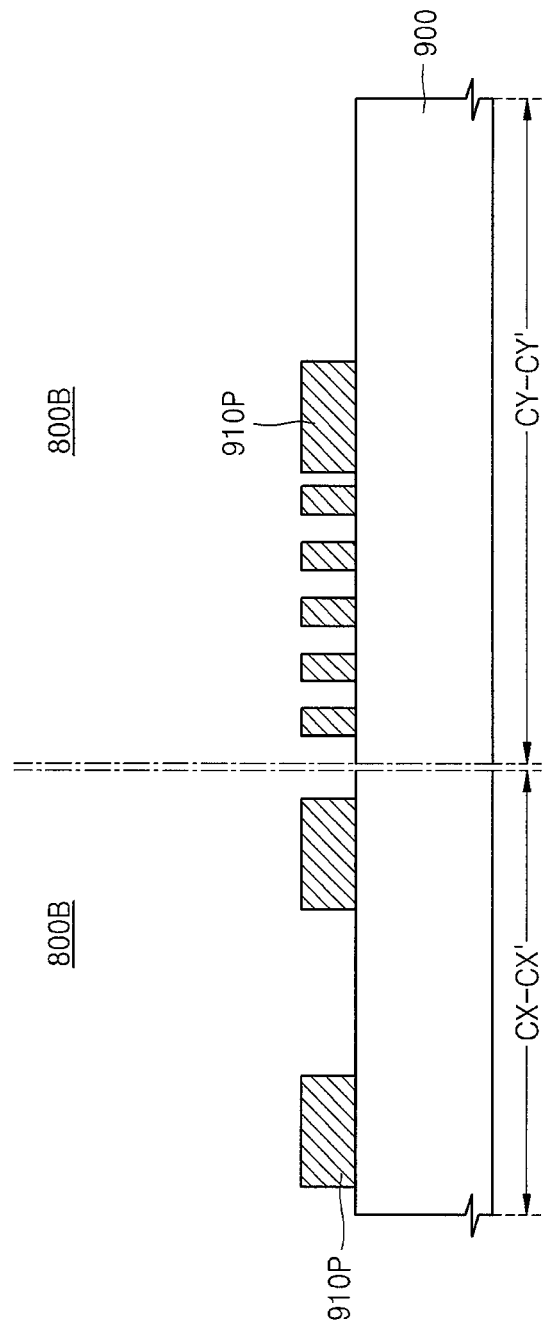

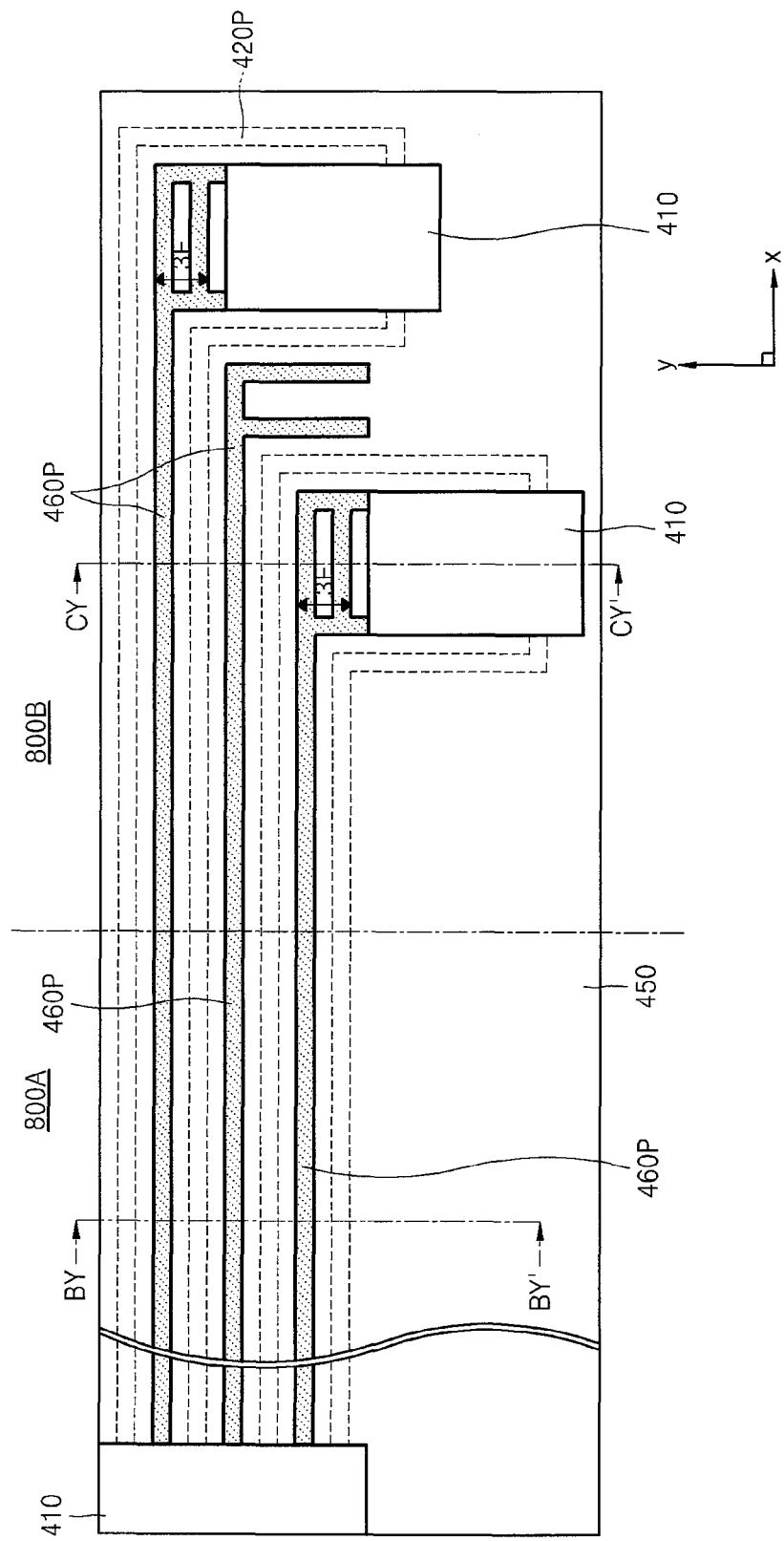

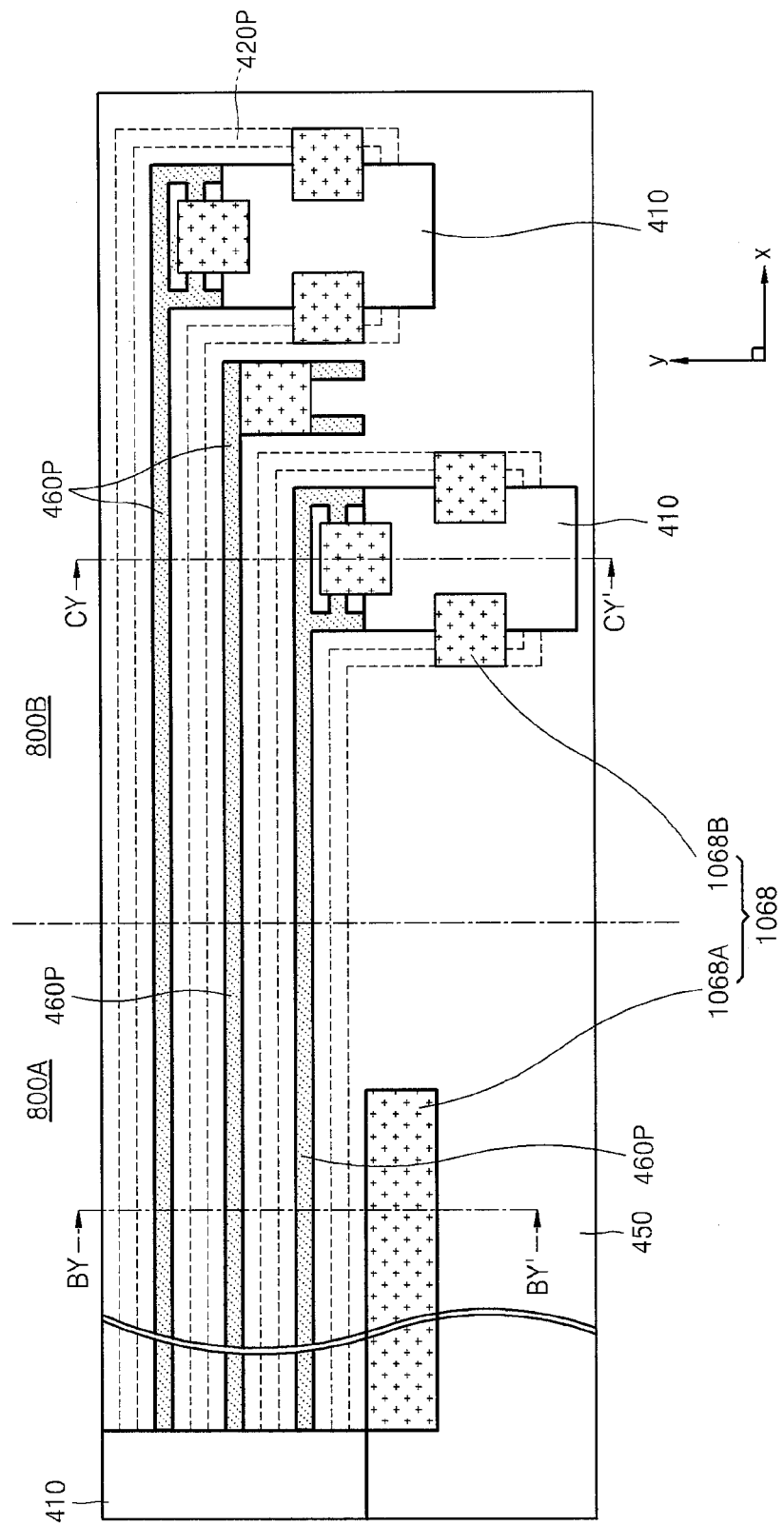

SEMICONDUCTOR DEVICE AND METHOD OF FABRICATING THE SAME

CROSS-REFERENCE TO RELATED APPLICATION(S)

The present application claims priority under 35 U.S.C. §119 to Korean Patent Application No. 10-2010-0061267, filed on Jun. 28, 2010 in the Korean Intellectual Property Office (KIPO), the contents of which are herein incorporated by reference in their entirety.

TECHNICAL FIELD

The present invention relates generally to semiconductor devices, and more particularly, to a semiconductor device including conductive lines with line and branch portions formed with high integration density.

BACKGROUND OF THE INVENTION

Conductive lines are desired to be formed with fine patterning for high integration density. The desired widths of the conductive lines may be smaller than the range of resolution that can be realized using a photolithographic process.

Thus, a technique is desired for fabricating highly integrated circuit structures using existing photolithographic processes but with dimensions smaller than can be realized using conventional photolithographic processes alone. In particular, conductive lines having such small dimensions are desired to be formed for fabricating highly integrated circuit structures.

SUMMARY OF THE INVENTION

Accordingly, conductive lines are formed using mask patterns formed from a buffer structure and a buffer layer for achieving dimensions smaller than can be realized using the photolithographic process alone.

A semiconductor device according to an aspect of the present invention includes first, second, and third conductive lines. The first conductive line includes a first line portion formed over a substrate and extending in a first direction, and includes a first branch portion extending from an end of the first line portion in a direction different from the first direction. The second conductive line includes a second line portion formed over the substrate and extending in the first direction, and includes a second branch portion extending from an end of the second line portion in a direction different from the first direction. The third conductive line includes a third line portion formed over the substrate and extending in the first direction, and includes a third branch portion extending from an end of the third line portion in a direction different from the first direction. The third branch portion is disposed between and shorter than the first and second branch portions.

In an example embodiment of the present invention, the third branch portion is shorter than the first and second branch portions by at least a pad size of the semiconductor device.

In another example embodiment of the present invention, the first, second, and third line portions extend parallel with each-other in a memory cell region of the substrate.

In a further example embodiment of the present invention, each of the first, second, and third line portions has a first width, and the first, second, and third line portions are spaced from each-other by the first width.

In another example embodiment of the present invention, the third line portion is longer than the first line portion and shorter than the second line portion.

In a further example embodiment of the present invention, the first, second, and third branch portions extend parallel with each-other in a connection region of the substrate.

In another example embodiment of the present invention, a distance between the first and second branch portions is at least nine times a width of each of the first, second, and third line portions.

In a further example embodiment of the present invention, the first, second, and third branch portions extend in a direction that is perpendicular to the first direction.

In another example embodiment of the present invention, the third conductive line further includes a connection portion extending from the third branch portion in parallel with the third line portion.

In a further example embodiment of the present invention, the semiconductor device further includes first, second, and third contact pads. The first contact pad is coupled to the first branch portion, the second contact pad is coupled to the second branch portion, and the third contact pad is coupled to the third branch portion. The first, second, and third contact pads are formed separately from each-other.

In an example embodiment of the present invention, the first contact pad is formed to be integral with the first branch portion, the second contact pad is formed to be integral with the second branch portion, and the third contact pad is formed to be integral with the third branch portion.

In a further example embodiment of the present invention, the first, second, and third conductive lines are configured as word lines or bit lines of a memory cell block formed as part of the semiconductor device.

In another example embodiment of the present invention, the semiconductor device further includes a fourth conductive line including a fourth line portion formed over the substrate and extending in the first direction adjacent the second line portion. The fourth conductive line also includes a fourth branch portion extending from an end of the fourth line portion in a direction different from the first direction. The fourth branch portion is shorter than the second branch portion, and the fourth line portion is longer than the second line portion.

A semiconductor device according to another aspect of the present invention includes a substrate including a memory cell region and a connection region and includes a plurality of conductive line groups. Each conductive line group includes respective first, second, and third conductive lines. Such first, second, and third conductive lines are formed similarly as recited above in example embodiments of the present invention.

A method of fabricating a semiconductor device according to a further aspect of the present invention includes forming a first mask layer over a memory cell region and a connection region of a substrate. A buffer structure is formed over the first mask layer, and the buffer structure includes a line portion extending in a first direction in the memory cell region and at least one branch portion extending from the line portion in a second direction different from the first direction in the connection region. A spacer structure is formed along sidewalls of the buffer structure, and the buffer structure is removed. The first mask layer is patterned using the spacer structure as a mask to form a first mask pattern.

Subsequently, a buffer layer is deposited on the first mask pattern, and a second mask pattern is formed within at least one recess of the buffer layer. A line portion of at least one conductive line is patterned using parts of the first and second mask patterns disposed in the memory cell region. Also, a branch portion of at least one conductive line is patterned using parts of the first and second mask patterns disposed in the connection region.

According to an example embodiment of the present invention, the spacer structure is formed as a loop around the buffer structure.

In another example embodiment of the present invention, the branch portion of the buffer structure extends from the line portion of the buffer structure in the second direction that is perpendicular from the first direction.

In a further example embodiment of the present invention, the buffer structure has an F-shape or a reverse F-shape. The buffer structure includes two branch portions that are separated by four times a width of the conductive line in an example embodiment of the present invention.

In another example embodiment of the present invention, first, second, and third conductive lines are patterned using parts of the first and second mask patterns disposed in the connection region. Such first, second, and third conductive lines are formed similarly as recited above in example embodiments of the present invention.

In a further example embodiment of the present invention, a portion of the first and second mask patterns formed with the branch portion of the buffer structure is trimmed such that the third branch portion is shorter than the first and second branch portions.

In another example embodiment of the present invention, a wide mask pattern is used for patterning the first, second, and third contact pads that are integral with the first, second, and third branch portions, respectively.

In a further example embodiment of the present invention, another buffer structure that is F-shaped is used for forming the fourth conductive line. In that case, each of the buffer structures includes respective two branch portions that are separated by four times a width of the conductive lines. In addition, the buffer structures include respective line portions that are separated by five times a width of the conductive lines.

In this manner, the conductive lines are formed with dimensions smaller than can be realized using the photolithographic process alone. In addition, the conductive lines include the branch portions arranged with sufficient space for formation of integral contact pads.

These and other features and advantages of the present invention will be better understood by considering the following detailed description of the invention which is presented with the attached drawings.

BRIEF DESCRIPTION OF THE DRAWINGS

FIGS. 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, and 21C are plan views and cross-sectional views illustrating steps for fabricating a portion of the conductive structures of FIG. 8, according to example embodiments of the present invention;

FIGS. 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, 35C, 36A, 36B, 36C, 37A, 37B, and 37C are plan views and cross-sectional views illustrating steps for fabricating a portion of the conductive structures of FIG. 25, according to embodiments of the present invention;

The figures referred to herein are drawn for clarity of illustration and are not necessarily drawn to scale. Elements having the same reference number in FIGS. 1, 2, 3, 4A, 4B, 4C, 4D, 4E, 4F, 4G, 4H, 4I, 4J, 4K, 4L, 4M, 5A, 5B, 5C, 5D, 5E, 5F, 5G, 5H, 5I, 5J, 5K, 5L, 6A, 6B, 6C, 6D, 7A, 7B, 7C, 7D, 7E, 8, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 23A, 23B, 24A, 24B, 25, 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, 35C, 36A, 36B, 36C, 37A, 37B, 37C, 38, and 39 refer to elements having similar structure and/or function, unless stated otherwise.

DETAILED DESCRIPTION

Example embodiments of the present invention are now described more fully with reference to the accompanying drawings. The present invention may, however, be embodied in many different forms and should not be construed as being limited to the embodiments set forth herein.

Figure 1:
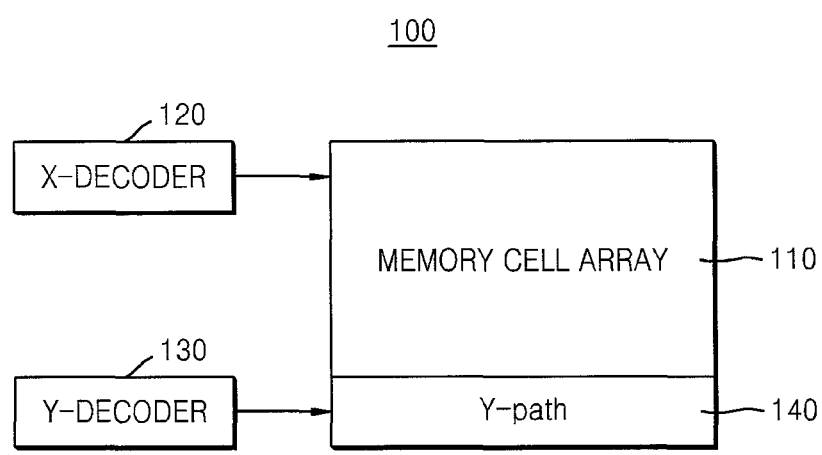
FIG. 1 is a block diagram of a memory device having conductive lines formed according to example embodiments of the present invention.
Figure 2:
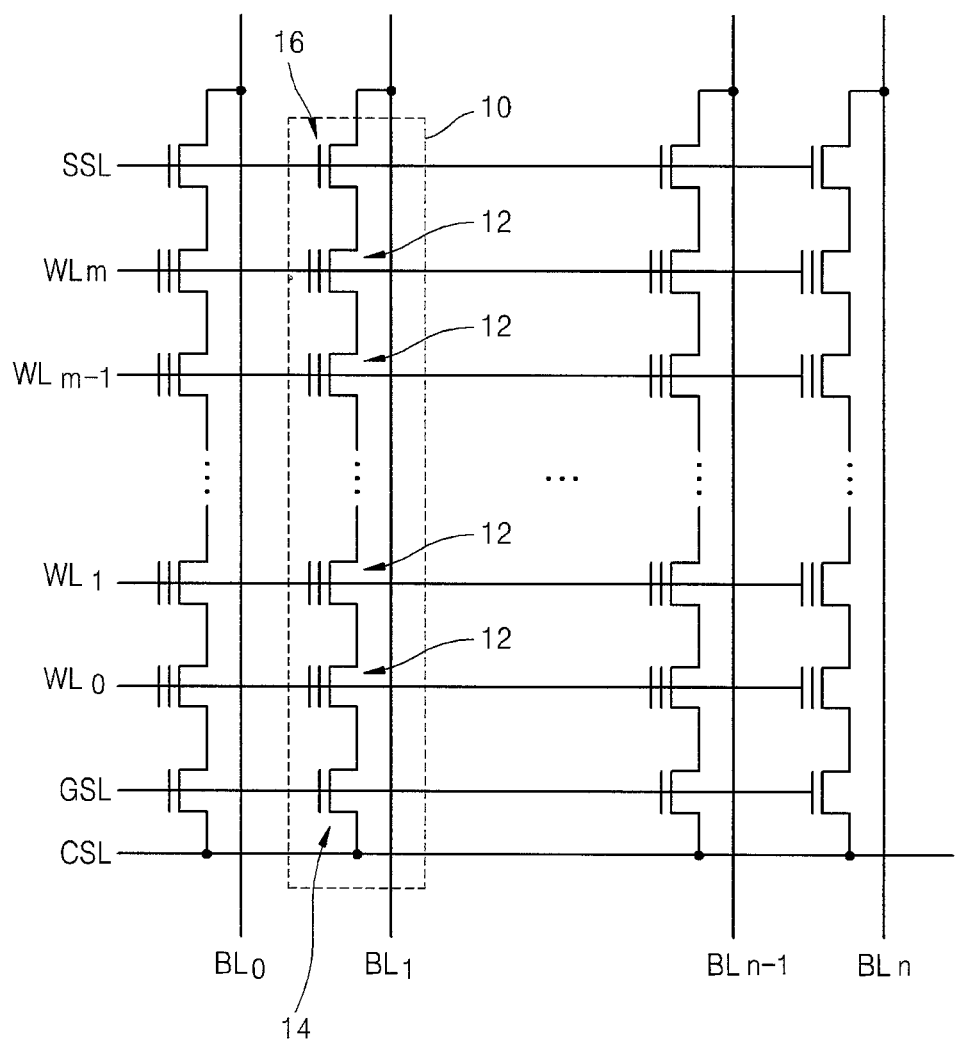
FIG. 2 is a circuit diagram of a memory cell array included in the memory device of FIG. 1, according to an example embodiment of the present invention.

FIG. 1 is a block diagram of a memory device 100 according to an example embodiment of the present invention. FIG. 2 is a circuit diagram of a memory cell array 110 included in the memory device 100 of FIG. 1, according to an example embodiment of the present invention.

Referring to FIGS. 1 and 2, the memory device 100 is a NAND flash memory device for example, and includes the memory cell array 110 comprised of memory cells that are densely integrated. The memory device 100 also includes peripheral circuits for accessing and driving the memory cell array 110 such as an X-decoder 120, a Y-decoder 130, and a Y-path circuit 140.

The X-decoder 120 selects a word line WL of the memory cell array 110 to be accessed, e.g., one of word lines $WL_0$, $WL_1, \ldots, WL_{m-1}$, and $WL_m$. The Y-decoder 130 selects a bit line BL of the memory cell array 110 to be activated, e.g., one of bit lines $BL_0, BL_1, \ldots, BL_{n-1}$, and $BL_n$. The Y-path circuit 140 attached to the memory cell array 110 determines a bit line path according to an output of the Y-decoder 130.

Referring to FIG. 2, the memory cell array 110 includes a plurality of cell strings, and each cell string 10 includes a plurality of memory cells 12 connected in series. Gate electrodes of the memory cells 12 in each string 10 are connected to word lines $WL_0, WL_1, \ldots, WL_{m-1}$, and $WL_m$, respectively. Each cell string also includes a respective ground selection transistor 14 connected to a ground selection line GSL and includes a respective string selection transistor 16 connected to a string selection line SSL.

Such transistors 14 and 16 are coupled at respective ends of the cell string 10 as illustrated in FIG. 2 for providing electrical connection among the memory cells 12 of the cell string 10 to the bit lines $BL_0, BL_1, \ldots, BL_{n-1}$, and $BL_n$, and a common source line CSL. With such a plurality of cell strings 10, the memory cells 12 connected to the word lines $WL_0$, $WL_1, \ldots, WL_{m-1}$, and $WL_m$, respectively, together form page or byte units.

For accessing one of the memory cells 12 in the memory device 100 for a read or write operation, a corresponding one of the word lines $WL_0, WL_1, \ldots, WL_{m-1}$, and $WL_m$ and a corresponding one of the bit lines $BL_0, BL_1, \ldots, BL_{n-1}$, and $BL_n$ for the memory cell 12 is activated by the X-decoder 120 and the Y-decoder 130.

NAND flash memory devices have a plurality of memory cells connected in series for high integration density. With recent design rules for a NAND flash memory device, the memory device is desired to be fabricated with smaller dimensions for reduced chip size resulting in decreased pitch of patterned structures in the integrated circuit of the NAND flash memory device.

Accordingly, embodiments of the present invention are directed to patterning integrated circuit structures with such fine pitch using exposure equipment and available photolithography processes. Such integrated circuit structures are formed with sufficient process margin.

Figure 3:
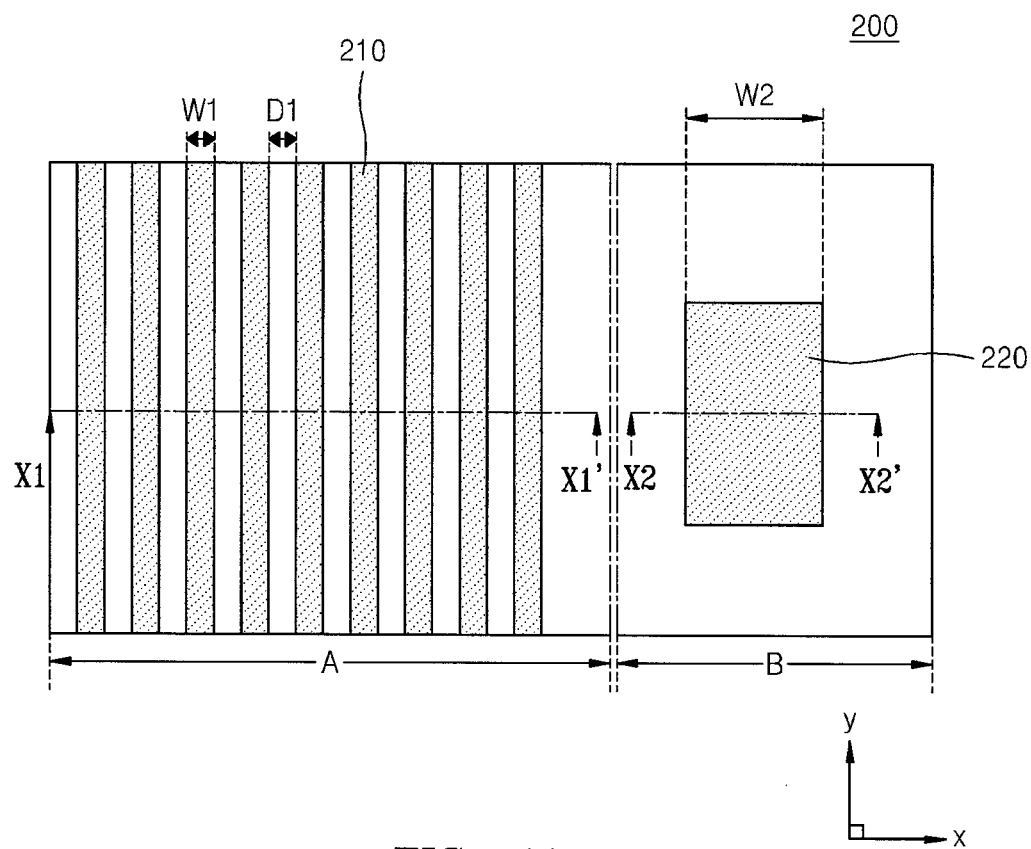
FIG. 3 shows a layout of an integrated circuit pattern formed according to an example embodiment of the present invention.

FIG. 3 shows a layout of semiconductor device 200 patterned with a fine pitch, according to an example embodiment of the present invention. In FIG. 3, the semiconductor device 200 includes a high-density region A and a low-density region B. The high-density region A may be a cell array region such as for forming the cell array 110 of FIG. 1 for example. The low-density region B may be a peripheral circuit region or a core region for forming peripheral circuits that drive the cell array formed in the high-density region A. Alternatively, the low-density region B may also be a part of the cell array region having devices with larger dimensions.

Further referring to FIG. 3, the high-density region A includes a plurality of line patterns 210 having a relatively small first width W1 and extending in parallel with one another. The line patterns 210 are separated from one another by a relatively small first distance D1.

The low-density region B includes a wide pattern 220 having a relatively large second width of W2. For example, the plurality of line patterns 210 and the wide pattern 220 are for forming active regions in the cell array region and the peripheral circuit region. Alternatively, the line patterns 210 form fine conductive lines in the cell array region, and the wide pattern 220 forms a conductive structure with a relatively wide width in the peripheral circuit region or the cell array region. The wide pattern 220 may alternatively form an alignment key.

FIGS. 4A, 4B, 4C, 4D, 4E, 4F, 4G, 4H, 4I, 4J, 4K, 4L, and 4M are cross-sectional views illustrating steps for patterning a portion of the integrated circuit of FIG. 3 using a buffer layer, according to an example embodiment of the present invention. For example, FIGS. 4A, 4B, 4C, 4D, 4E, 4F, 4G, 4H, 4I, 4J, 4K, 4L, and 4M are cross-sectional views illustrating method steps during fabrication of the semiconductor device 200 of FIG. 3 along a line X1-X1' in the high-density region A and along a line X2-X2' in the low-density region B.

Figure 4A:
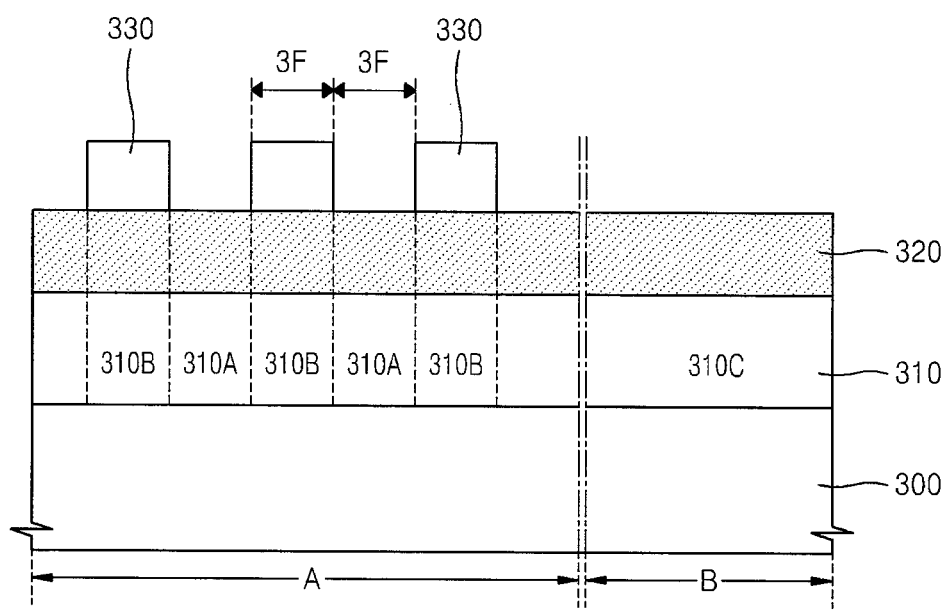
FIGS. 4A, 4B, 4C, 4D, 4E, 4F, 4G, 4H, 4I, 4J, 4K, 4L, and 4M are cross-sectional views illustrating steps for patterning a portion of the integrated circuit of FIG. 3 using a buffer layer, according to an example embodiment of the present invention.

Referring to FIG. 4A, a feature layer 310 and a first mask layer 320 are sequentially formed in the high-density and low-density regions A and B of a substrate 300. In addition, a plurality of first buffer structures 330 is formed on the first mask layer 320. The substrate 300 is a semiconductor substrate, such as a silicon substrate, in an example embodiment of the present invention.

The feature layer 310 is comprised of various materials such as for forming an active region or another region of the substrate 300. Alternatively, the feature layer 310 is comprised of a metal, a semiconductor, or an insulating material. The feature layer 310 may be a mask layer for defining a pattern on the substrate 300 or another layer of material (not shown) below the feature layer. For example in that case, the feature layer 310 is comprised of at least one of a silicon oxide layer and a silicon nitride layer.

Further referring to FIG. 4A, the feature layer 310 in the high-density region includes first regions 310A and second regions 310B, each having a respective width that is at least three times a target width of a resulting integrated circuit pattern. In the low-density region B, the feature layer 310 includes a third region 310C disposed apart from the first and second regions 310A and 310B.

The target width may be a minimum feature size 1F of the semiconductor device to be fabricated. The first and second regions 310A and 310B each have a width that is at least three times 1F such as 3F, in an example embodiment of the present invention.

The first mask layer 320 is comprised of a material having a different etch selectivity from that of the feature layer 310. For example, the first mask layer 320 is comprised of polysilicon, in an example embodiment of the present invention.

The first buffer structures 330 are formed on the first mask layer 320 in the high-density region A but are not formed in the low-density region B. The first buffer structures 330 are formed on the first mask layer 320 over the second regions 310B of the feature layer 310 with a width of 3F. The first buffer structures 330 are separated from each other by the first regions 310A having a width of 3F. The first mask layer 320 is exposed at such first regions 310A between the first buffer structures 330.

The first buffer structures 330 are comprised of a material having a different etch selectivity from that of the first mask layer 320. For example, the first buffer structures 330 are comprised of either amorphous carbon or a hydrocarbon compound having a relatively high carbon content of from about 85 to about 99% by weight of the total weight of the hydrocarbon compound or a derivative thereof. Such a hydrocarbon compound is also referred to as a spin-on hardmask (SOH).

For forming such a spin-on hardmask (SOH) for the first buffer structures 330 according to an example embodiment of the present invention, an organic compound layer is formed on the first mask layer 320. Such an organic compound layer is formed with a thickness of from about 1000 Å to about 5000 Å such as by spin coating or other deposition process for example.

The organic compound layer is comprised of a hydrocarbon compound containing an aromatic ring, e.g., phenyl, benzene, or naphthalene, or a derivative thereof. The organic compound layer is comprised of a material having a relatively high carbon content of from about 85% to about 99% by weight based on the total weight thereof.

After deposition, the organic compound layer is baked at a temperature of from about 150° C. to about 350° C. for about 60 seconds to form a carbon-containing layer. Such a carbon-containing layer is secondarily baked at a temperature of from about 300° C. to 550° C. for about 30 to 300 seconds to be hardened. With such hardening, structures formed from the carbon-containing layer do not deform during subsequent fabrication steps that may be performed at a relatively high temperature of about 400° C. or more, or when another layer of material is formed on the carbon-containing layer. The hardened carbon-containing layer is patterned using a photolithographic process to form the first buffer structures 330.

Figure 4B:
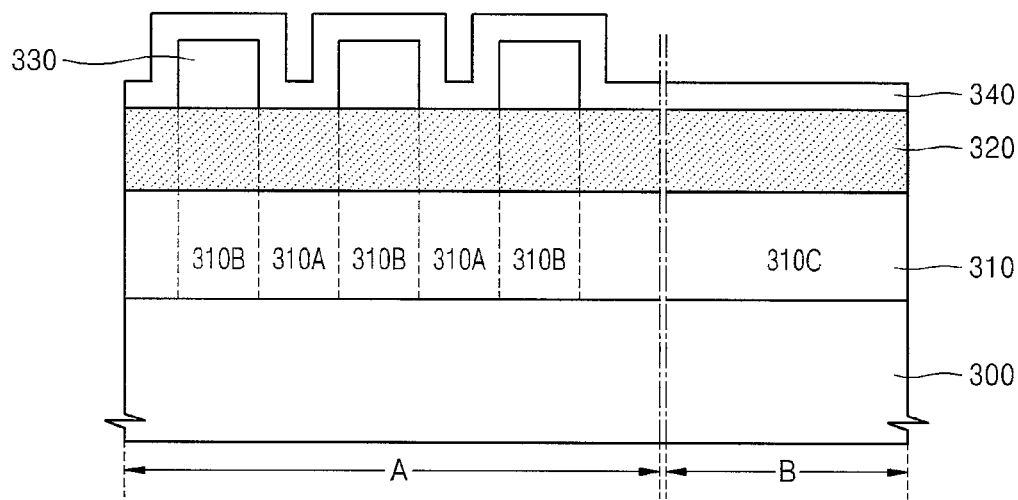

Referring to FIG. 4B, a spacer layer 340 is deposited to cover exposed surfaces of the first buffer structures 330 and the first mask layer 320 in the regions A and B. The thickness of the spacer layer 340 is equal to the target width of 1F in an example embodiment of the present invention.

The spacer layer 340 is comprised of a material such as an oxide having a different etch selectivity from those of the first buffer structures 330 and the first mask layer 320. An atomic layer deposition (ALD) process may be performed to evenly deposit the spacer layer 340. In particular, the spacer layer 340 may be formed by performing an ALD process at room temperature to about 75° C., in an example embodiment of the present invention.

Figure 4C:
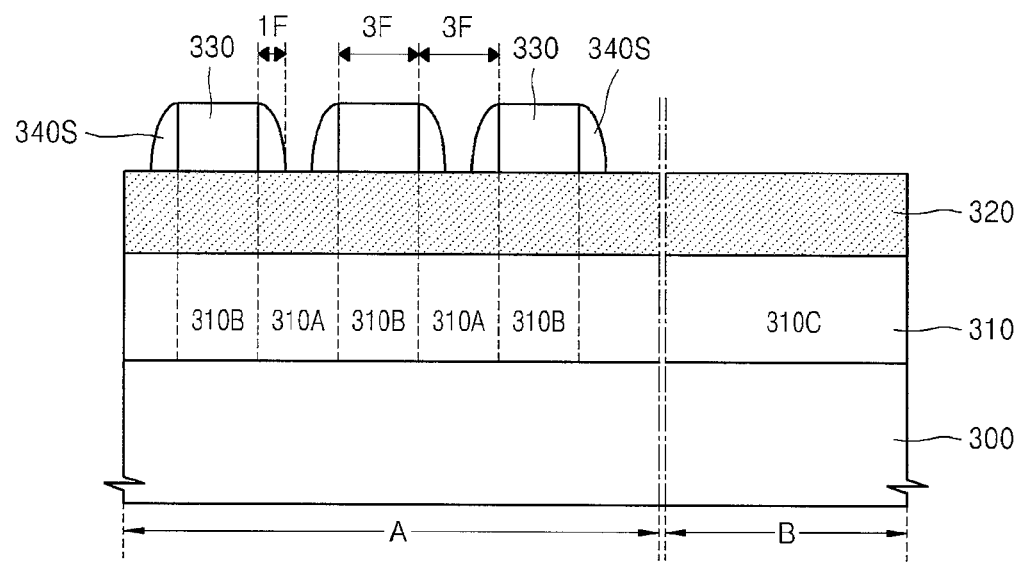

Referring to FIG. 4C, a plurality of spacers 340S are formed at sidewalls of the first buffer structures 330 in the high-density region A by etching back the spacer layer 340 until a top surface of the first mask layer 320 is exposed. Each of the spacers 340S covers a portion of the top surface of the first mask layer 320, and each spacer has the target width of 1F.

A CxFy gas or a CHxFy gas may be used to etch the spacer layer 340, where x and y are integers each being in a range of from 1 to 10. Alternatively, a mixture of at least one of $O_2$ gas and Ar gas is used as the etch gas. The CxFy gas may be one of $C_3F_6$, $C_4F_6$, $C_4F_8$, or $C_5F_8$ for example, and the CHxFy gas may be one of $CHF_3$ or $CH_2F_2$ for example. $O_2$ may be added to the etch gas to remove polymer by-products generated during the etch process and to decompose the CxFy gas. Ar may be added to the etch gas as a carrier gas and to cause ion bombardment.

The spacer layer 340 may be etched in a plasma atmosphere by generating plasma of an etch gas described above within an etch chamber (not shown). Alternatively, the spacer layer 340 may be etched using an etch gas in an atmosphere without plasma generation. For example, a mixture of $C_4F_6$, $CHF_3$, $O_2$, and Ar may be used as an etch gas for etching the spacer mask layer 340. In this case, a plasma-based dry etching process is performed under pressure of about 30 mTorr for several seconds or several tens of seconds while supplying $C_4F_6$, $CHF_3$, $O_2$, and Ar with a volume ratio of $C_4F_6$:$CHF_3$:$O_2$:Ar being about 1:6:2:14, in an example embodiment of the present invention.

Figure 4D:
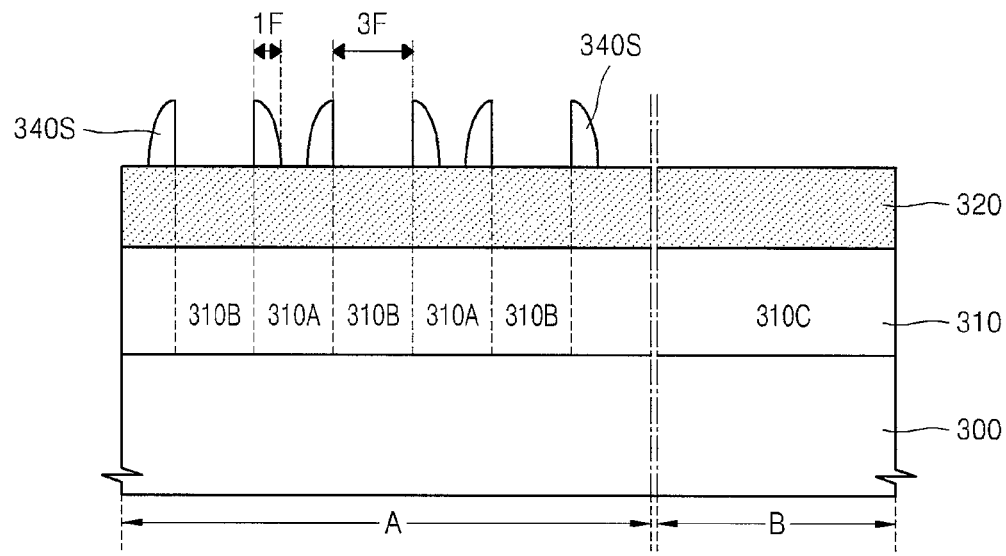

Referring to FIG. 4D, the first buffer structures 330 are removed with an etch selectivity such that the spacers 340S and the first mask layer 320 are not removed. For example when the first buffer structures 330 are comprised of a SOH (spin-on hardmask) material, ashing and strip processes may be performed for removing the first buffer structures 330. Alternatively, the first buffer structures 330 may be removed by performing a dry or wet etching process.

Figure 4E:
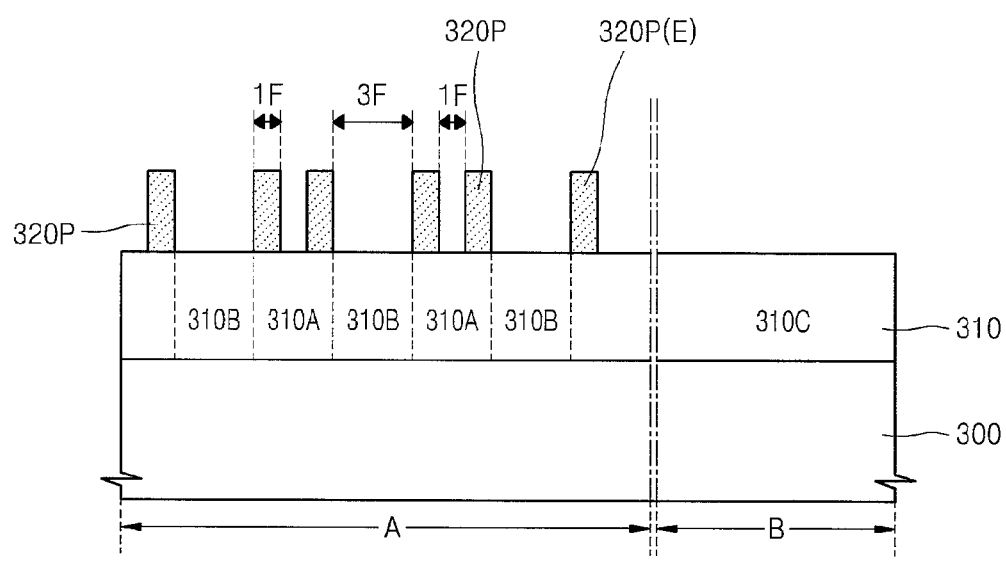

Referring to FIG. 4E, a plurality of first mask patterns 320P are formed in the high-density region A by patterning the first mask layer 320 using the spacers 340S as an etch mask. In FIG. 4E, the first mask patterns 320P in the high-density region A include an outermost first mask pattern 320P(E).

The width of each of the first mask patterns 320P is equal to the target width 1F, according to an example embodiment of the present invention. Portions of the feature layer 310 not under the first mask patterns 320P are exposed in the regions 310A and 310B. In FIG. 4E, the spaces between the first mask patterns 320P alternately have a width of 1F and 3F. Also in FIG. 4E, an upper surface of the feature layer 310 is entirely exposed in the low-density region B.

Figure 4F:
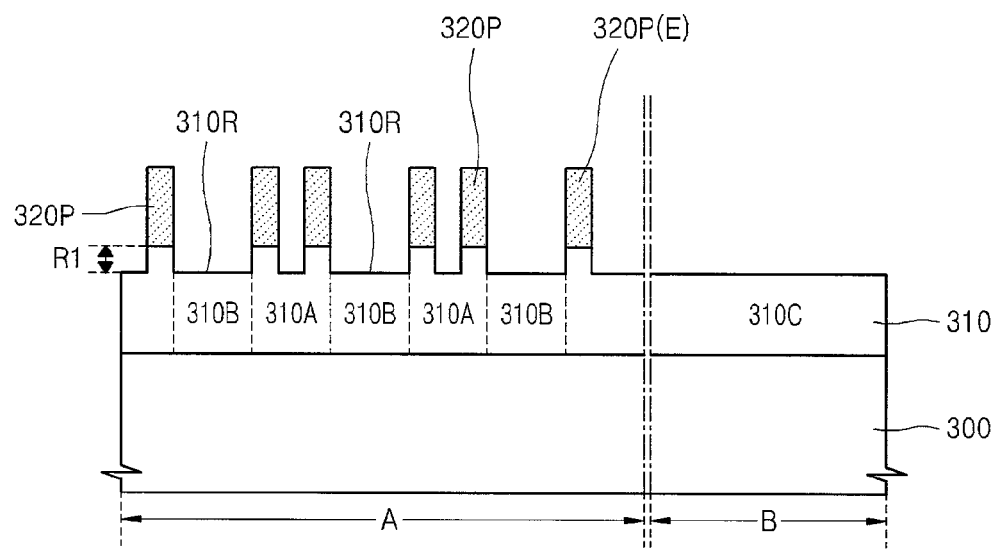

Referring to FIG. 4F, portions of the feature layer 310 that are exposed in the high-density and low-density regions A and B are removed by a first depth R1 from the upper surface of the feature layer 310 to form low surfaces 310R of the feature layer 310. Dry etching may be performed to form such low surfaces 310R on the feature layer 310.

For example, the low surfaces 310R may be formed by continuously over-etching the exposed portions of the feature layer 310 after the first mask patterns 320P are formed during the dry etching of the first mask layer 320 described above with reference to FIG. 4E. Alternatively, an additional dry etch process may be performed after forming the first mask patterns 320P to form the low surfaces 310R.

The first depth R1 is equal to the target width of 1F in an example embodiment of the present invention. However, the present invention may also be practiced with the low surfaces 310R not being formed such that the step of FIG. 4F would not be performed in that case.

Figure 4G:
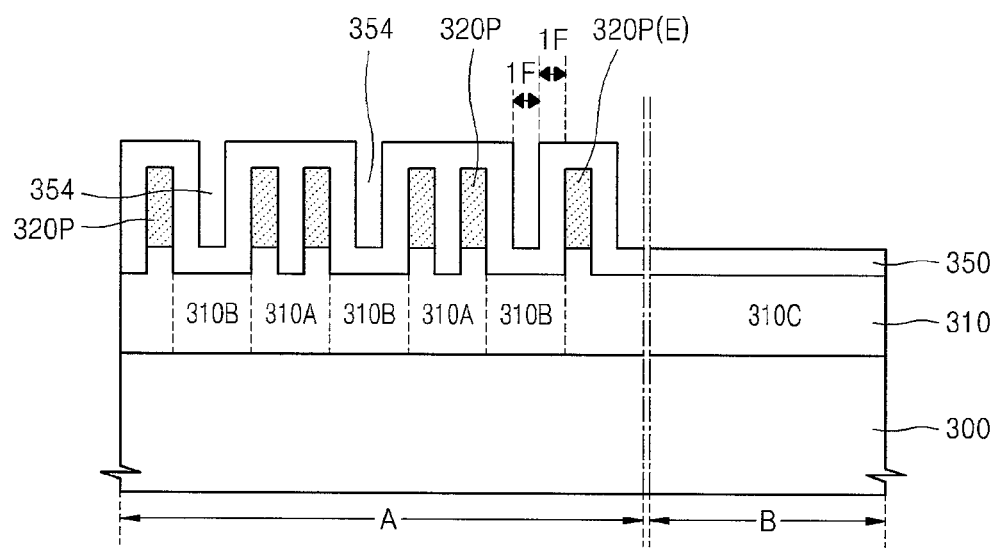

Referring to FIG. 4G, a second buffer layer 350 is deposited onto exposed surfaces of the first mask patterns 320P and the low surfaces 310R of the feature layer 310 in the high-density and low-density regions A and B. For example to uniformly deposit the second buffer layer 350, an atomic layer deposition (ALD) process is performed in a range of from about room temperature to about 500° C. Such a deposition temperature for forming the second buffer layer 350 may be equal to or greater than for forming the spacer layer 340 in FIG. 4B.

The second buffer layer 350 is comprised of a same material as that of the feature layer 310, in an example embodiment of the present invention. For example, the second buffer layer 350 is comprised of silicon oxide.

In FIG. 4E, the spaces between the first mask patterns 320P in the high-density region A alternately have widths of 1F and 3F. Thus in FIG. 4G, if the thickness of the second buffer layer 350 is about the target width of 1F, the spaces having the width of 1F between the first mask patterns 320P on the first regions 310A are completely filled with the second buffer layer 350.

Additionally in that case in FIG. 4G, the spaces having the width of 3F between the first mask patterns 320P on the second regions 310B are partially filled with the second buffer layer 350. Thus, recessed spaces 354, each having a width of 1F, are formed in the second buffer layer 350 between the first mask patterns 320P on the second regions 310B.

Figure 4H:
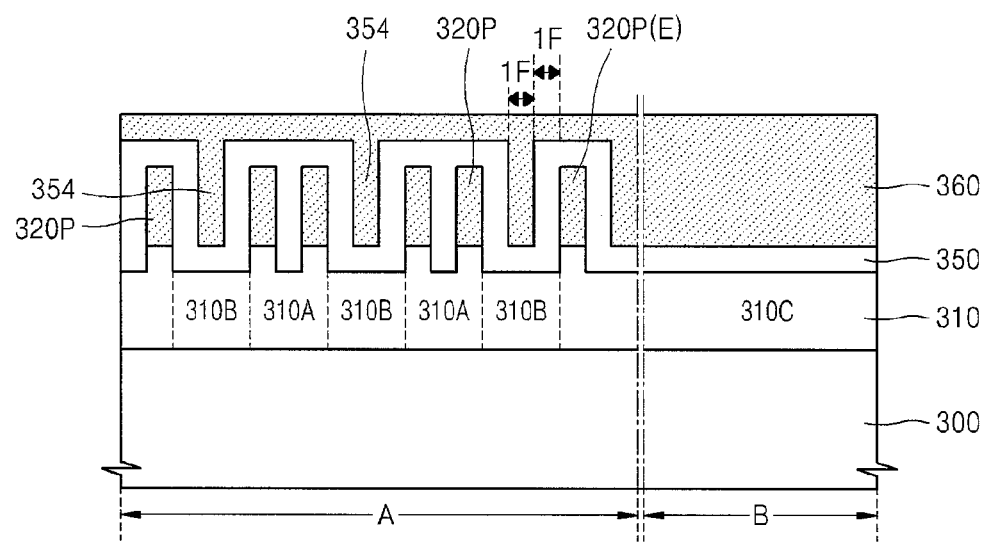

Referring to FIG. 4H, a second mask layer 360 is deposited onto the second buffer layer 350 in the high-density and low-density regions A and B. The second mask layer 360 completely fills the recessed spaces 354 in the second buffer layer 350 between the first mask patterns 320P on the second regions 310B. The second mask layer 360 is comprised of a material having a different etch selectivity from that of the second buffer layer 350. For example, the second mask layer 360 is comprised of polysilicon.

Figure 4I:
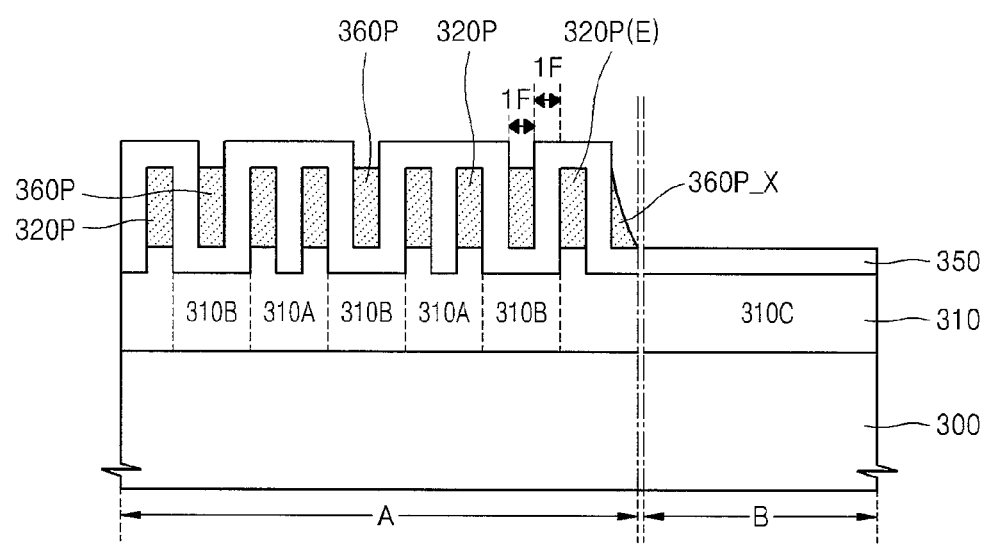

Referring to FIG. 4I, a plurality of second mask patterns 360P are formed by etching back an upper portion of the second mask layer 360 until an upper surface of the second buffer layer 350 is exposed with the material of the second mask layer 360 remaining in the recessed spaces 354. Such an etching back of the second mask layer 360 may be controlled such that the top surfaces of the second mask patterns 360P are level with those of the first mask patterns 320P.

Figure 4J:
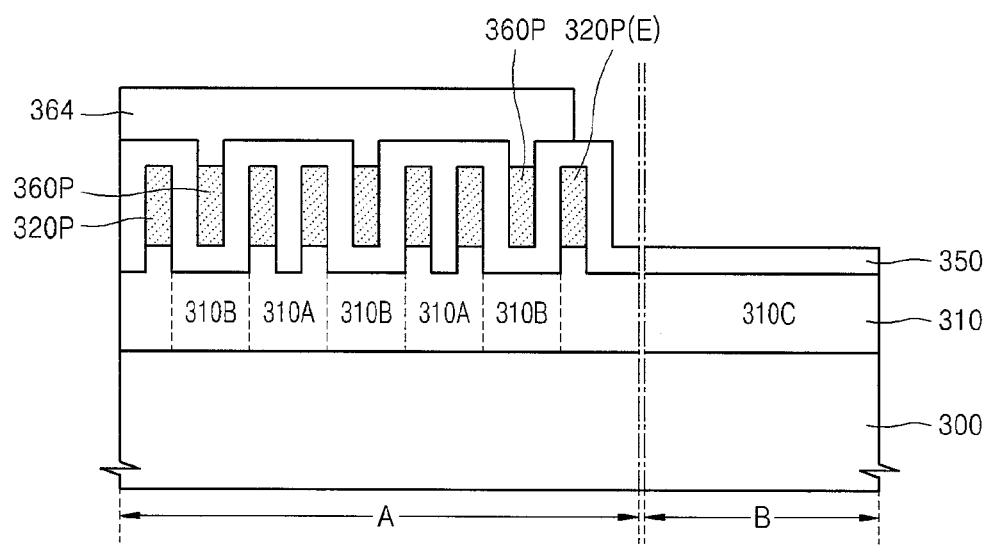

After the second mask patterns 360P are formed, an undesired remnant 360P_X of the second mask layer 360 may be on a sidewall of the second buffer layer 350 covering the outermost first mask pattern 320P(E). Referring to FIG. 4J, a third mask layer 364 is formed to cover the second mask patterns 360P while exposing the remnant 360P_X. Subsequently, the exposed remnant 360P_X is removed using the third mask layer 364 and the second buffer layer 350 as an etch mask.

The third mask layer 364 is comprised of a photoresist pattern. A wet or dry isotropic etching process may be performed to remove the remnant 360P_X. After the remnant 360P_X is removed, the sidewall of the second buffer layer 350 covering the outermost first mask patterns 320P(E) is exposed.

Figure 4K:
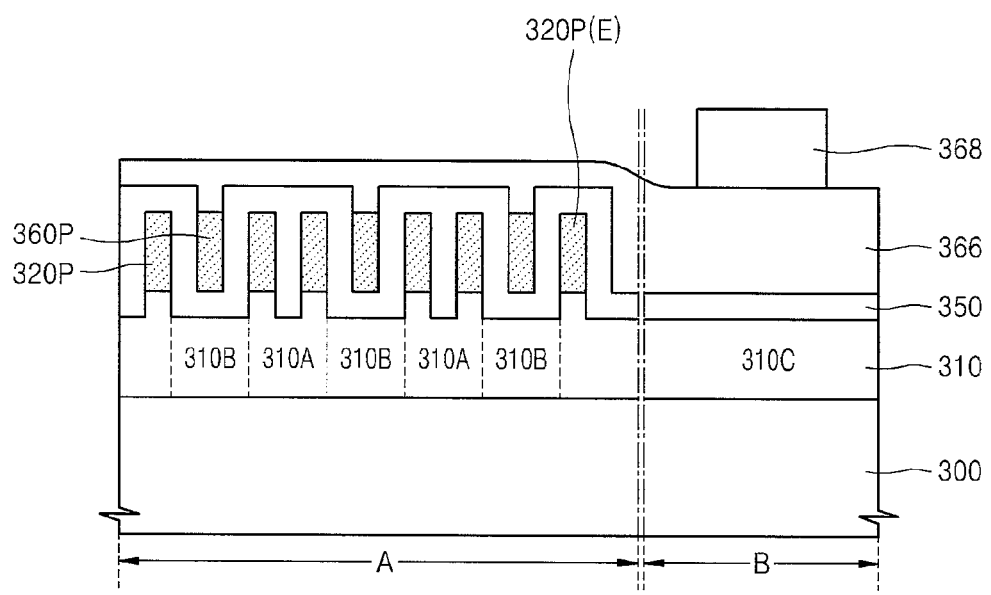

Referring to FIG. 4K, the third mask layer 364 is removed, and a trimming process (not shown) may be performed on the first and second mask patterns 320P and 360P. With such a trimming process, undesired portions of the first and second mask patterns 320P and 360P may be removed.

Also in FIG. 4K, a fourth mask layer 366 covering the second buffer layer 350 is formed in the high-density and low-density regions A and B. In addition, a fifth mask pattern 368 covering a portion of an upper surface of the fourth mask layer 366 on the third region 310C is formed in the low-density region B.

The fourth mask layer 366 is comprised of a material having a different etch selectivity from the second buffer layer 350 and the feature layer 310. For example, the fourth mask layer 366 is comprised of a spin-on hardmask (SOH). The fifth mask pattern 368 is comprised of a material having a different etch selectivity from the fourth mask layer 366. For example, the fifth mask pattern 368 is a photoresist pattern. The width of the fifth mask pattern 368 is greater than the target width of 1F, according to an example embodiment of the present invention.

Figure 4L:
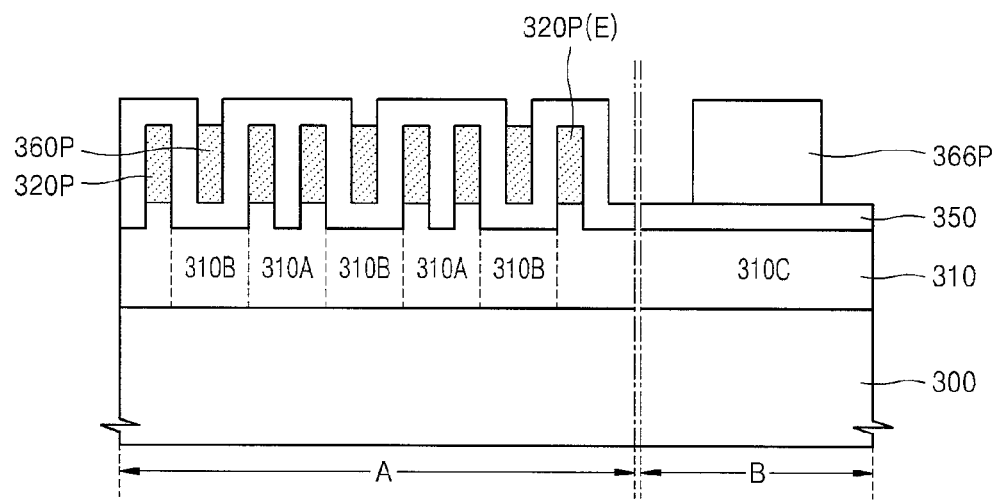

Referring to FIG. 4L, a fourth mask pattern 366P covering the second buffer layer 350 is formed on the third region 310C by anisotropically etching the fourth mask layer 366 using the fifth mask pattern 368 as an etch mask. The width of the fourth mask pattern 366P is greater than the target width of 1F, according to an example embodiment of the present invention.

Figure 4M:
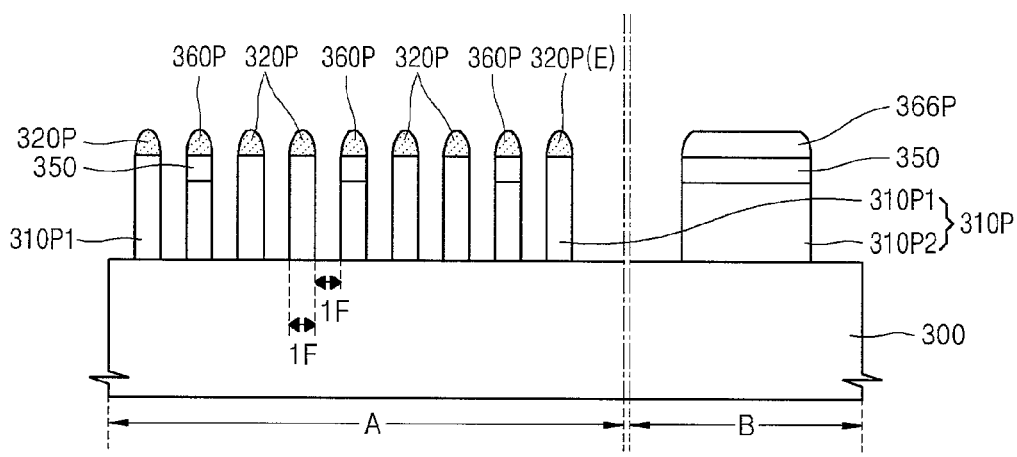

Referring to FIG. 4M, the second buffer layer 350 is patterned using the first mask patterns 320P, the second mask patterns 360P, and the fourth mask pattern 366P as an etch mask. In addition, a plurality of feature patterns 310P are formed by etching away portions of the feature layer 310 exposed after patterning the second buffer layer 350.

The feature patterns 310P include a plurality of first feature patterns 310P1 having the target width of 1F and being spaced apart by the target width of 1F in the high-density region A. The feature patterns 310P also include a second feature pattern 310P2 being wider than the target width of 1F in the low-density region B. Such feature patterns 310P may form the line patterns 210 and the wide pattern 220 of the semiconductor device 200 in FIG. 3. In FIG. 4M, remaining portions of the second buffer layer 350, the first mask patterns 320P, the second mask patterns 360P, and the fourth mask pattern 366P may further be removed.

Although not shown, the width of the first feature patterns 310P1 may vary in the high-density region A in some cases. For example, the cross-sectional structure of the resultant structures illustrated in FIG. 4M may vary according to processing conditions. In particular in FIG. 4L, the upper portions of the second buffer layer 350 in the high-density region A adjacent the second mask patterns 360P may have a rounded profile unlike as illustrated in FIG. 4L. In addition, the heights of the second buffer layer 350 between the first and second mask patterns 320P and 360P may vary according to location.

Also, the top surfaces of the second mask patterns 360P may not be level with those of the first mask patterns 320P depending on processing conditions. Accordingly, when the second buffer layer 350 is etched in FIG. 4L using the first and second mask patterns 320P and 360P as an etch mask, and when the feature layer 310 is subsequently patterned in FIG. 4M, the cross-sectional profile of the first feature patterns 310P1 may vary from FIG. 4M.

For example, the cross-sectional profiles of two adjacent first feature patterns 310P1 may be line-symmetrical with each other. In addition, a sidewall of the first feature patterns 310P1 may be substantially vertical or may be inclined. Furthermore, two adjacent first feature patterns 310P1 may have different widths from each other, and the distances between the first feature patterns 310P1 may not be the same.

FIGS. 5A, 5B, 5C, 5D, 5E, 5F, 5G, 5H, 5I, 5J, 5K, and 5L are cross-sectional views illustrating steps for patterning a portion of the integrated circuit of FIG. 3 with fine dimensions using a buffer layer, according to an alternative embodiment of the present invention. For example, FIGS. 5A, 5B, 5C, 5D, 5E, 5F, 5G, 5H, 5I, 5J, 5K, and 5L are cross-sectional views illustrating steps for forming the semiconductor device 200 of FIG. 3 along the line X1-X1' in the high-density region A and along the line X2-X2' in the low-density region B.

In FIGS. 5A, 5B, 5C, 5D, 5E, 5F, 5G, 5H, 5I, 5J, 5K, and 5L, reference numerals that are same as those of FIGS. 4A, 4B, 4C, 4D, 4E, 4F, 4G, 4H, 4I, 4J, 4K, 4L, and 4M denote same elements, and thus, a description of their operations or characteristics is not repeated.

Figure 5A:
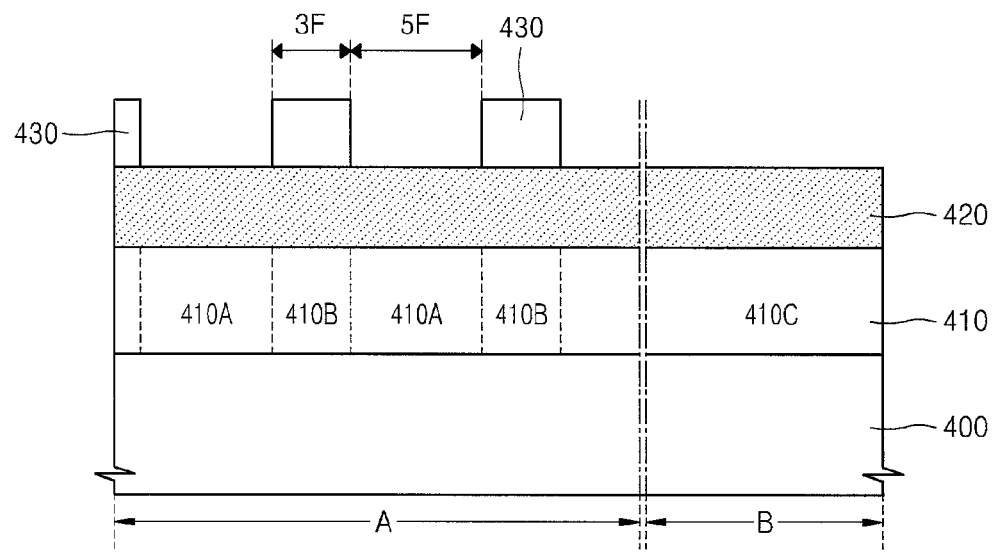
FIGS. 5A, 5B, 5C, 5D, 5E, 5F, 5G, 5H, 5I, 5J, 5K, and 5L are cross-sectional views illustrating steps for patterning a portion of the integrated circuit of FIG. 3 with fine dimensions using a buffer layer, according to an alternative embodiment of the present invention.

Referring to FIG. 5A, a feature layer 410 and a first mask layer 420 are sequentially formed in the high-density region A and the low-density region B on a substrate 400. In addition, a plurality of first buffer structures 430 is formed on the first mask layer 420. The substrate 400 is a semiconductor substrate such as a silicon substrate for example.

The feature layer 410 and the first mask layer 420 of FIG. 5A are similar to the feature layer 310 and the first mask layer 320, respectively, of FIG. 4A. In the high-density region A, the feature layer 410 includes first regions 410A and second regions 410B that are each at least three times wider than the target width 1F. In the low-density region B, the feature layer 410 also includes a third region 410C disposed apart from the first and second regions 410A and 410B.

In the example embodiment of FIG. 5A, the first and second regions 410A and 410B each have a width that is at least three times the target width 1F. For example, the first region 410A has a width of 5F, and the second region 410B has a width of 3F. The first buffer structures 430 are formed on the first mask layer 420 in the high-density region A but are not formed in the low-density region B.

The first buffer structures 430 are formed over the second regions 410B of the feature layer 410 with the same width 3F as the second regions 410B. The first buffer structures 430 are separated by the width 5F of the first regions 410A. Portions of the first mask layer 420 disposed over the first region 410A are exposed between the first buffer structures 430. The first buffer structures 430 of FIG. 5A are comprised of a same material as that of the first buffer structures of FIG. 4A.

Figure 5B:
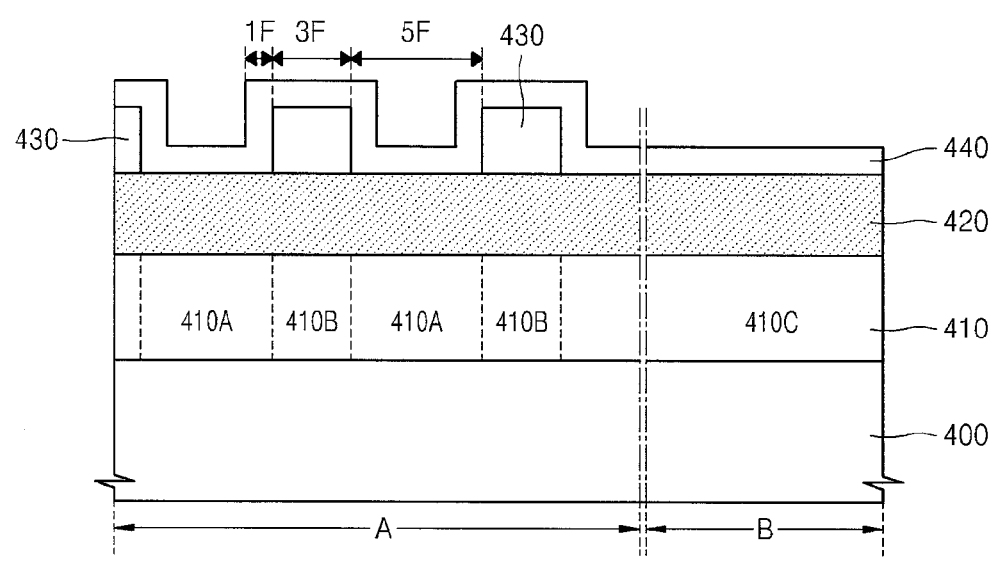

Referring to FIG. 5B, a spacer layer 440 is deposited evenly onto exposed surfaces of the first buffer structures 430 and the first mask layer 420 in the high-density and low-density regions A and B. The thickness of the spacer layer 440 is equal to the target width of 1F in an example embodiment of the present invention. The spacer layer 440 of FIG. 5B is similar to the spacer layer 340 of FIG. 4B.

Figure 5C:
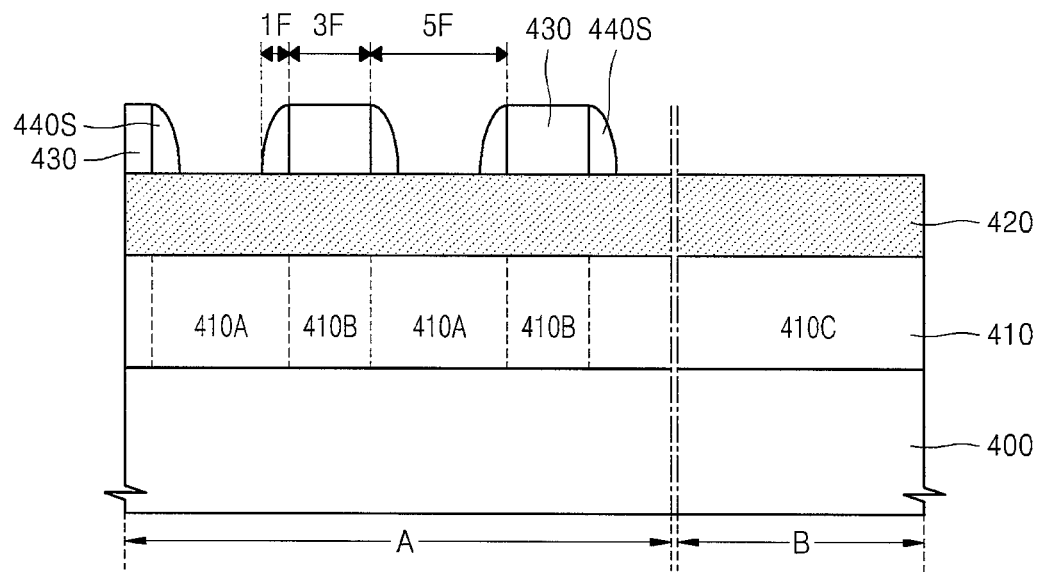

Referring to FIG. 5C, a plurality of spacers 440S are formed at sidewalls of the first buffer structures 430 in the high-density region A by etching back the spacer layer 440 until portions of the top surface of the first mask layer 420 are exposed. Each of the spacers 440S is formed to cover a portion of the top surface of the first mask layer 420 with the target width of 1F.

Figure 5D:
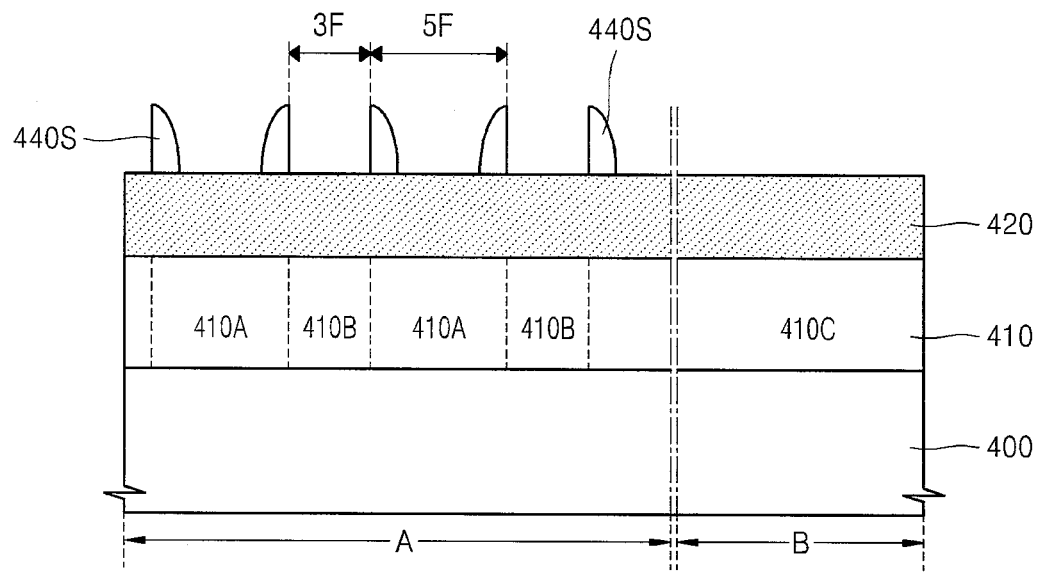
Figure 5E:
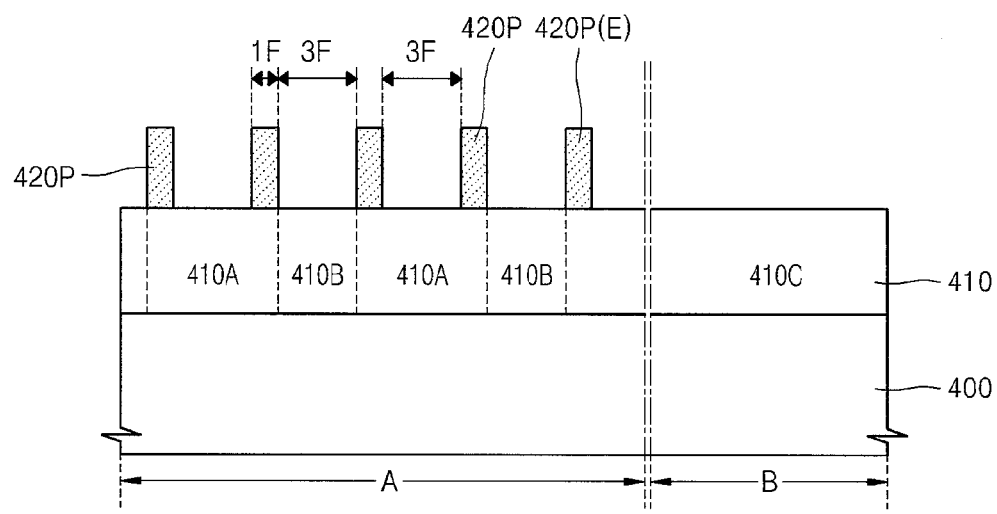

Referring to FIG. 5D, the first buffer structures 430 are removed similarly as described above with reference to FIG. 4D. Referring to FIG. 5E, a plurality of first mask patterns 420P are formed in the high-density region A by patterning the first mask layer 420 in the high-density and low-density regions A and B using the spacers 440S as an etch mask, similarly as described above with reference to FIG. 4E. In FIG. 5E, the first mask patterns 420P formed in the high-density region A include an outermost first mask pattern 420P(E).

The width of each of the first mask patterns 420P is equal to the target width of 1F, according to an example embodiment of the present invention. Portions of the first regions 410A and the second region 410B of the feature layer 410 are alternately exposed between the first mask patterns 420P with a distance between the first mask patterns 420P being 3F. Also in FIG. 5E, after the first mask patterns 420P are formed, the top surface of the feature layer 410 in the low-density region B is entirely exposed.

Figure 5F:
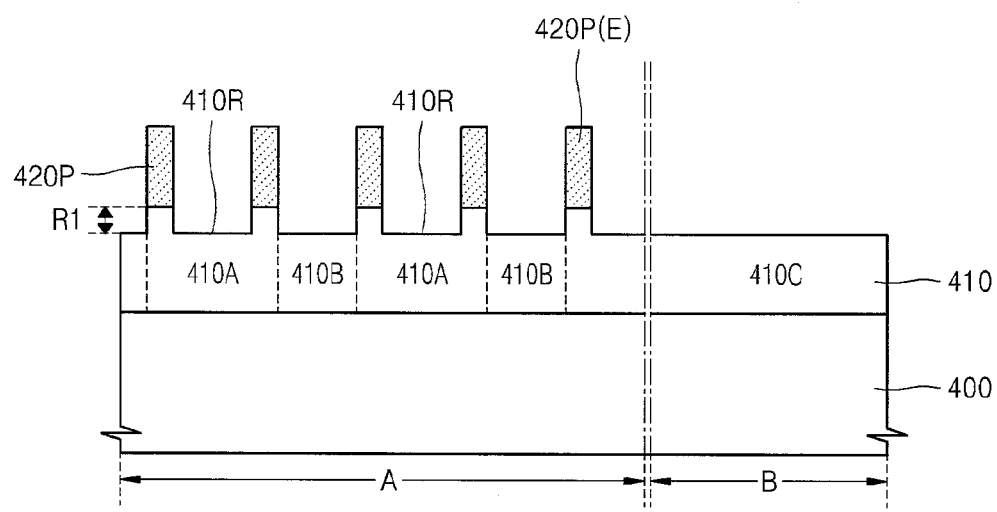

Referring to FIG. 5F, exposed portions of the feature layer 410 in the high-density and low-density regions A and B are removed by a first depth R1 from the top surface of the feature layer 410, similarly as described above with reference to FIG. 4F to form low surfaces 410R of the feature layer 410. The first depth R1 is equal to the target width of 1F in an example embodiment of the present invention. However, the present invention may be practiced without the low surfaces 410R being formed when the step of FIG. 5F is not performed.

Figure 5G:
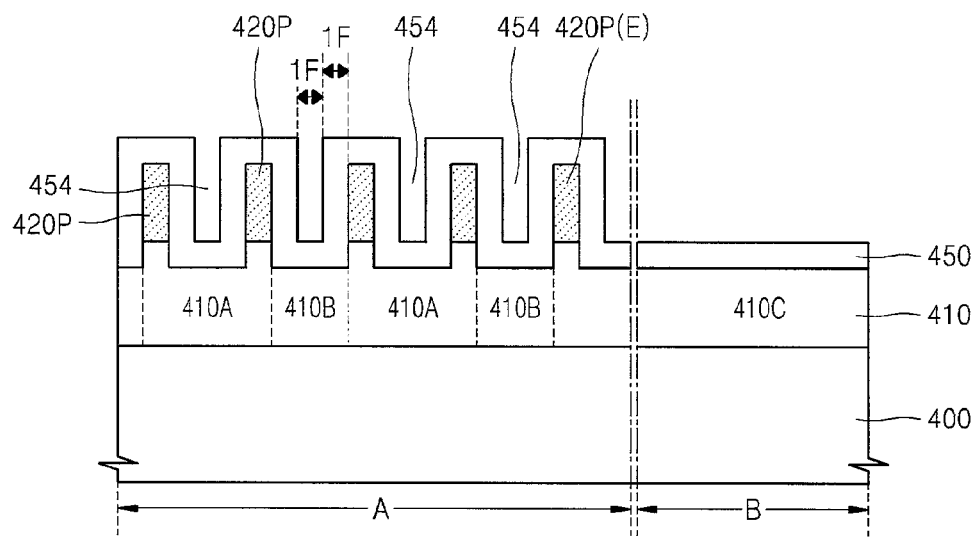

Referring to FIG. 5G, a second buffer layer 450 is evenly deposited onto the top surfaces and the sidewalls of the first mask patterns 420P and the low surfaces 410R of the feature layer 410 in the high-density and low-density regions A and B. The second buffer layer 450 of FIG. 5G is formed similarly as the second buffer layer 350 of FIG. 4G.

Each space between the first mask patterns 420P in the high-density region A has a width of 3F. If the thickness of the second buffer layer 450 is the target width of 1F, each space between the first mask patterns 420P on the first and second regions 410A and 410B is partially filled with the second buffer layer 450. In addition, a plurality of recessed spaces 454, each having a width of 1F, are formed in the second buffer layer 450 between the first mask patterns 420P on the second regions 410B.

Figure 5H:
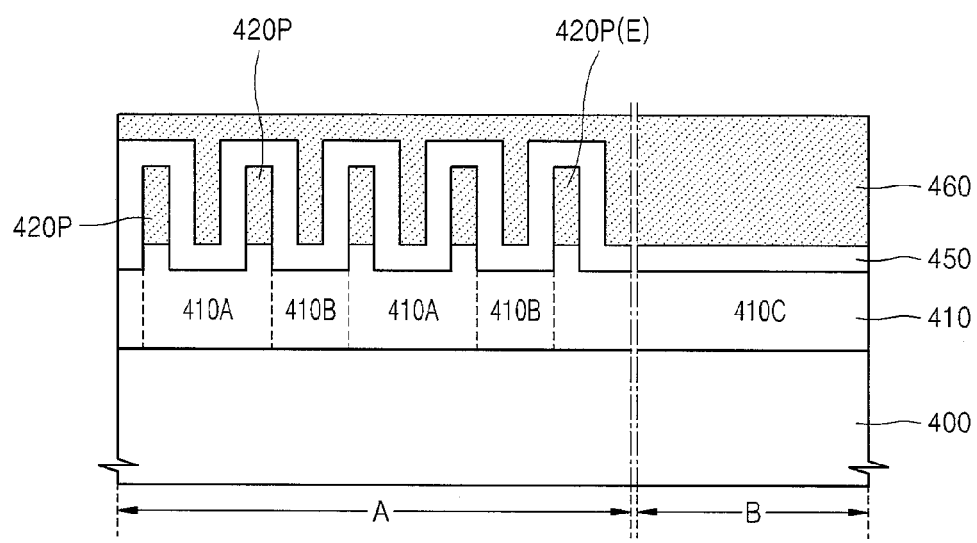

Referring to FIG. 5H, a second mask layer 460 is deposited on the second buffer layer 450 in the high-density and low-density regions A and B. The second mask layer 460 is formed to completely fill the recessed spaces 454 of the second buffer layer 450 between the first mask patterns 420P. The second mask layer 460 of FIG. 5H is similar to the second mask layer 360 of FIG. 4H.

Figure 5I:
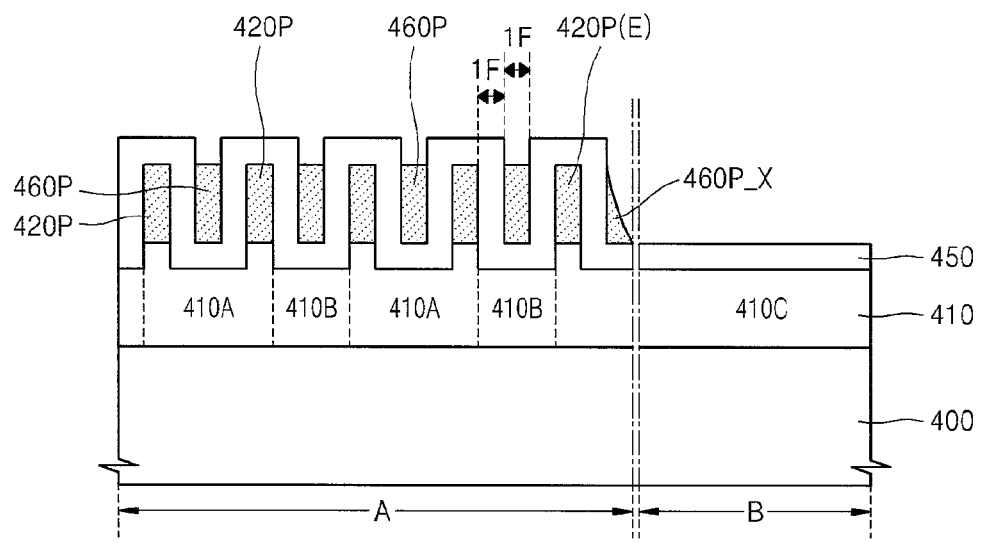

Referring to FIG. 5I, the second mask layer 460 is etched back until the top surfaces of the second buffer layer 450 are exposed to form a plurality of second mask patterns 460P in the recessed spaces 454 within the high-density region A. Such an etch back process of FIG. 5I may be controlled such that the top surfaces of the second mask patterns 460P are level with those of the first mask patterns 420P.

Figure 5J:
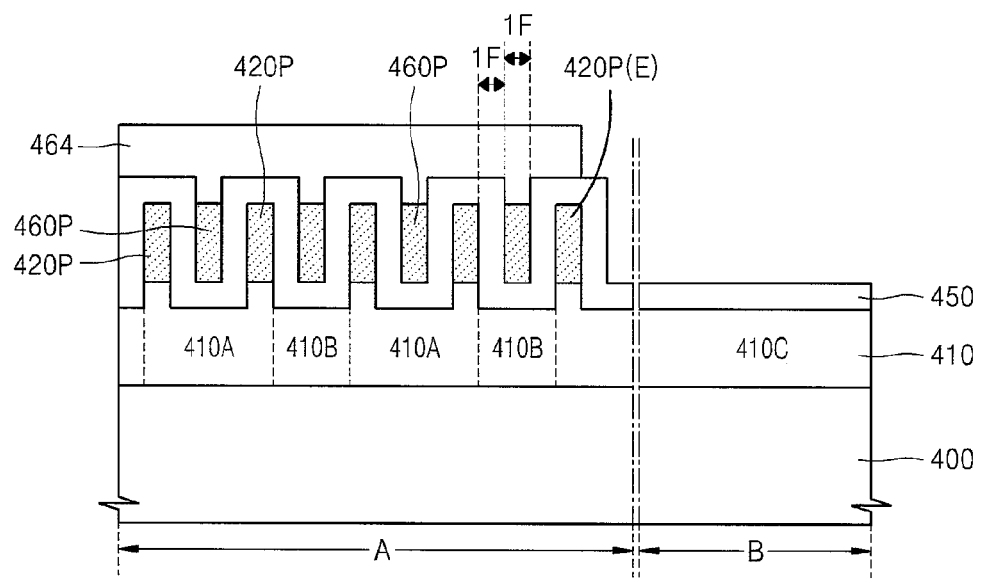

After the second mask patterns 460P are formed in the high-density region A, an undesired remnant 460P_X of the second mask layer 460 may be present on a sidewall of the second buffer layer 450 covering the outermost first mask pattern 420P(E). Referring to FIG. 5J, a third mask layer 464 is formed to entirely cover the second mask patterns 460P while exposing the remnant 460P_X in the high-density region A. Thereafter in FIG. 5J, the exposed remnant 460P_X is removed using the third mask layer 464 and the second buffer layer 450 as an etch mask, similarly as described above with reference to FIG. 4J.

Figure 5K:
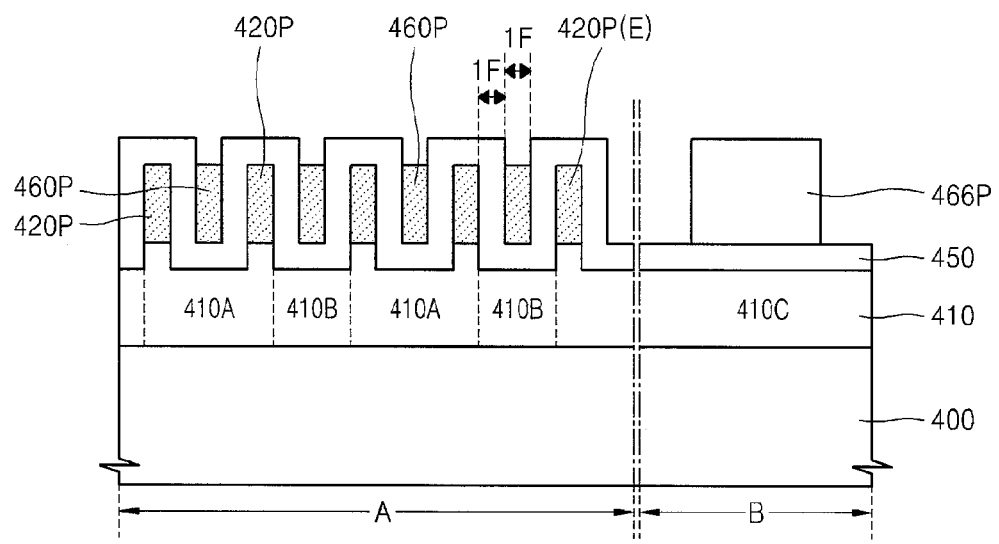

Referring to FIG. 5K, similarly as described above with reference to FIGS. 4K and 4L, the third mask layer 464 is removed, and a fourth mask pattern 466P is formed to cover a portion of the second buffer layer 450 over the third region 410C of the feature layer 410. The fourth mask pattern 466P of FIG. 5K is similar to the fourth mask pattern 366P of FIG. 4L. The width of the fourth mask pattern 466P is greater than the target width of 1F, in an example embodiment of the present invention.

Although not shown, before the fourth mask pattern 466P is formed, a trimming process may be performed to remove undesired portions of the first mask patterns 420P and the second mask patterns 460P.

Figure 5L:
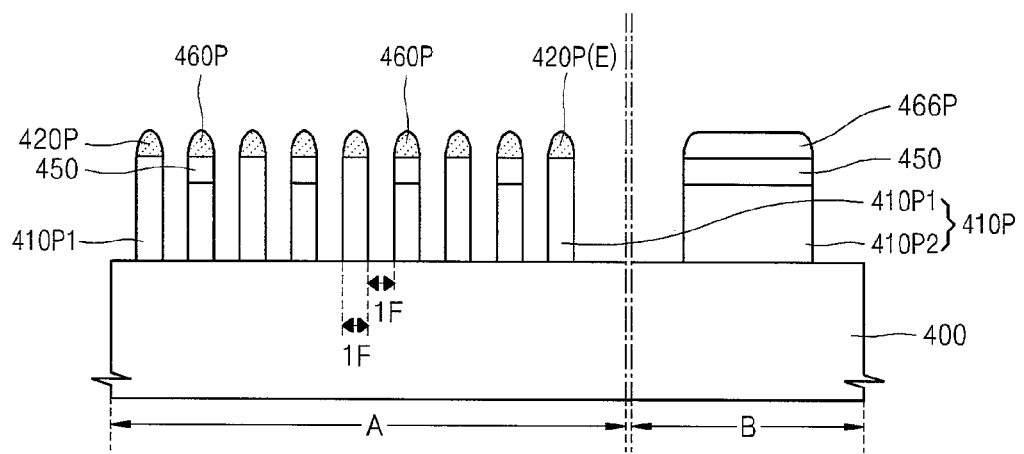

Referring to FIG. 5L, similarly as described above with reference to FIG. 4M, a plurality of feature patterns 410P are formed by patterning the second buffer layer 450 and the feature layer 410 using the first mask patterns 420P, the second mask patterns 460P, and the fourth mask pattern 466P as an etch mask. The feature patterns 410P include a plurality of first feature patterns 410P1 in the high-density region A, and a second feature pattern 410P2 in the low-density region B. The first feature patterns 410P1 each have the target width of 1F and are separated from each other by the target width of 1F. The second feature pattern 410P2 is wider than the target width 1F.

The feature patterns 410P may form the line patterns 210 and the wide pattern 220 of the semiconductor device 200 of FIG. 3, in an example embodiment of the present invention. In FIG. 5L, remaining portions of the second buffer layer 450, the first mask patterns 420P, the second mask patterns 460P, and the fourth mask pattern 466P may be removed if needed.

The present invention may be practiced with the resulting structures of FIG. 5L varying from the shapes as illustrated in FIG. 5L. For example, the widths of the first feature patterns 410P1 may vary with processing variations. In particular in FIG. 5K, some upper portions of the second buffer layer 450 adjacent to the second mask patterns 460P may have a more rounded profile 450 in the high-density region A. Thus, the heights of portions of the second buffer layer 450 between the first and second mask patterns 420P and 460P may vary according to location.

Also, the top surfaces of the second mask patterns 460P may not be level with those of the first mask patterns 420P depending on process variations. In that case, when the second buffer layer 450 is etched using the first and second mask patterns 420P and 460P as an etch mask, and when the feature layer 410 under the second buffer layer 450 is also patterned, the cross-sectional profiles of the first feature patterns 410P1 may be different.

For example, the cross-sectional profiles of two adjacent first feature patterns 410P1 may be line-symmetrical to each other. As another example, a sidewall of the first feature patterns 410P1 may be vertical or may be inclined from the vertical. In addition, two adjacent first feature patterns 410P1 may have different widths from each other, and the distances between the first feature patterns 410P1 may not be the same.

FIGS. 6A, 6B, 6C, and 6D are cross-sectional views illustrating steps for patterning integrated circuit structures such as a plurality of conductive patterns 510P, according to an example embodiment of the present invention. Such conductive patterns 510P (see FIG. 6D) are formed on a substrate 500 using the feature pattern 310P fabricated similarly as described above in reference to FIGS. 4A, 4B, 4C, 4D, 4E, 4F, 4G, 4H, 4I, 4J, 4K, 4L, and 4M.

In FIGS. 6A, 6B, 6C, and 6D, the reference numerals that are the same as those of FIGS. 4A, 4B, 4C, 4D, 4E, 4F, 4G, 4H, 4I, 4J, 4K, 4L, and 4M denote the same elements, and thus, a description of their operations or characteristics is not repeated.

Figure 6A:
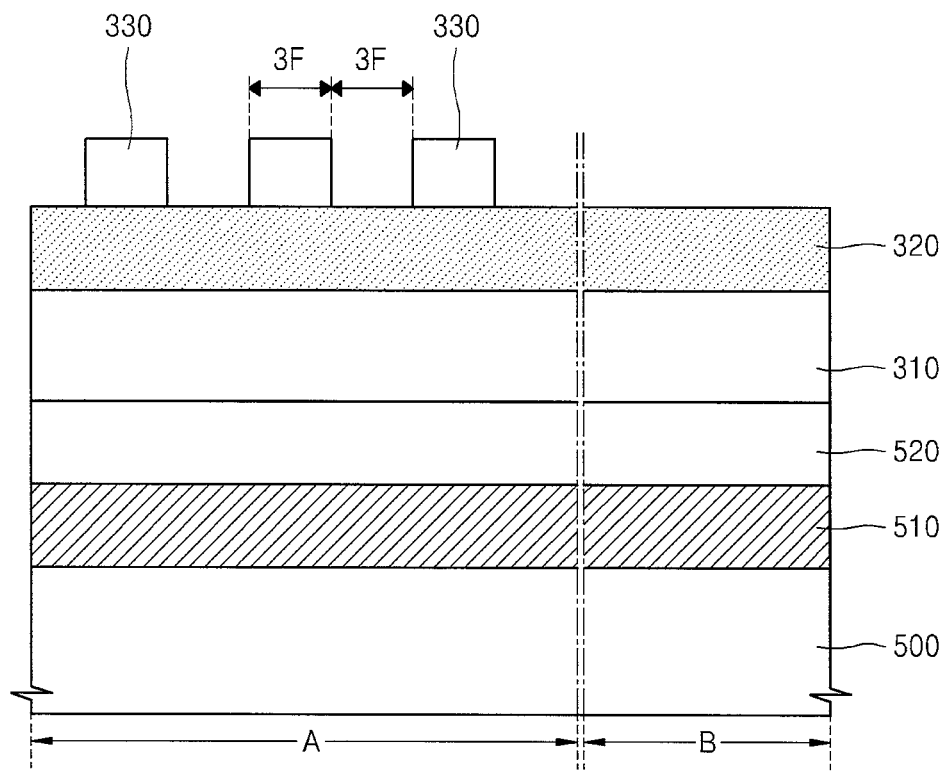
FIGS. 6A, 6B, 6C, and 6D are cross-sectional views illustrating steps for patterning integrated circuit structures, according to an example embodiment of the present invention.

Referring to FIG. 6A, the substrate 500 includes a high-density region A and a low-density region B. A conductive layer 510 is formed on the high-density and low-density regions A and B of the substrate 500, and a hard mask layer 520 is formed on the conductive layer 510. Next similarly as described above with reference to FIG. 4A, the feature layer 310, the first mask layer 320, and the first buffer structures 330 are sequentially formed on the hard mask layer 520.

The substrate 500 may be a semiconductor substrate such as a silicon substrate, according to an example embodiment of the present invention. The conductive layer 510 is comprised of at least one of doped polysilicon, a metal, and a metal nitride. For example, if word lines of a memory device are formed from the conductive layer 510, the conductive layer 510 is comprised of at least one of TaN, TiN, W, WN, HfN, and a tungsten silicide. If bit lines of the memory device are formed from the conductive layer 510, the conductive layer 510 is comprised of doped polysilicon or a metal, according to an example embodiment of the present invention.

The hard mask layer 520 may be a single layer or a stacked structure of at least two hard mask layers having different etch characteristics from each other. The hard mask layer 520 is comprised of an oxide, a nitride, or a combination thereof, in an example embodiment of the present invention. For example, if the feature layer 310 is an oxide layer, the hard mask layer 520 is a nitride layer or a polysilicon layer. However, the present invention is not limited thereto, and the present invention may be generalized to the hard mask layer 520 being comprised of a material having a different etch selectivity from that of the feature layer 310.

Figure 6B:
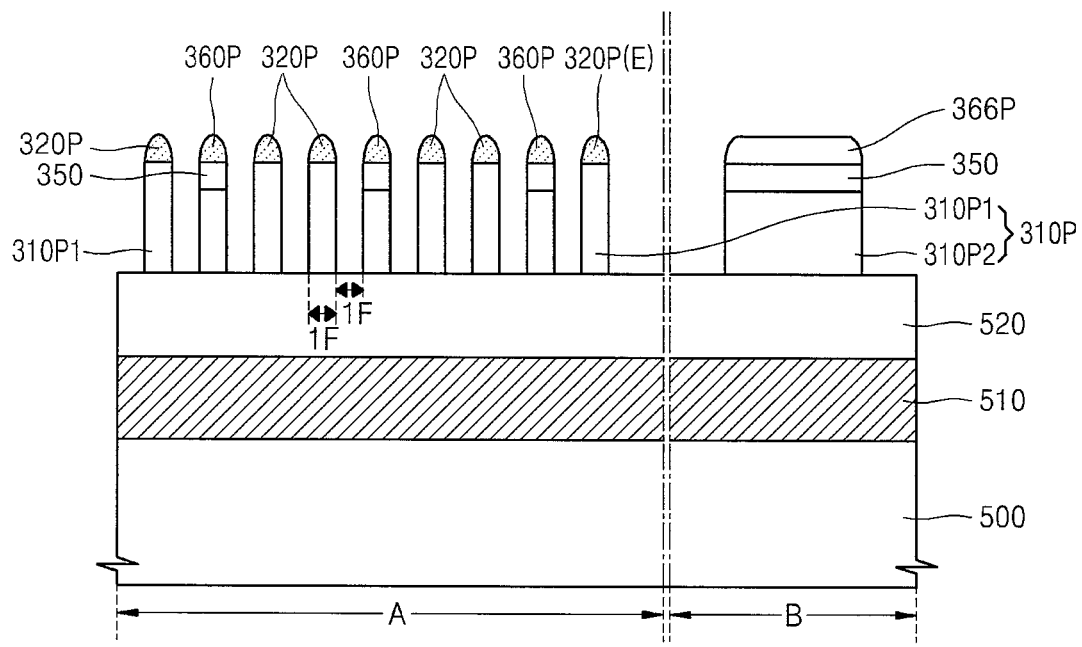

Referring to FIG. 6B, the feature patterns 310P are formed on the hard mask layer 520 in the high-density and low-density regions A and B of the substrate 500, similar to FIG. 4M. The feature patterns 310P include the first feature patterns 310P1 in the high-density region A and the second feature pattern 310P2 in the low-density region B. The first feature patterns 310P1 each have the target width of 1F and are spaced apart by the target width of 1F. The second feature pattern 310P2 is wider than the target width of 1F.

Figure 6C:
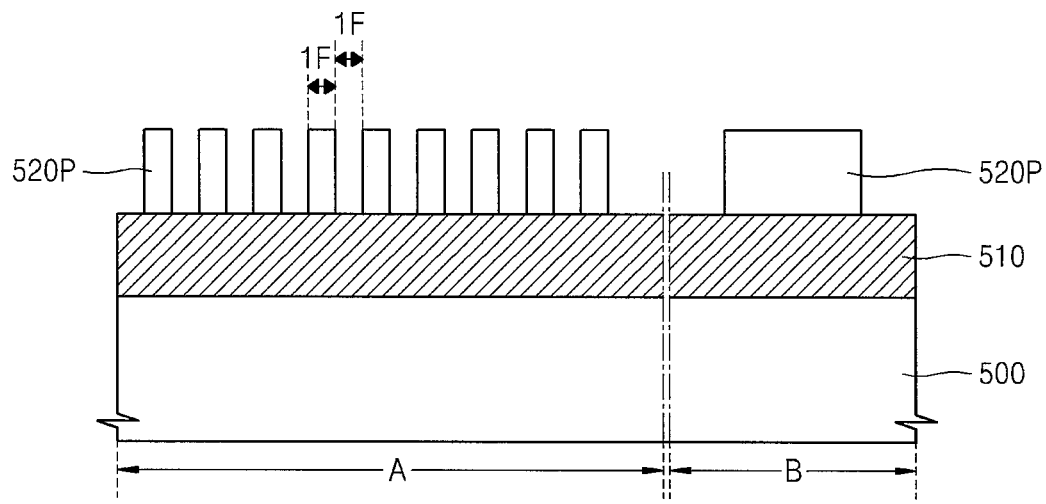
Figure 6D:
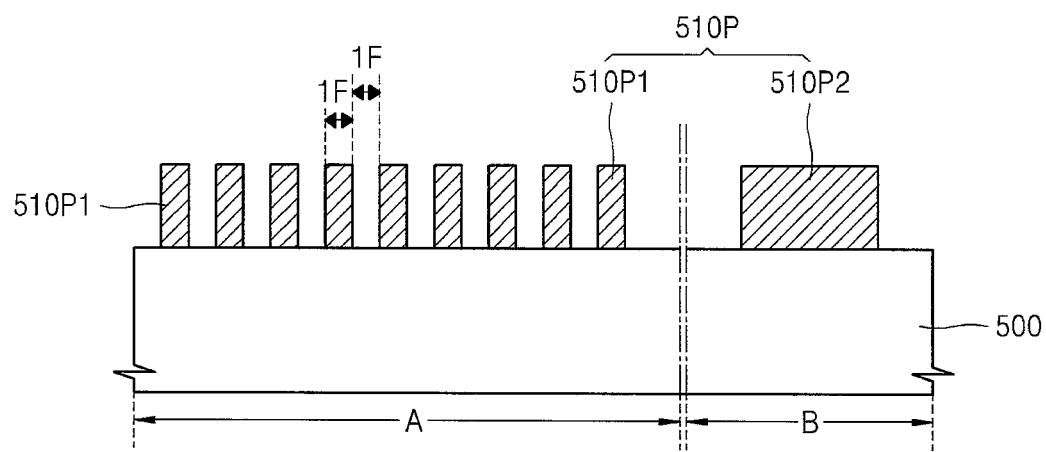

Referring to FIG. 6C, a plurality of hard mask patterns 520P are formed in the high-density and low-density regions A and B by patterning the hard mask layer 520 using the feature patterns 310P as an etch mask. Referring to FIG. 6D, a plurality of conductive patterns 510P are formed by patterning the conductive layer 510 using the hard mask patterns 520P as an etch mask.

The conductive patterns 510P include a plurality of first conductive patterns 510P1 in the high-density region A, and a second conductive pattern 510P2 in the low-density region B. The first conductive patterns 510P1 each have the target width of 1F, and are separated from each other by the target width of 1F. The second conductive pattern 510P2 is wider than the target width of 1F. The first conductive patterns 510P1 and the second conductive pattern 510P2 may respectively form the line patterns 210 and the wide pattern 220 of the semiconductor device 200 of FIG. 3.

The present invention may be practiced with the resulting structures of FIG. 6D varying from the shapes as illustrated in FIG. 6D. For example, the widths of the first conductive patterns 510P1 may vary depending on processing variations. In particular, cross-sectional profiles of the first feature patterns 310P1 of FIG. 6B may vary according to processing variations.

In addition, the cross-sectional profiles of the hard mask patterns 520P and the first conductive patterns 510P1 may be different from those illustrated in FIGS. 6C and 6D. For example, the cross-sectional profiles of two adjacent first conductive patterns 510P1 may be line-symmetrical to each other. As another example, a sidewall of the first conductive patterns 510P1 may be vertical or may be inclined from the vertical. In addition, two adjacent first conductive patterns 510P1 may have different widths from each other, and the distances between the first conductive patterns 510P1 may not be the same.

The conductive patterns 510P have been described as being formed using the feature pattern 310P fabricated according to the steps of FIGS. 4A, 4B, 4C, 4D, 4E, 4F, 4G, 4H, 4I, 4J, 4K, 4L, and 4M. However, the present invention is not limited thereto, and the conductive patterns 510P may be formed using the feature pattern 410P fabricated according to the steps of FIGS. 5A, 5B, 5C, 5D, 5E, 5F, 5G, 5H, 5I, 5J, 5K, and 5L.

Figure 7A:
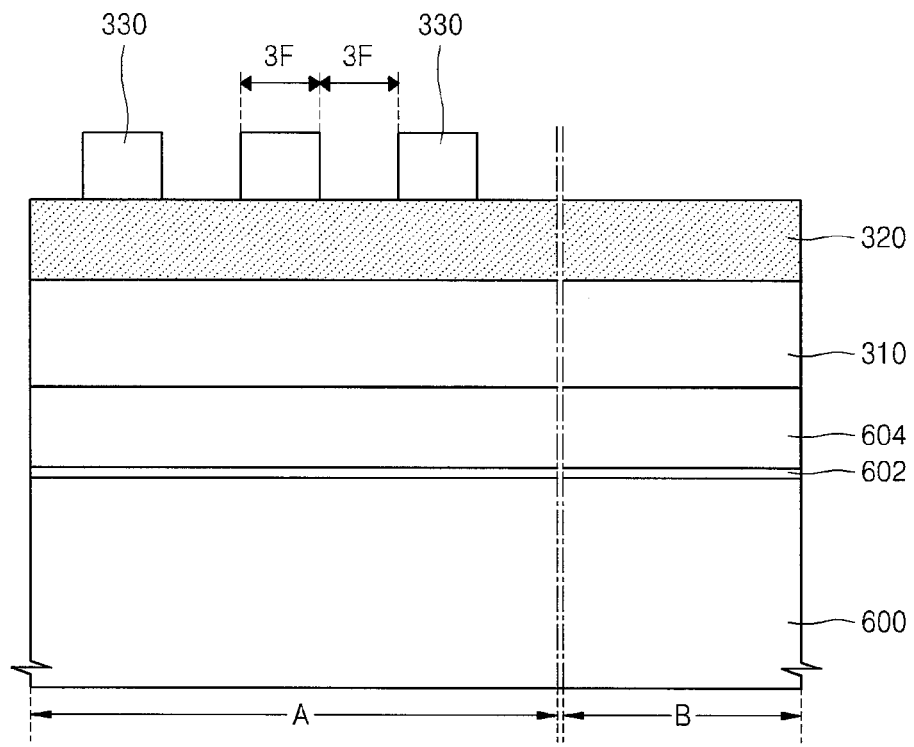
FIGS. 7A, 7B, 7C, 7D, and 7E are cross-sectional views illustrating steps for patterning trenches in a semiconductor substrate, according to an example embodiment of the present invention.
Figure 7B:
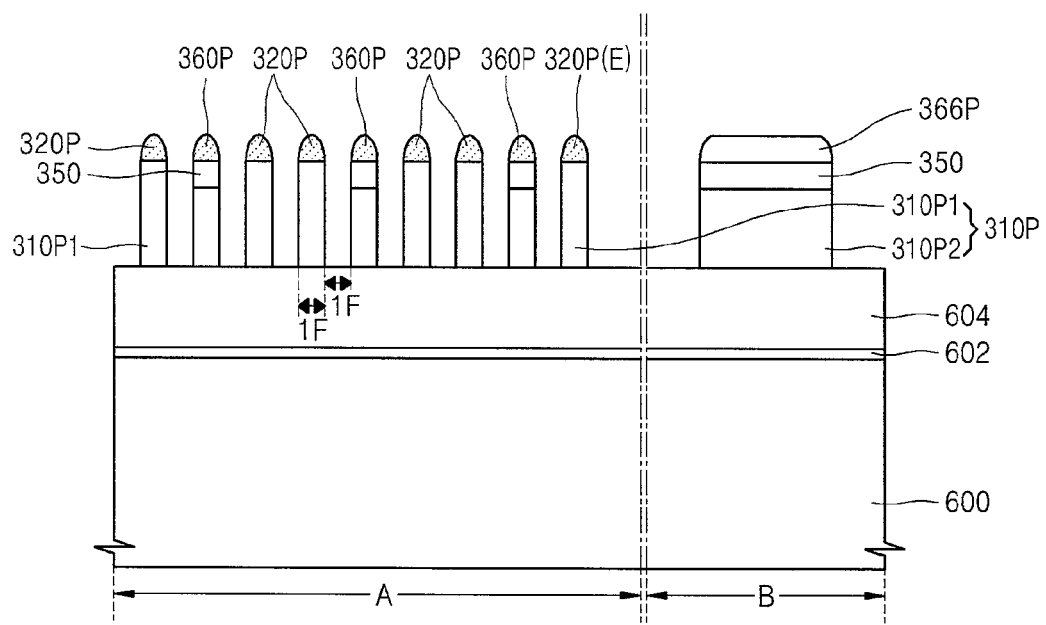
Figure 7C:
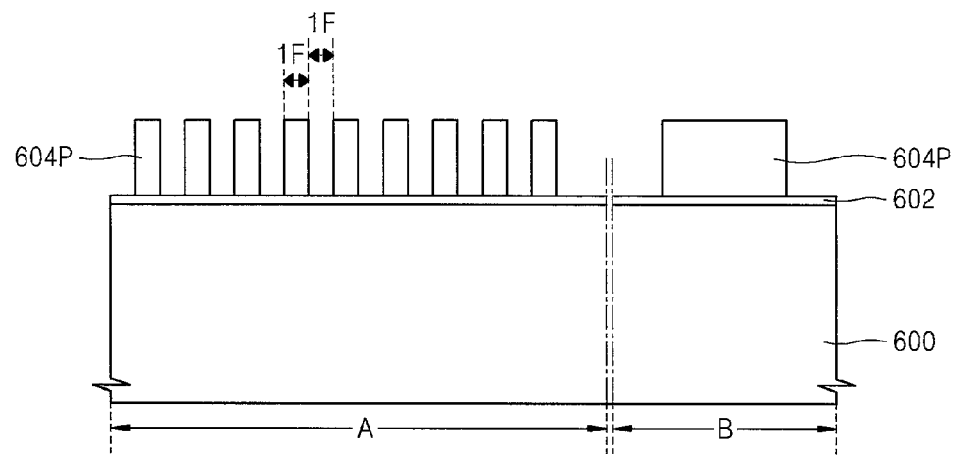
Figure 7D:
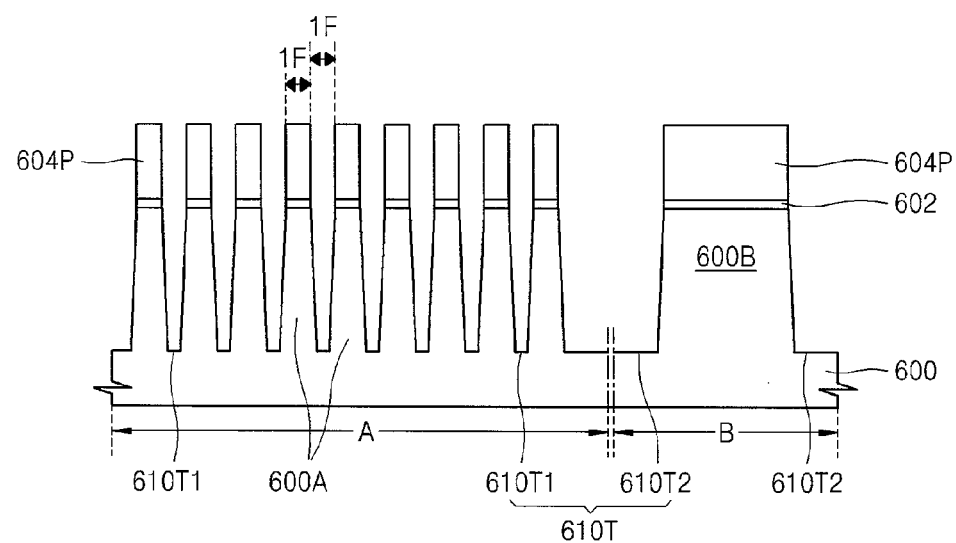

FIGS. 7A, 7B, 7C, 7D, and 7E are cross-sectional views illustrating steps for patterning trenches 610T of FIG. 7D in a semiconductor substrate, according to an example embodiment of the present invention. Such trenches 610T are for forming isolation regions of a substrate 600 using the feature patterns 310P formed according to FIGS. 4A, 4B, 4C, 4D, 4E, 4F, 4G, 4H, 4I, 4J, 4K, 4L, and 4M, in an example embodiment of the present invention.

In FIGS. 7A, 7B, 7C, 7D, and 7E, the reference numerals that are same as those of FIGS. 4A, 4B, 4C, 4D, 4E, 4F, 4G, 4H, 4I, 4J, 4K, 4L, and 4M denote the same elements, and thus, a description of their operations or characteristics is not repeated.

Referring to FIG. 7A, the substrate 600 includes a high-density region A and a low-density region B. In addition, a pad oxide layer 602 is formed in the high-density and low-density regions A and B, and a hard mask layer 604 is formed on the pad oxide layer 602. Then similarly as described above with reference to FIG. 4A, a feature layer 310, a first mask layer 320, and a plurality of first buffer structures 330 are sequentially formed on the hard mask layer 604 in the high-density and low-density regions A and B.

The substrate 600 is a semiconductor substrate such as a silicon substrate, in an example embodiment of the present invention. The hard mask layer 604 may be a single layer or a stacked structure of at least two hard mask layers having different etch characteristics from each other. For example, the hard mask layer 604 is comprised of an oxide, a nitride, or a combination thereof, in an example embodiment of the present invention.

Referring to FIG. 7B, a plurality of feature patterns 310P are formed on the hard mask layer 604 in the high-density and low-density regions A and B by performing the processes described above with reference to FIGS. 4B, 4C, 4D, 4E, 4F, 4G, 4H, 4I, 4J, 4K, 4L, and 4M. The feature patterns 310P include a plurality of first feature patterns 310P1 in the high-density region A and a second feature pattern 310P2 in the low-density region B. The first feature patterns 310P1 each have the target width of 1F, and are spaced apart by the target width of 1F. The second feature pattern 310P2 is wider than the target width of 1F.

Referring to FIG. 7C, a plurality of hard mask patterns 604P are formed by patterning the hard mask layer 604 in the high-density and low-density regions A and B using the feature patterns 310P as an etch mask. Referring to FIG. 7D, the plurality of trenches 610T are formed in the high-density and low-density regions A and B by etching away exposed portions of the substrate 600 and the pad oxide layer 602 using the hard mask patterns 604P as an etch mask.

The trenches 610T include a plurality of first trenches 610T1 in the high-density region A, and a plurality of second trenches 610T2 in the low-density region B. The first trenches 610T1 are formed between a plurality of active regions 600A. Each of the first trenches 610T1 and the active regions 600A has the target width of 1F. The second trenches 610T2 are formed between a plurality of active regions 600B. Each of second trenches 610T2 and the active regions 600B has a width greater than the target width of 1F.

Figure 7E:
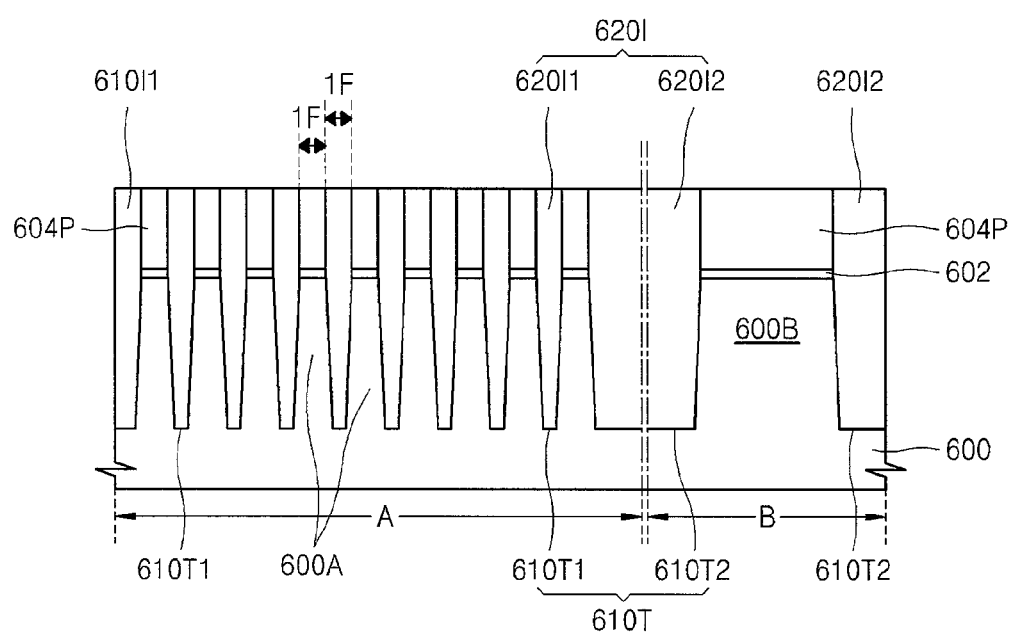

Referring to FIG. 7E, isolation patterns 620I are formed with an insulating material filling the trenches 610T. The isolation patterns 620I include a plurality of first isolation patterns 620I1 in the high-density region A, and a plurality of second isolation patterns 620I2 in the low-density region B. The first isolation patterns 620I1 are formed between the active regions 600A with the target width of 1F. The second isolation patterns 620I2 are formed between the active regions 600B with a width that is wider than the target width of 1F.

The active regions 600A in the high-density region A may form the plurality of line patterns 210 of the semiconductor device 200 of FIG. 3. The active regions 600B in the low-density region B may form the wide pattern 220 of the semiconductor device 200 of FIG. 3.

The present invention may also be practiced with the resulting structures of FIG. 7E varying from the shapes as illustrated in FIG. 7E. For example, the widths of the first trenches 610T1 may vary in the high-density region A with processing variations. In addition, a cross-sectional profile of each of the first feature patterns 310P1 of FIG. 7B may vary according to processing variations. In this case, the cross-sectional profiles of the hard mask patterns 604P and the first trenches 610T1 resulting from using the first feature patterns 310P1 may be different than as illustrated in FIG. 7D.

For example, the cross-sectional profiles of two adjacent first trenches 610T1 may be line-symmetrical to each other. As another example, sidewalls of any of the first trenches 610T1 may not be symmetrical to each other. In addition, two adjacent first trenches 610T1 may have different widths from each other, and the distances between the first trenches 610T1 may not be the same.

The integrated circuit structures of FIG. 7E have been described herein as being formed using process steps similar to FIGS. 4A, 4B, 4C, 4D, 4E, 4F, 4G, 4H, 4I, 4J, 4K, 4L, and 4M. However, the present invention may also be practiced when the integrated circuit structures of FIG. 7E are formed using process steps similar to FIGS. 5A, 5B, 5C, 5D, 5E, 5F, 5G, 5H, 5I, 5J, 5K, and 5L.

Figure 8:
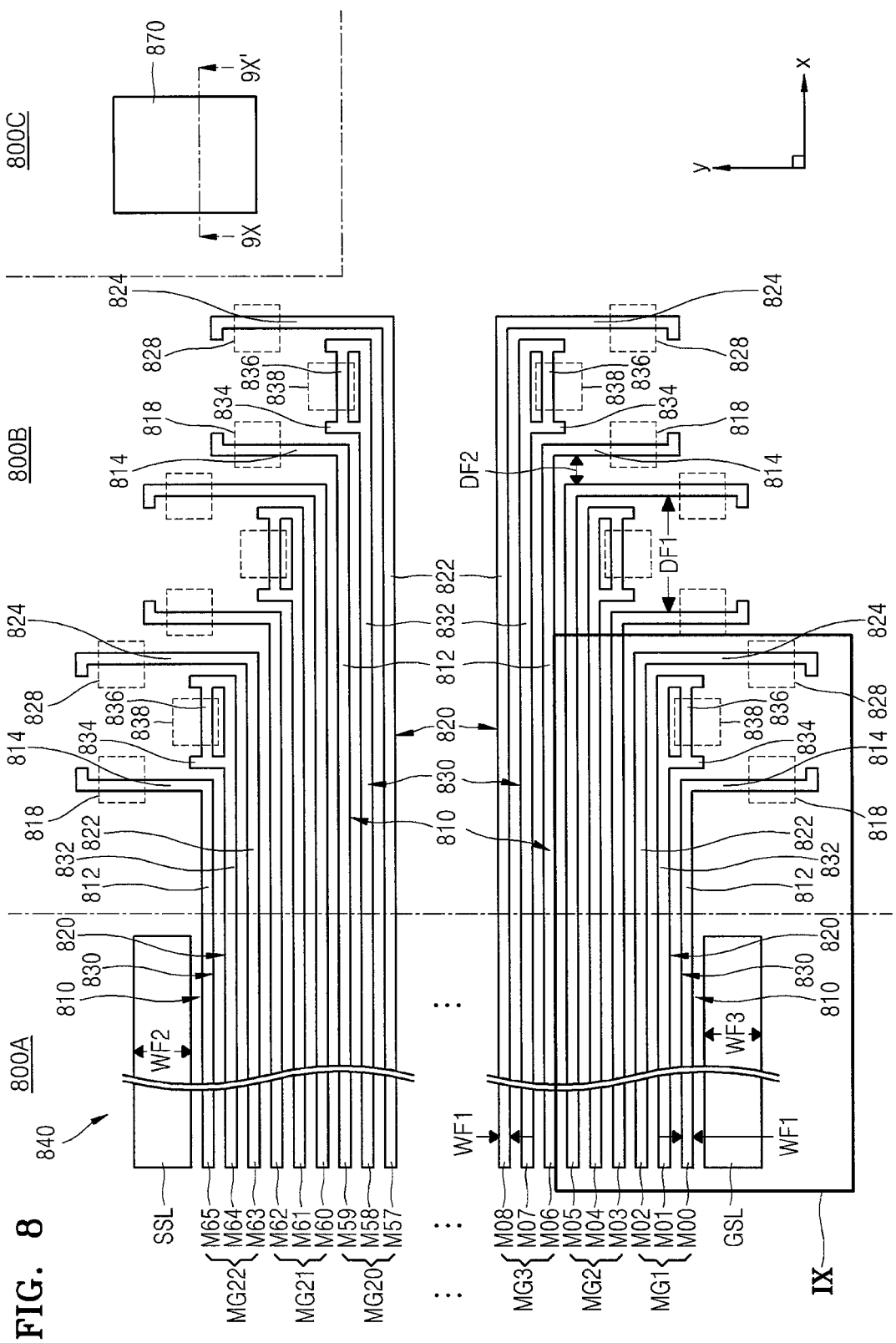
FIG. 8 is a plan view of conductive structures of a semiconductor device, according to an example embodiment of the present invention.

FIG. 8 is a plan view of conductive structures of a semiconductor device, according to an example embodiment of the present invention. Such a semiconductor device may be fabricated with methods of fine patterning using buffer structures and layers as described in the above embodiments of the present invention.

FIG. 8 illustrates a layout of a part of a memory cell region 800A, a connection region 800B, and a peripheral circuit region 800C. The memory cell region 800A has a memory device such as a NAND flash memory device fabricated therein. The connection region 800B is for connecting a plurality of conductive lines of a cell array of the memory cell region 800A. The conductive lines may be word lines or bit lines of the cell array of the memory cell region 800A. The connection region 800B connects such conductive lines to an external circuit (not shown) such as a decoder for example. A peripheral circuit conductive pattern 870 is formed in the peripheral circuit region 800C.

A plurality of memory cell blocks 840 are formed in the memory cell region 800A, but for simplicity of description and illustration, one example memory cell block 840 is illustrated in FIG. 8. In the memory cell block 840, a plurality of conductive lines M00, M01, M02, . . . , M63, M64, and M65 forming one cell string 10 of FIG. 2 extend in parallel between a string selection line SSL and a ground selection line GSL in a first direction (such as an X-axis direction for example). The plurality of conductive lines M00, M01, M02, . . . , M63, M64, and M65 extend from the memory cell region 800A to the connection region 800B.

For connecting the conductive lines M00, M01, M02, . . . , M63, M64, and M65 to the external circuit (not shown), respective contact pads such as 818, 828, and 838 (outlined in dashed lines in FIG. 8) are formed to be coupled to respective conductive lines M00, M01, M02, . . . , M63, M64, and M65 in the connection region 800B. For example, a respective contact pad is formed to be integral with each of the conductive lines M00, M01, M02, . . . , M63, M64, and M65.

The conductive lines M00, M01, M02, . . . , M63, M64, and M65 are formed on a same plane and are organized into a plurality of conductive line groups MG1, MG2, . . . , MG21, and MG22 each consisting of three conductive lines. Each of the conductive line groups MG1, MG2, . . . , MG21, and MG22 includes a first conductive line 810, a second conductive line 820, and a third conductive line 830 between the first and second conductive lines 810 and 820.

FIG. 8 illustrates the example of one memory cell block 840 including twenty-two conductive line groups. However, the present invention is not limited thereto, and the present invention may be practiced with one memory cell block having other number of conductive line groups such as less or greater than twenty-two conductive line groups.

The first conductive line 810 includes a first line portion 812 and a first branch portion 814. The first line portion 812 extends from the memory cell region 800A to the connection region 800B in the first direction (the X-axis direction in FIG. 8). The first branch portion 814 is formed in the connection region 800B to extend from one end of the first line pattern 812 in a different direction (such as perpendicular in a Y-axis direction) from the first direction.

The second conductive line 820 includes a second line portion 822 and a second branch portion 824. The second line portion 822 extends from the memory cell region 800A to the connection region 800B in parallel with the first line portion 812. The second branch portion 824 is formed in the connection region 800B to extend from one end of the second line portion 822 in a different direction (such as perpendicular in the Y-axis direction) from the first direction.

The third conductive line 830 includes a third line portion 832 and a third branch portion 834. The third line portion 832 extends parallel between the first and second line portions 812 and 822. The third branch portion 834 is formed between the first and second branch portion 814 and 824 to extend from one end of the third line portion 832 in a different direction (such as perpendicular in the Y-axis direction) from the first direction.

The third branch portion 834 is shorter than the first and second branch portions 814 and 824. In an example embodiment of the present invention, the third branch portion 834 is shorter than the first and second branch portions 814 and 824 by at least a pad size of the semiconductor device. For example, the pad size corresponds to the size of each of the contact pads 818, 828, and 838.

The first, second, and third branch portions 814, 824, and 834 extend perpendicular to the first, second, and third line portions 812, 822, and 832, respectively. However, the present invention is not limited thereto, and the present invention may be practiced with the first, second, and third branch portions 814, 824, and 834 extending in various directions from the first, second, and third line portions 812, 822, and 832, respectively.

In each conductive line group, the third line portion 832 is longer than the first line portion 812 and is shorter than the second line portion 822 in the first direction (the X-axis direction in FIG. 8).

The third conductive line 830 may further include a connection portion 836 that extends from the third branch portion 834 in parallel with the third line portion 832 in the connection region 800B. The connection portion 836 may or may not be formed depending on a method of forming patterns of the semiconductor device of FIG. 8.

Each of the first, second, and third conductive lines 810, 820, and 830 has a width of WF1 in the memory cell region 800A and the connection region 800B. Such a width WF1 may be equal to a minimum feature size 1F of the semiconductor device. The distance between the first, second, and third conductive lines 810, 820, and 830 is also equal to 1F.

An outermost conductive line of the conductive line groups MG1, MG2, . . . , MG21, and MG22 may be a dummy conductive line that does not function as a conductor. For example in FIG. 8, a first outermost conductive line M00 adjacent the ground selection line GSL and a second outermost conductive line M65 adjacent the string selection line SSL may be dummy conductive lines.

The string selection line SSL and the ground selection line GSL have respective widths WF2 and WF3 that are each greater than the width WF1. The distance between the ground selection line GSL and the outermost conductive line M00 is about 1F, and the distance between the string selection line SSL and the outermost conductive line M65 is also about 1F.

In the connection region 800B, each of the plurality of conductive line groups MG1, MG2, . . . , MG21, and MG22 includes a first contact pad 818 formed integral with the first conductive line 810, a second contact pad 828 formed integral with the second conductive line 820, and a third contact pad 838 formed integral with the third conductive line 830. For example, the first, second, and third contact pads 818, 828, and 838 are formed to be integral with the first, second, and third branch portions 814, 824, and 834, respectively. The first, second, and third contact pads 818, 828, and 838 are formed to be separated from each other, according to an example embodiment of the present invention.

In FIG. 8, the conductive lines M00, M01, M02, . . . , M63, M64, and M65, the string selection line SSL, the ground selection line GSL, the first, second, and third contact pads 818, 828, and 838, and the peripheral circuit conductive pattern 870 are comprised of a same material, according to an example embodiment of the present invention. The peripheral circuit conductive pattern 870 is a gate electrode of a peripheral circuit transistor, according to an example embodiment of the present invention.

The first, second, and third conductive lines 810, 820, and 830 are word lines of the memory cells in the memory cell region 800A, according to an example embodiment of the present invention. Alternatively, the conductive lines M00, M01, M02, . . . , M63, M64, and M65 are bit lines of the memory cells in the memory cell region 800A. In that case, the string selection line SSL and the ground selection line GSL may be omitted.

In the connection region 800B, a distance DF1 between the first branch portion 814 and the second branch portion 824 is at least nine times the width WF1 of each conductive line. For example, the distance DF1 is equal to or greater than 9F. A distance DF2 between the first branch portion 814 of a conductive line group and the second branch portion 824 of an adjacent conductive line group is at least four times the width WF1 of each conductive line. For example, the distance DF2 is equal to or greater than 4F. Such distances DF1 and DF2 are advantageous for a sufficient design margin resulting in prevention of short-circuiting between the contact pads 818, 828, and 838.

FIGS. 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, and 21C are plan views and cross-sectional views illustrating steps for fabricating a portion of the conductive structures of FIG. 8, according to example embodiments of the present invention.

In particular, FIGS. 9A, 10A, 11A, 12A, 13A, 14A, 15A, 16A, 17A, 18A, 19A, 20A, and 21A are plan views of a rectangular region IX of FIG. 8. FIGS. 9B, 10B, 11B, 12B, 13B, 14B, 15B, 16B, 17B, 18B, 19B, 20B, and 21B are cross-sectional views taken along line BY-BY' of FIGS. 9A, 10A, 11A, 12A, 13A, 14A, 15A, 16A, 17A, 18A, 19A, 20A, and 21A respectively, and along line 9X-9X' of the peripheral circuit region 800C in FIG. 8. FIGS. 9C, 10C, 11C, 12C, 13C, 14C, 15C, 16C, 17C, 18C, 19C, 20C, and 21C are cross-sectional views taken along lines CX-CX' and CY-CY' in FIGS. 9A, 10A, 11A, 12A, 13A, 14A, 15A, 16A, 17A, 18A, 19A, 20A, and 21A respectively.

Such process steps are described to include similar process steps of FIGS. FIGS. 4A, 4B, 4C, 4D, 4E, 4F, 4G, 4H, 4I, 4J, 4K, 4L, and 4M. Reference numerals that are same in such FIGS. 4A, 4B, 4C, 4D, 4E, 4F, 4G, 4H, 4I, 4J, 4K, 4L, 4M, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, and 21C denote similar elements, and thus, a description of their operations or characteristics is not repeated.

Figure 9A:
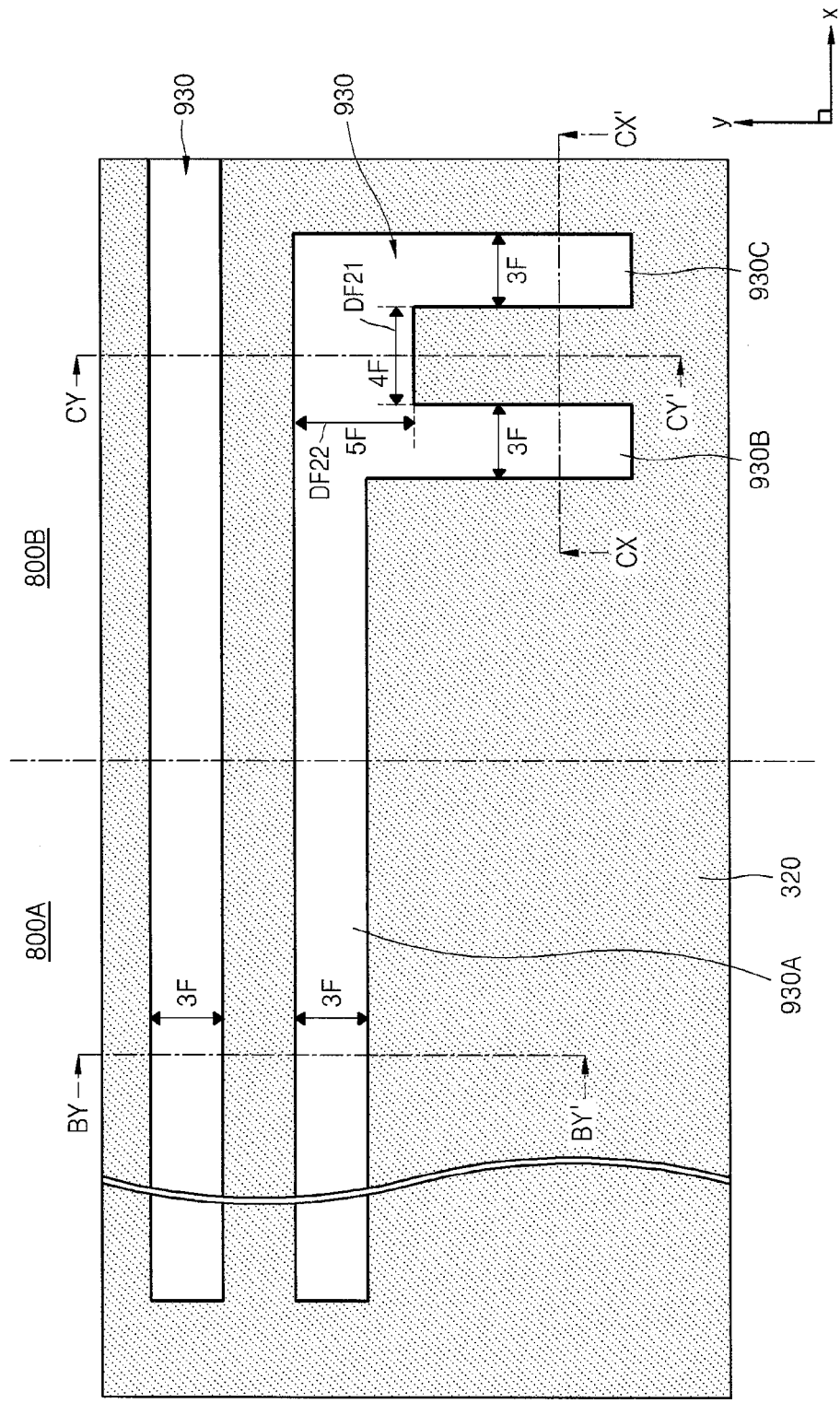
Figure 9B:
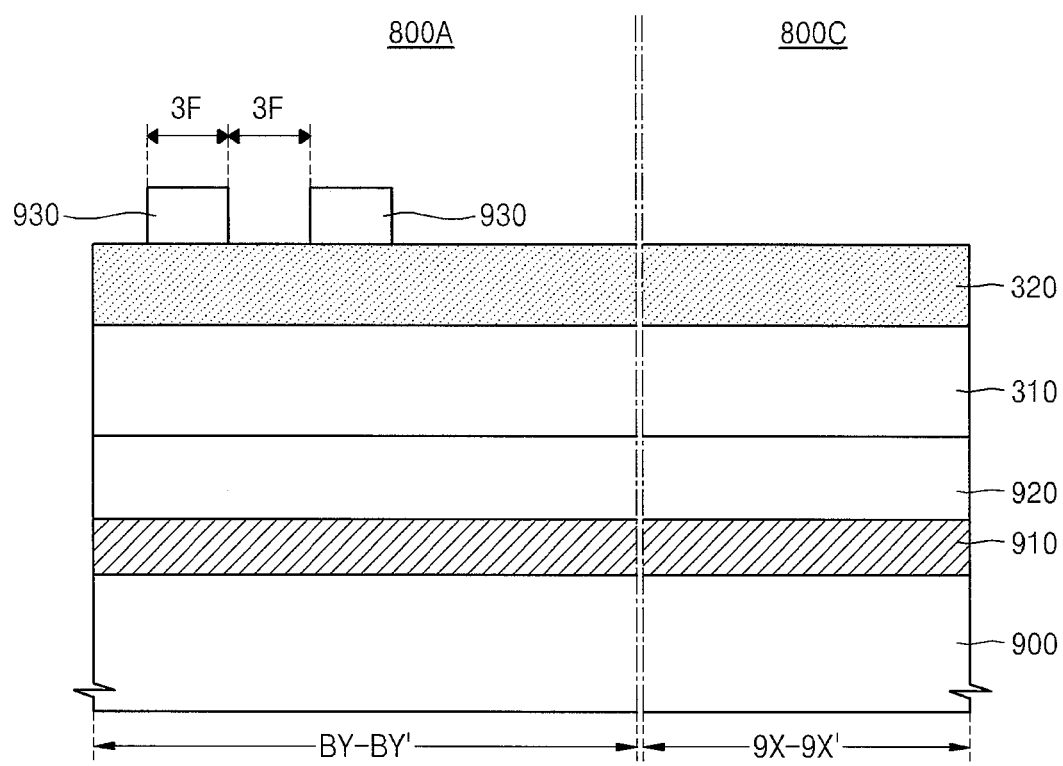
Figure 9C:
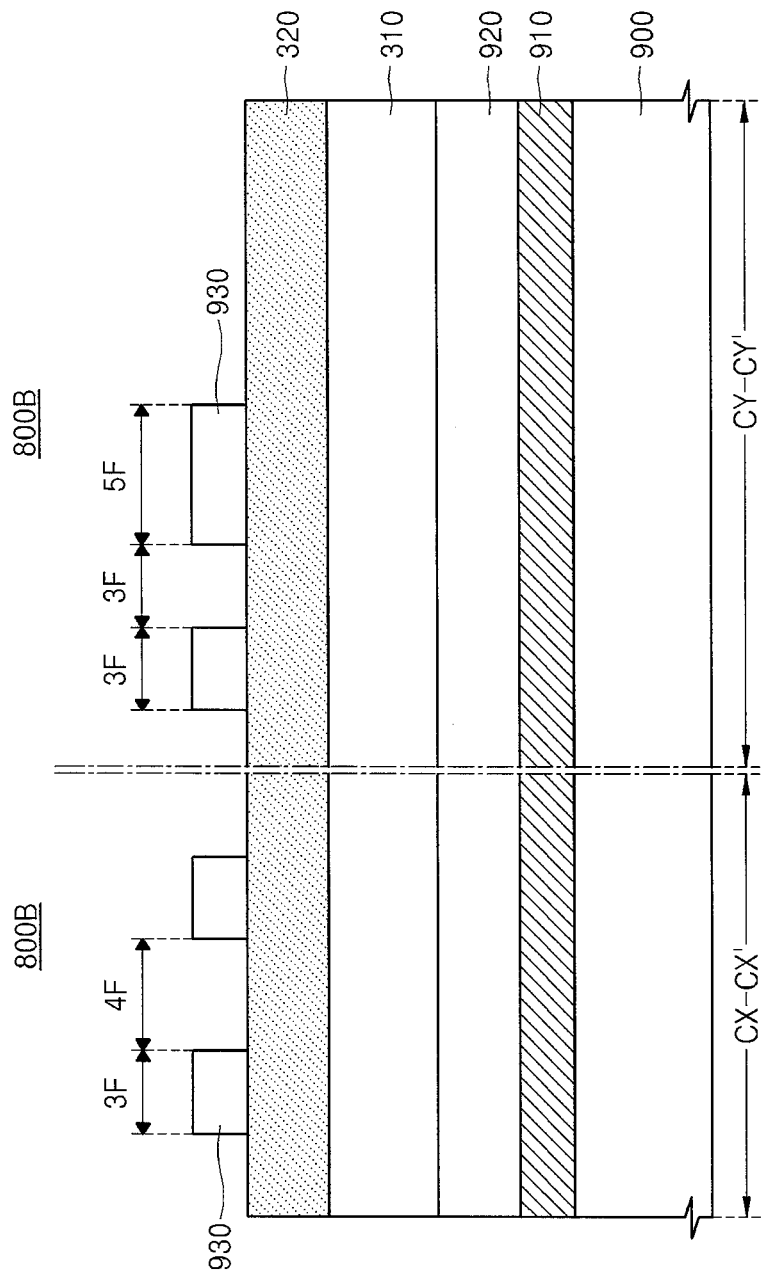

Referring to FIGS. 9A, 9B, and 9C, a substrate 900 that may be a silicon substrate includes the memory cell region 800A, the connection region 800B, and the peripheral circuit region 800C of FIG. 8. A conductive layer 910 for forming a plurality of conductive lines is formed on the substrate 900, and a hard mask layer 920 is formed on the conductive layer 910. Furthermore, similarly as described above with reference to FIG. 4A, a feature layer 310 and a first mask layer 320 are formed sequentially on the hard mask layer 920 in the memory cell region 800A, the connection region 800B, and the peripheral circuit region 800C. In addition, a plurality of first buffer structures 930 is formed on the first mask layer 320.

The conductive layer 910 and the hard mask layer 920 are similar as the conductive layer 510 and the hard mask layer 520, respectively, of FIG. 6A. The first buffer structures 930 are similar to the first buffer structures 330 of FIG. 4A, except the first buffer structure 930 has a planar "F" shape in FIG. 9A, in an example embodiment of the present invention.

Each buffer structure 930 includes a line buffer portion 930A extending from the memory cell region 800A to the connection region 800B in the first direction (i.e., X-axis direction). Each buffer structure 930 also includes branch buffer portions 930B and 930C that extend parallel with each other within the connection region 800B in a different direction such as in a perpendicular direction (i.e., Y-axis direction) from the first direction. The distance between the branch buffer portions 930B and 930C is 4F.

The present invention may also be practiced with the first buffer structures 930 having a reversed "F" shape that is line-symmetrical to the "F" shape, a "Y" shape, a reversed "Y" shape which is line-symmetrical to the "Y" shape, a fork shape, or a reversed fork shape which is line-symmetrical to the fork shape.

The width of the first buffer structures 930 is at least three times the target width of 1F of a fine pattern to be formed on the substrate 900. Further referring to FIG. 9A, a distance DF21 between the buffer branch portions 930B and 930C is at least 3F such as 4F as illustrated in FIG. 9A for a sufficient process margin. Also, a width DF22 of a portion of the first buffer structure 930A having the buffer branch portions 930B and 930C extending there-from is about 5F as illustrated in FIG. 9A resulting in a sufficient process margin.

Figure 10A:
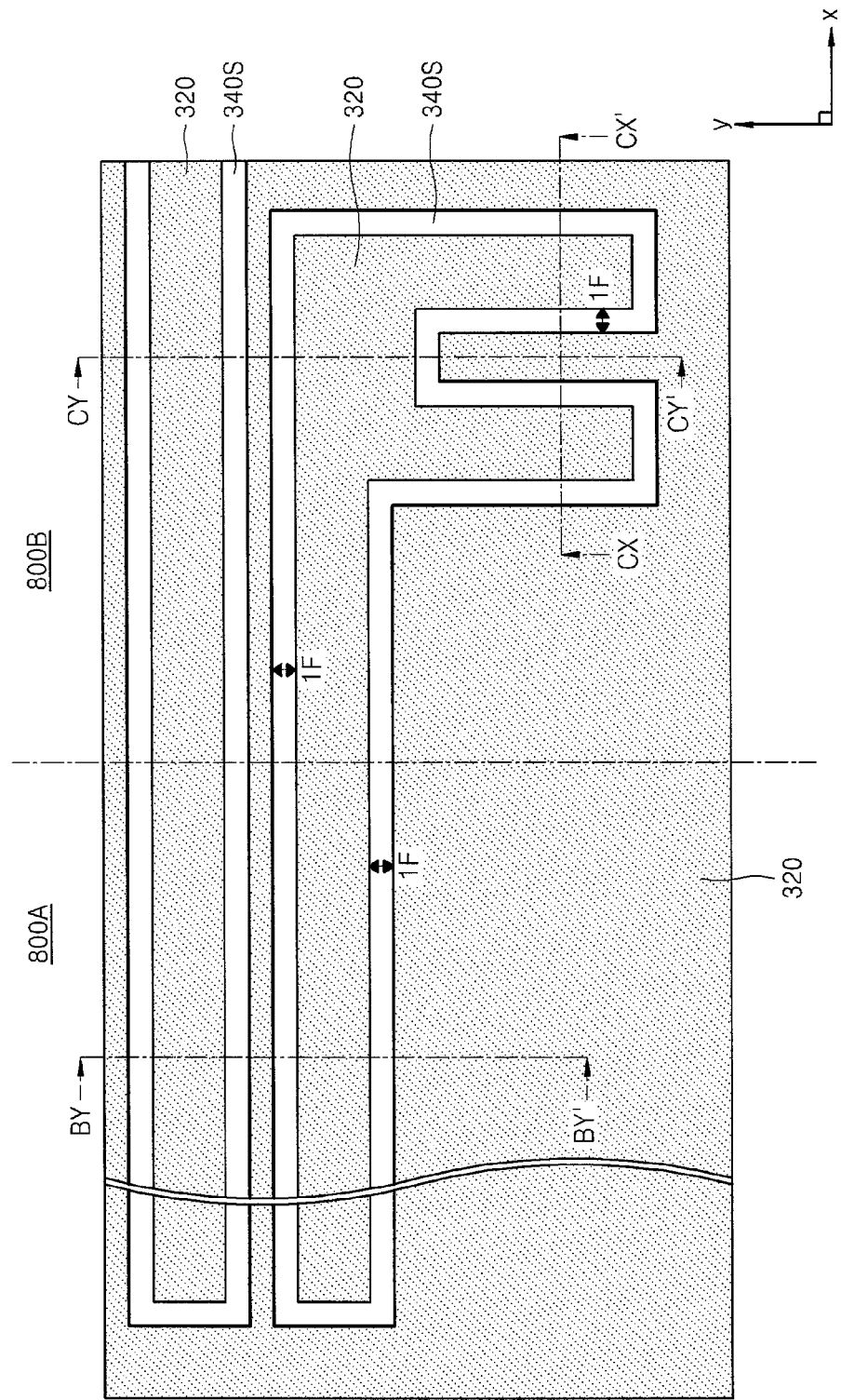
Figure 10B:
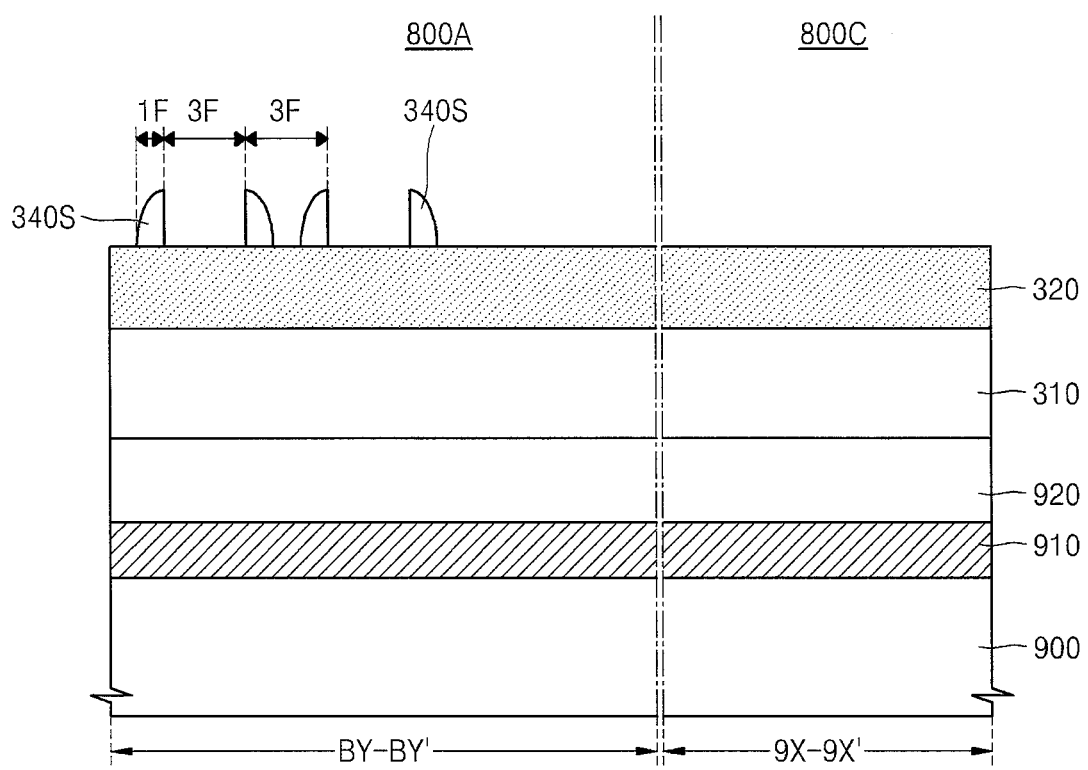
Figure 10C:
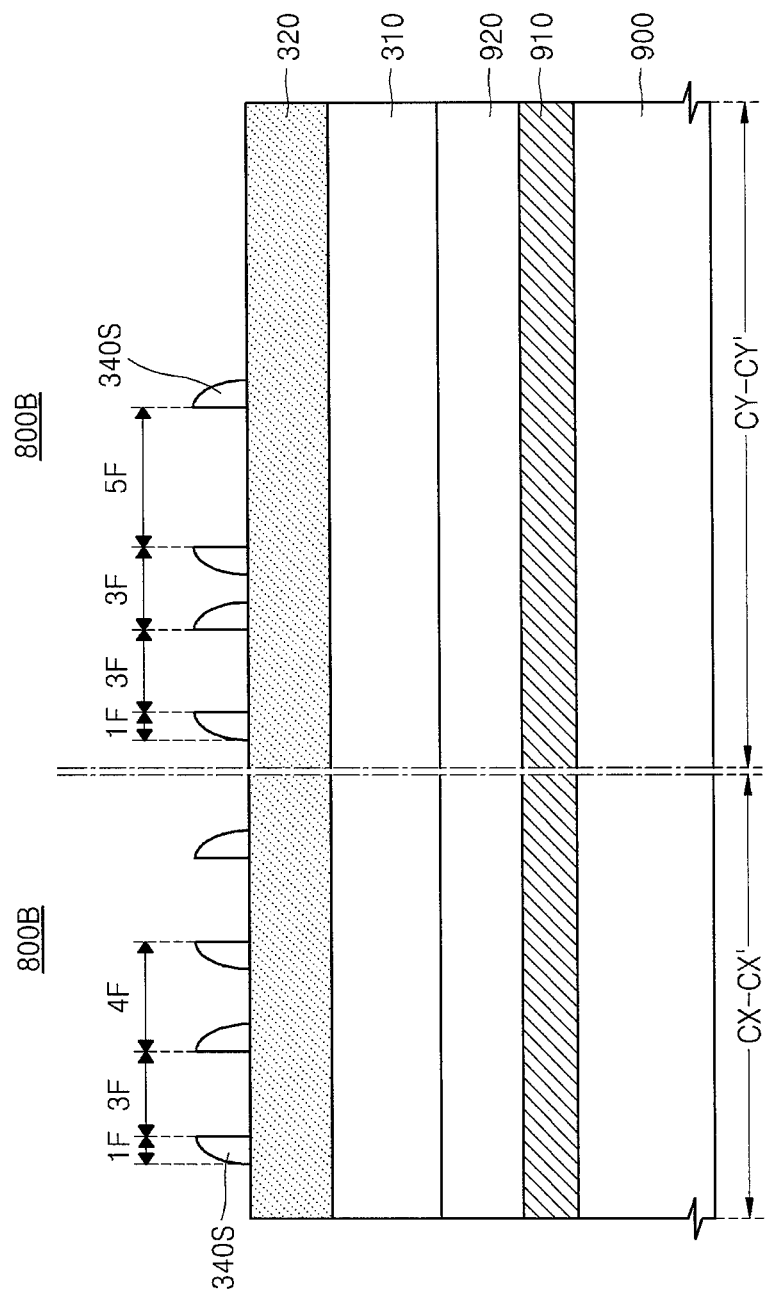

Referring to FIGS. 10A, 10B, and 10C, similarly as described above with reference to FIGS. 4B, 4C, and 4D, a spacer layer 340 is formed on exposed surfaces of the first buffer structures 930 and the first mask layer 320 in the memory cell region 800A, the connection region 800B, and the peripheral circuit region 800C. In addition, the spacer layer 340 is etched back until an upper surface of the first mask layer 320 is exposed for forming a plurality of spacers 340S at the sidewalls of the first buffer structures 930 in the memory cell region 800A and the connection region 800B. Subsequently, the first buffer structures 930 are removed.

Each of the spacers 340S has the target width of 1F, in an example embodiment of the present invention. The spacers 340S as were formed along the sidewalls of the first buffer structures 930 have a closed loop shape around the perimeter of the first buffer structures 930, in an example embodiment of the present invention.

Figure 11A:
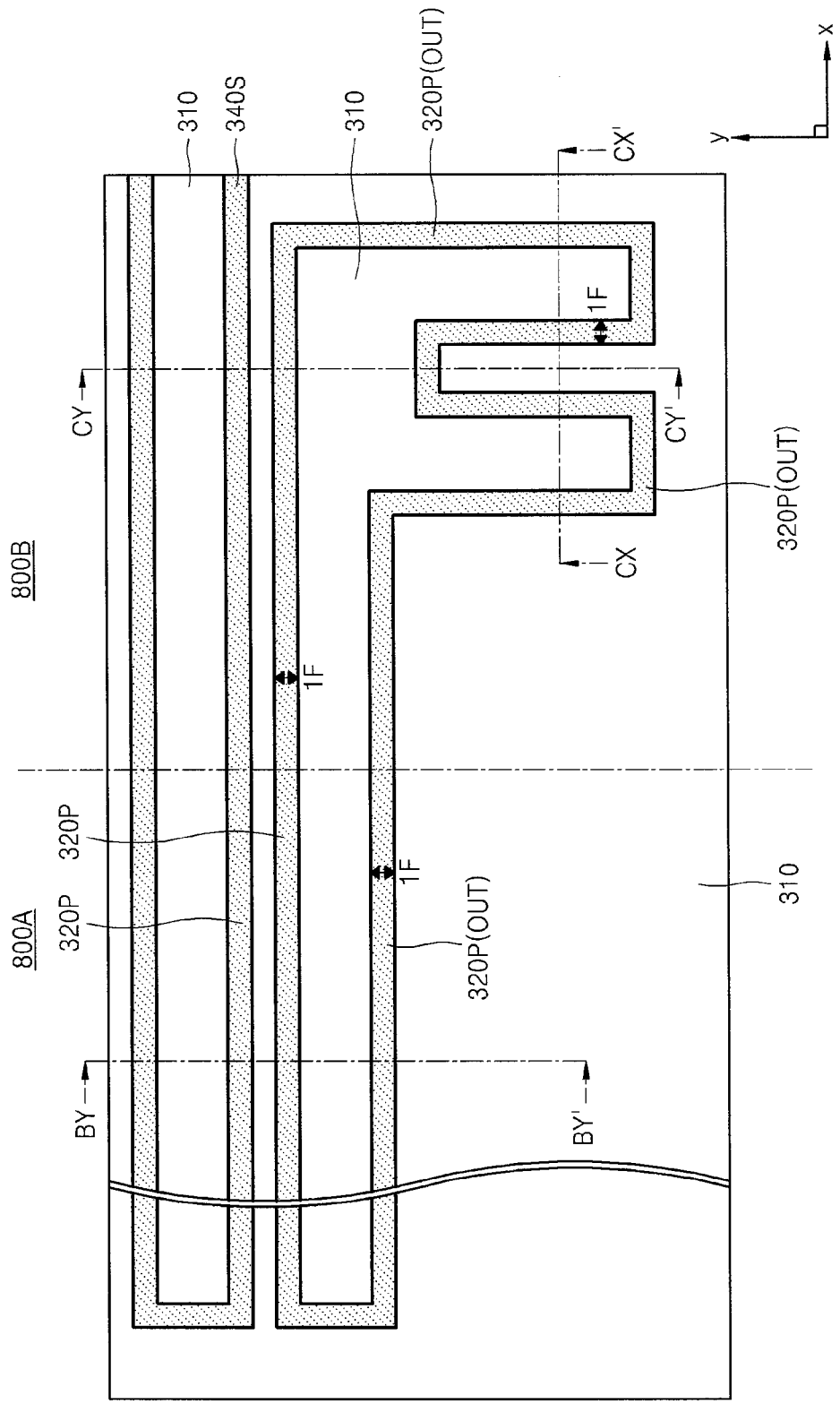
Figure 11B:
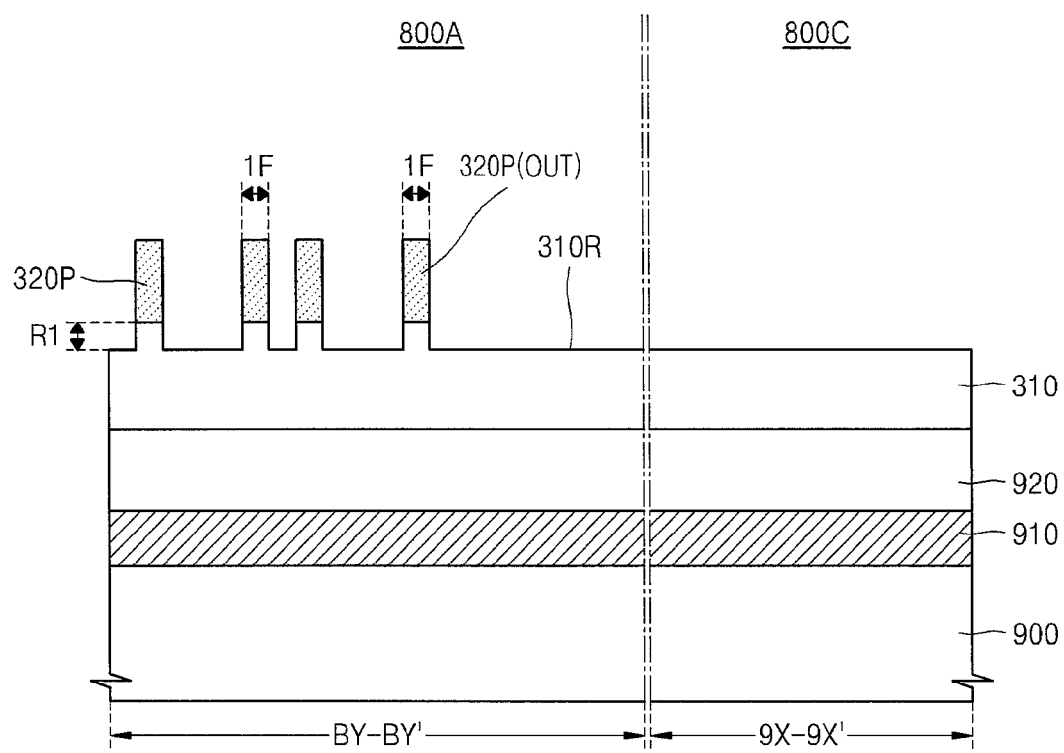
Figure 11C:
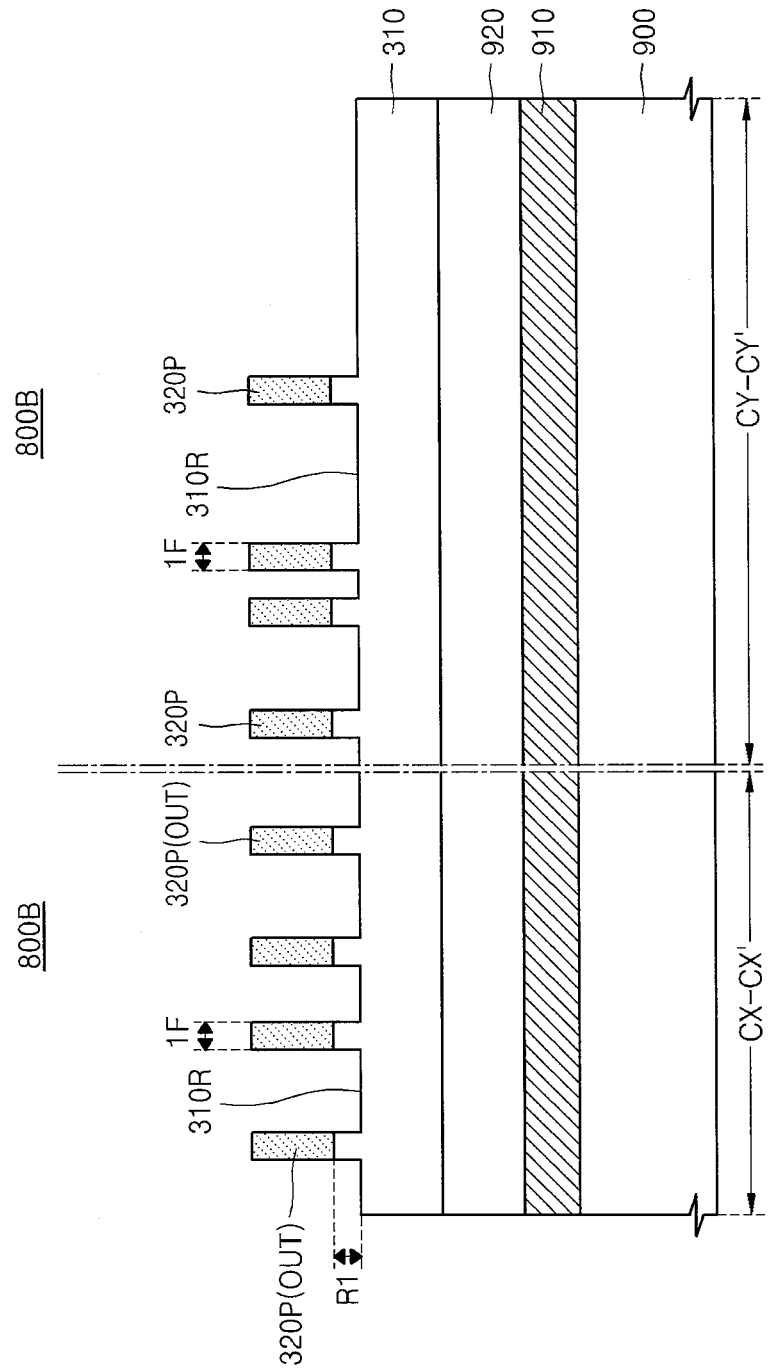

Referring to FIGS. 11A, 11B, and 11C, similarly as described above with reference to FIGS. 4E and 4F, a plurality of first mask patterns 320P are formed in the memory cell region 800A and the connection region 800B by patterning the first mask layer 320 in the memory cell region 800A, the connection region 800B, and the peripheral circuit region 800C using the spacers 340S as an etch mask. In addition, exposed portions of an upper surface of the feature layer 310 are removed by a first depth R1 to form low surfaces 310R of the feature layer 310 in the memory cell region 800A, the connection region 800B, and the peripheral circuit region 800C. The first depth R1 may be equal to the target width of 1F.

In addition, the spacers 340S remaining on the first mask patterns 320P are removed to expose upper surfaces of the first mask patterns 320P. The first mask patterns 320P form a closed loop shape along the outline of the "F" shape of the buffer structure 930. In the memory cell region 800A and the connection region 800B, the first mask patterns 320P include an outer first mask pattern 320P(OUT) corresponding to an outer portion of one memory cell block 840 (see FIG. 8).

Figure 12B:
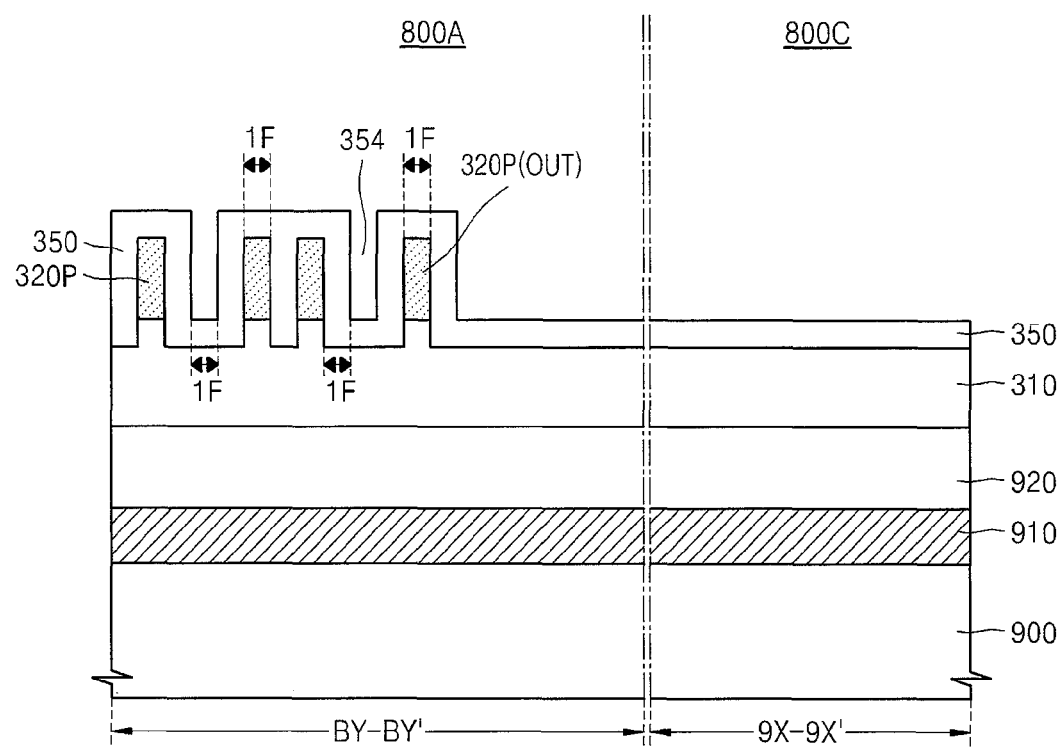
Figure 12C:
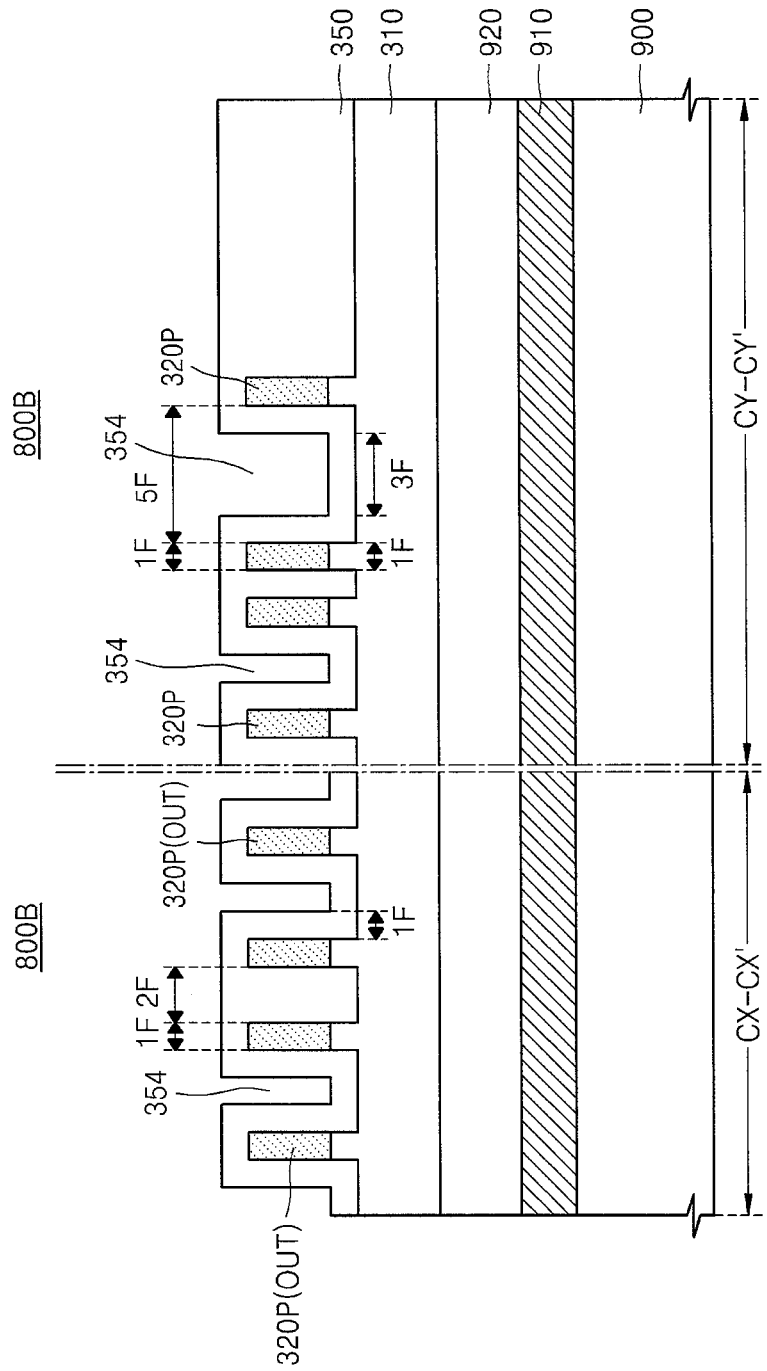

Referring to FIGS. 12A, 12B, and 12C, similarly as described above with reference to FIG. 4G, a second buffer layer 350 is formed onto exposed surfaces of the first mask patterns 320P and the low surface parts 310R of the feature layer 310 in the memory cell region 800A, the connection region 800B, and the peripheral circuit region 800C. In the memory cell region 800A and the connection region 800B, spaces between adjacent first mask patterns 320P may have various widths.

Referring to FIGS. 12A, 12B, and 12C, the widths of the spaces between the adjacent first mask patterns 320P are 1F, 2F, 3F, and 5F. If the width of the second buffer layer 350 is equal to the target width of 1F as illustrated in FIGS. 12A, 12B, and 12C, the space between adjacent first mask patterns 320P is completely filled with the second buffer layer 350 when the width of such a space is less than or equal to 2F such as 1F or 2F for example. If the width of the space between adjacent first mask patterns 320P is greater than 2F, such as 3F or 5F for example, such a space is partially filled with the second buffer layer 350 to result in a recessed space 354 in the second buffer layer 350.

If the width of the second buffer layer 350 is the target width of 1F, the recessed spaces 354 each have the target width of 1F in the memory cell region 800A, and a width of 1F or more in the connection region 800B. In FIG. 12C, each of the recessed spaces 354 has a width of 1F or 3F in the connection region 800B, but the present invention is not limited thereto. The present invention may be practiced with the recessed spaces 354 having various widths.

Figure 13A:
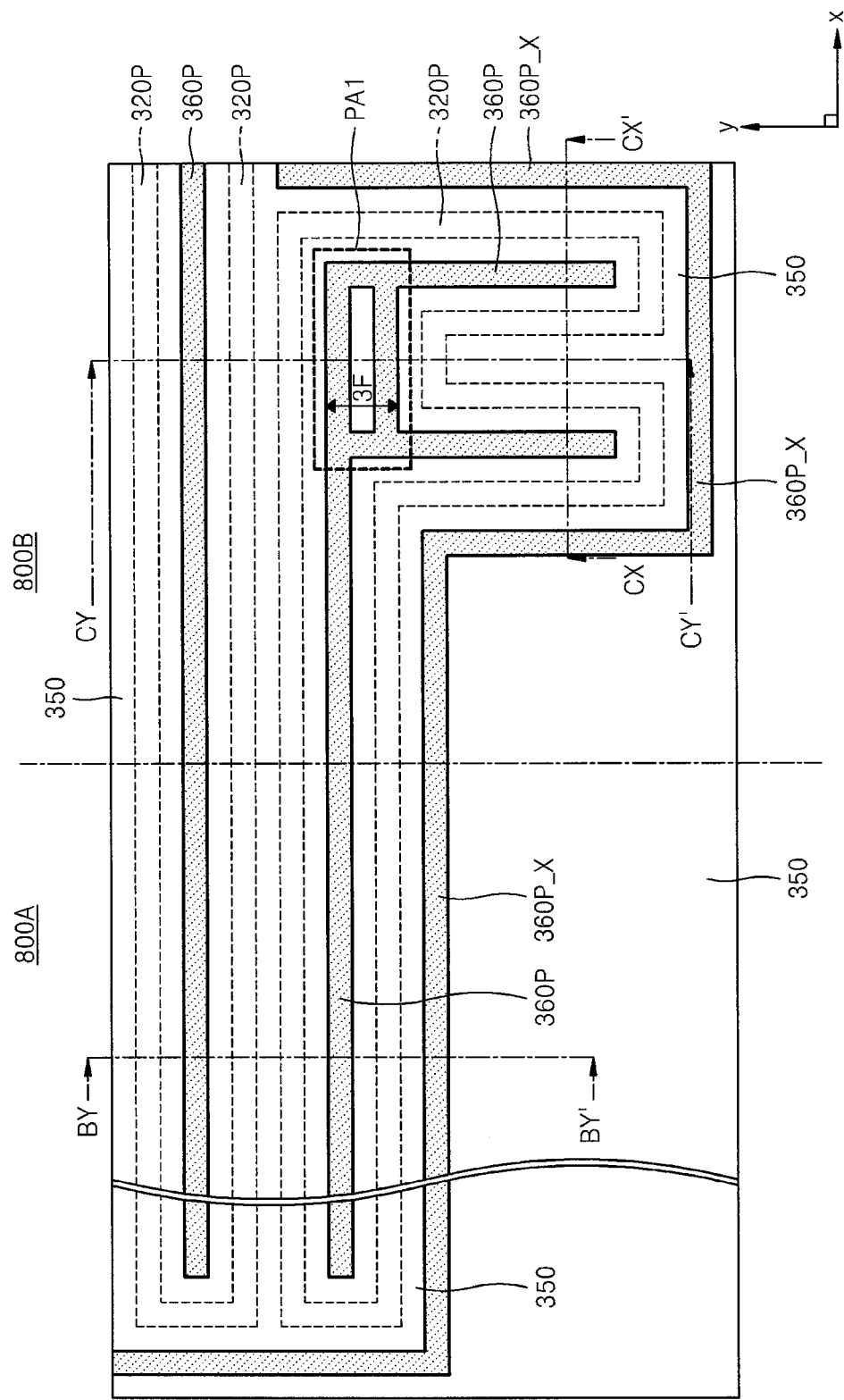
Figure 13B:
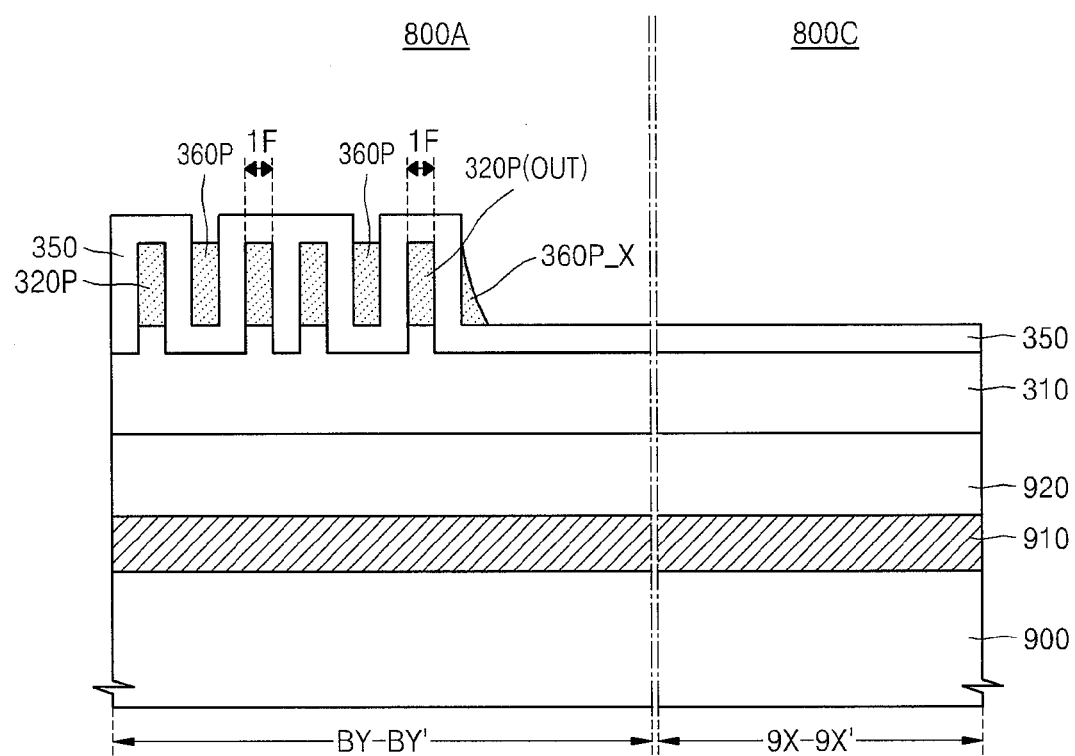
Figure 13C:
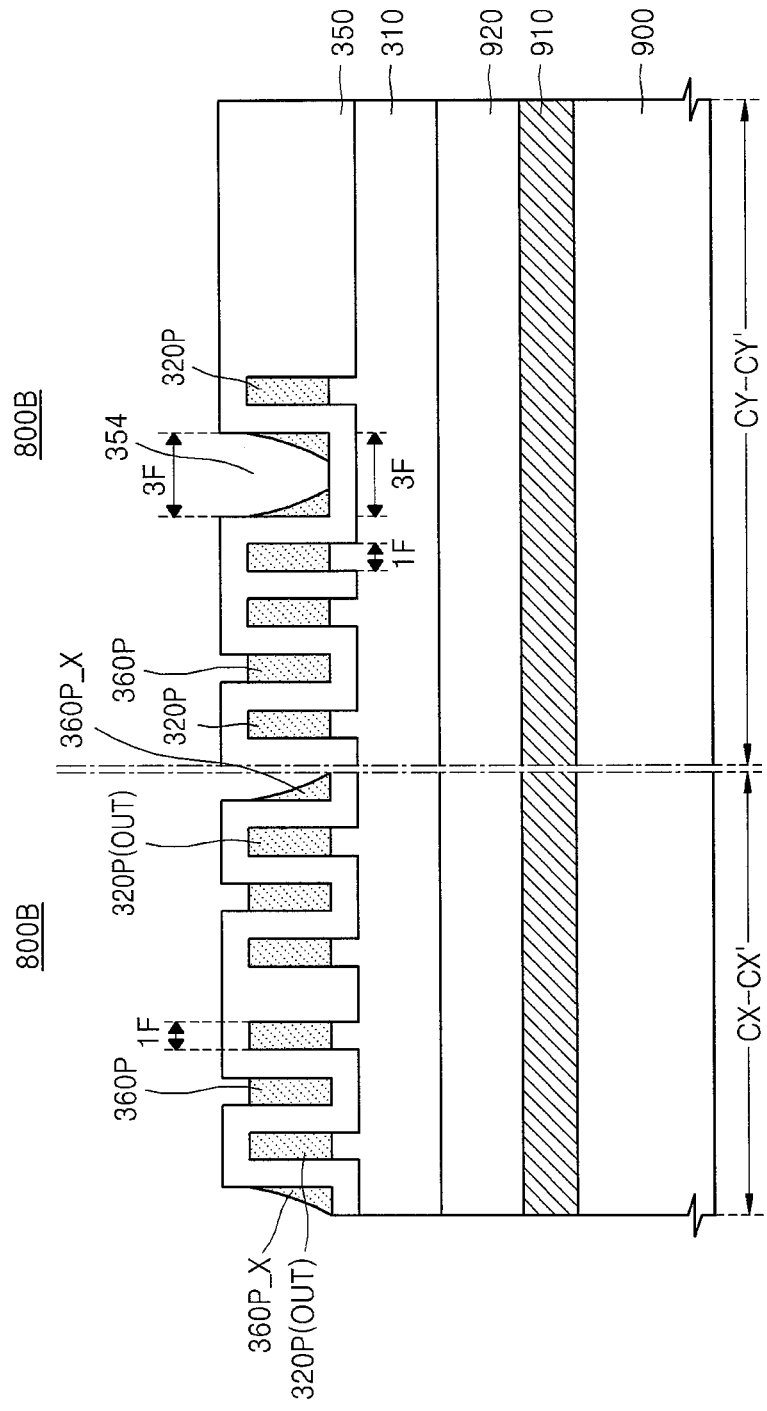

Referring to FIGS. 13A, 13B, and 13C, similarly as described above with reference to FIGS. 4H and 4I, a second mask layer 360 (similarly as in FIG. 4H) is formed on the second buffer layer 350 in the memory cell region 800A, the connection region 800B, and the peripheral circuit region 800C. The second mask layer 360 is then etched back until a top portion of the second buffer layer 350 is exposed to form a plurality of second mask patterns 360P each having a width of 1F in the recessed spaces 354.

After the second mask patterns 360P are formed, an undesired remnant 360P_X of the second mask layer 360 may be present on a sidewall of the second buffer layer 350 covering the outer first mask pattern 320P(OUT) in the memory cell region 800A and the connection region 800B. Referring to FIG. 13A, the width of the recessed space 354 in a region labeled as "PA1" is 3F along the Y-axis direction. Thus after the second mask patterns 360P are formed, the second mask patterns 360P may remain as spacers on sidewalls of the second buffer layer 350 in the recessed space 354 within the region labeled as "PA1".

Figure 14A:
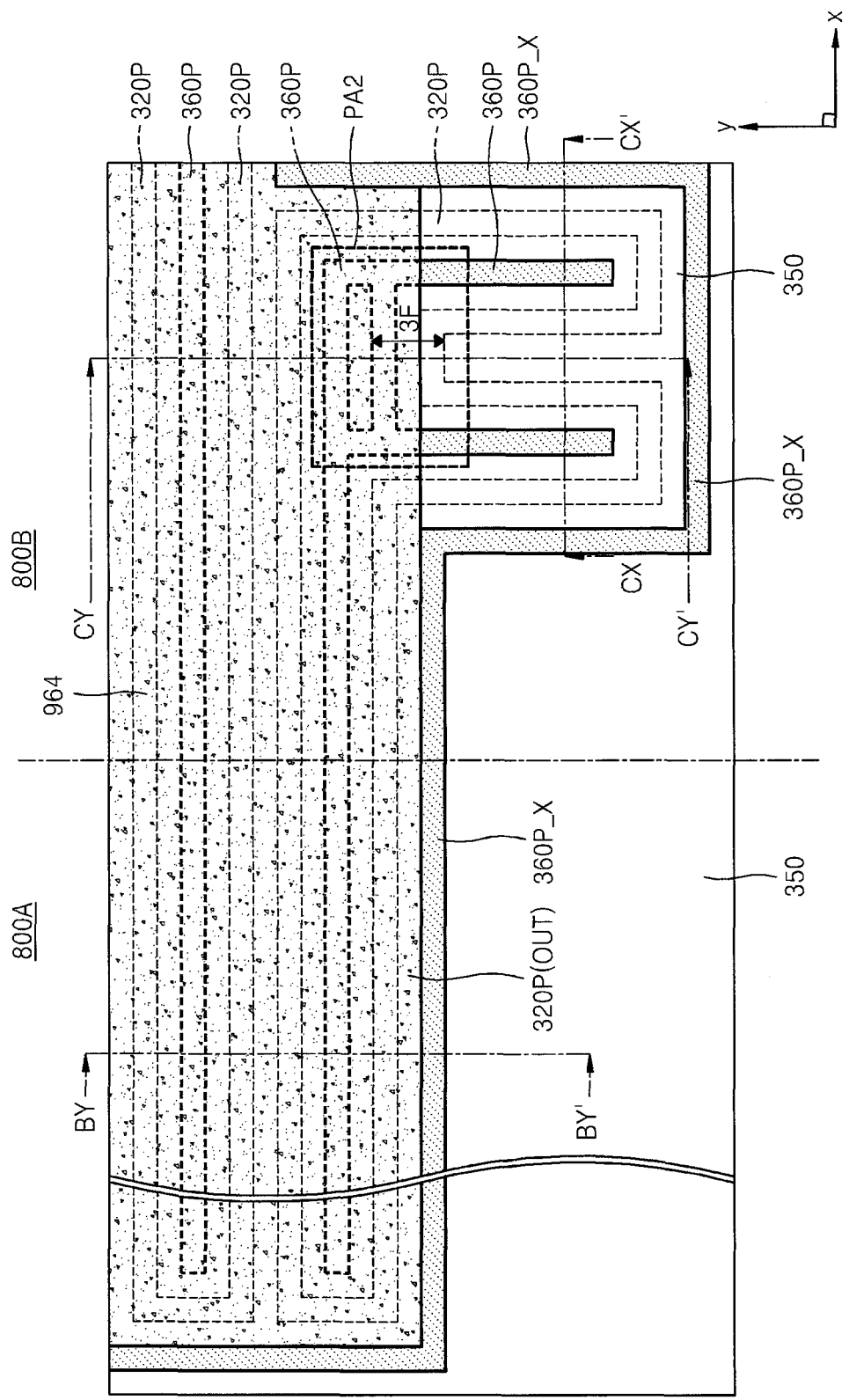
Figure 14B:
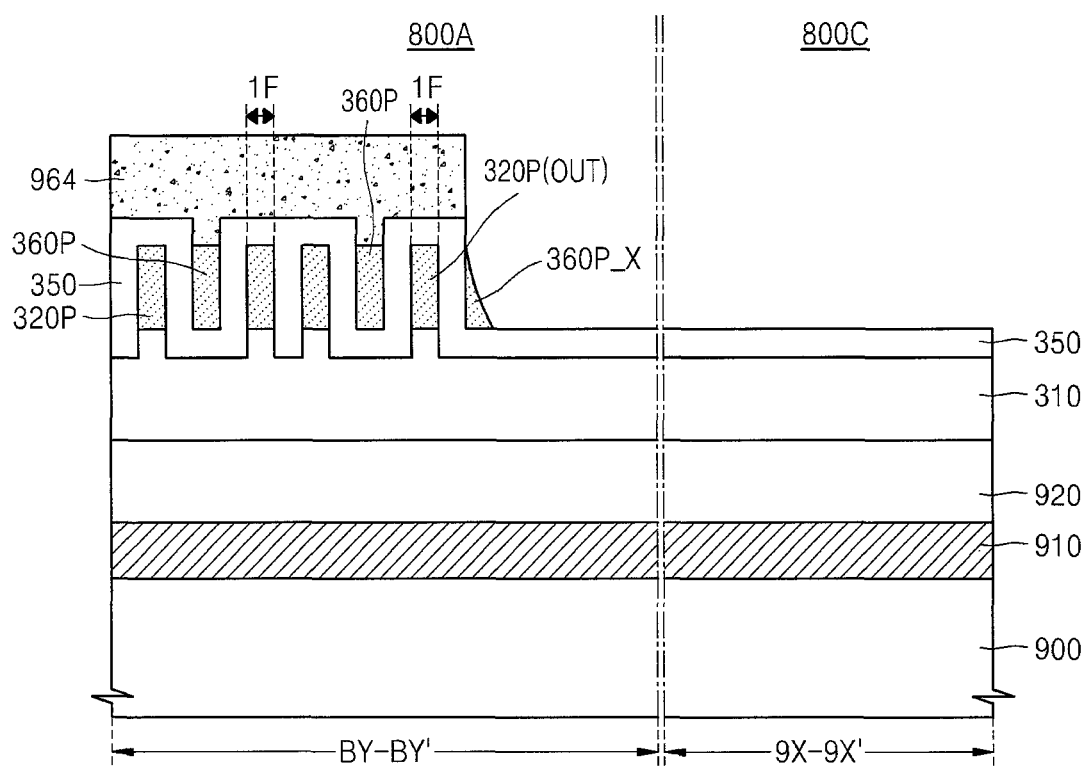
Figure 14C:
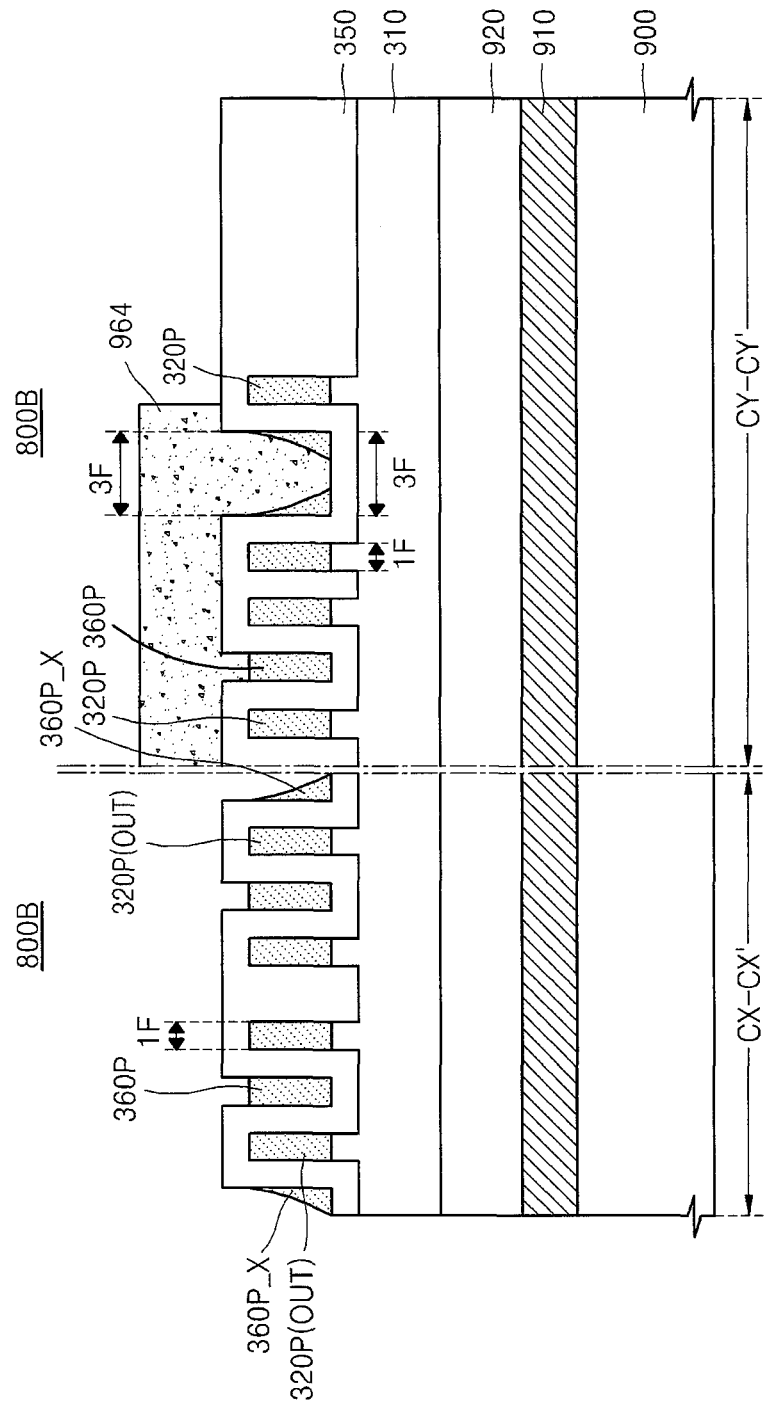

Referring to FIGS. 14A, 14B, and 14C, a third mask layer 964 is formed to expose the remnant 360P_X in the memory cell region 800A and the connection region 800B. The third mask layer 964 is formed with portions of the second mask patterns 360P that are desired to be removed not being under the third mask layer 964 such as in the connection region 800B. The third mask layer 964 is a photoresist pattern, in an example embodiment of the present invention.

The third mask layer 964 is desired to be aligned precisely so that in the connection region 800B only the undesired parts of the second mask patterns 360P and the remnant 360P_X are selectively removed. According to an embodiment of the present invention, the width DF22 of FIG. 9A provides sufficient process margin such that the third mask layer 964 is easily aligned with the connection region 800B. In particular, as illustrated in the region labeled as "PA2" in FIG. 14A, the third mask layer 964 is aligned with the second mask patterns 360P with an alignment margin of at least 3F in the connection region 800B.

Figure 15A:
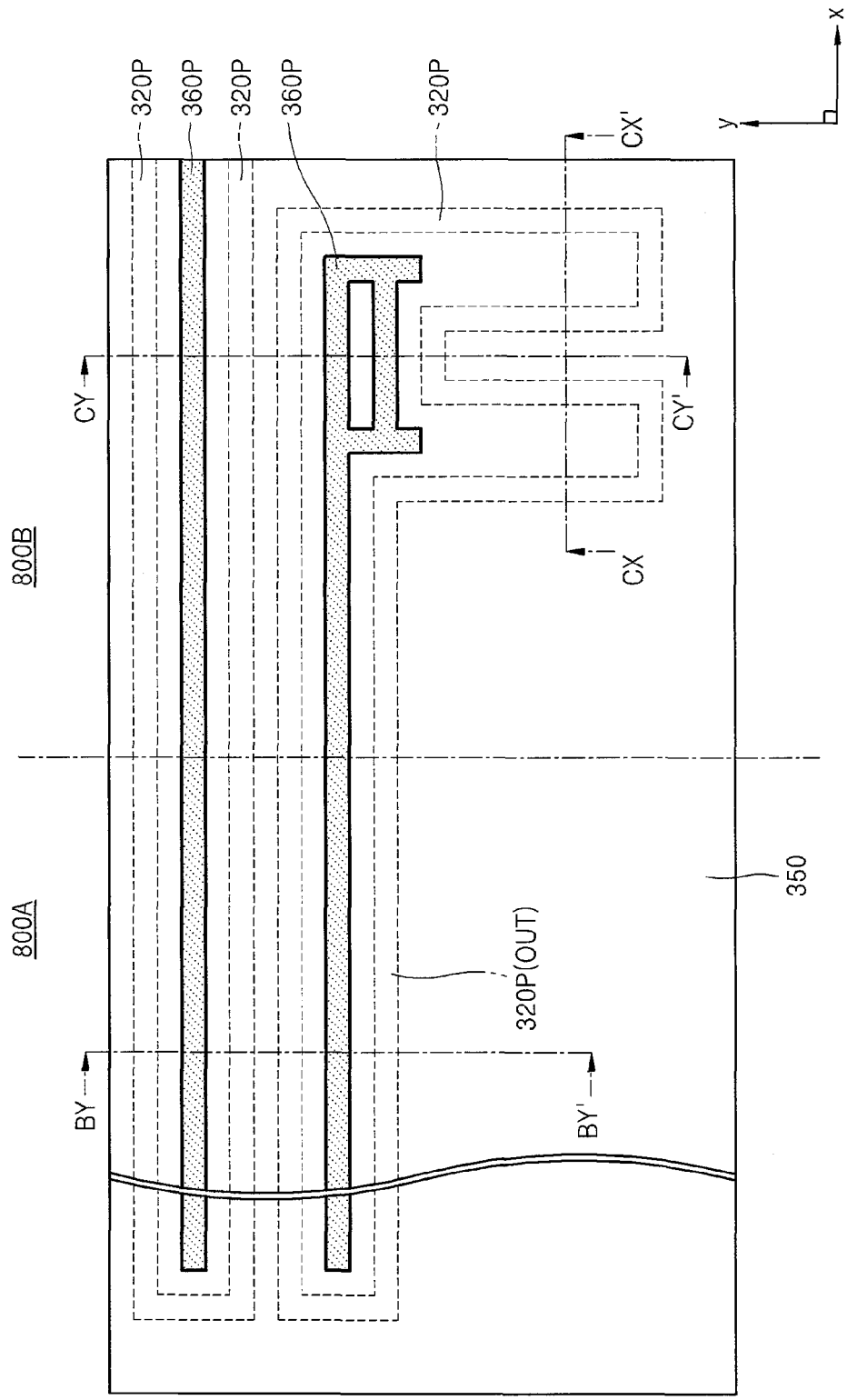
Figure 15B:
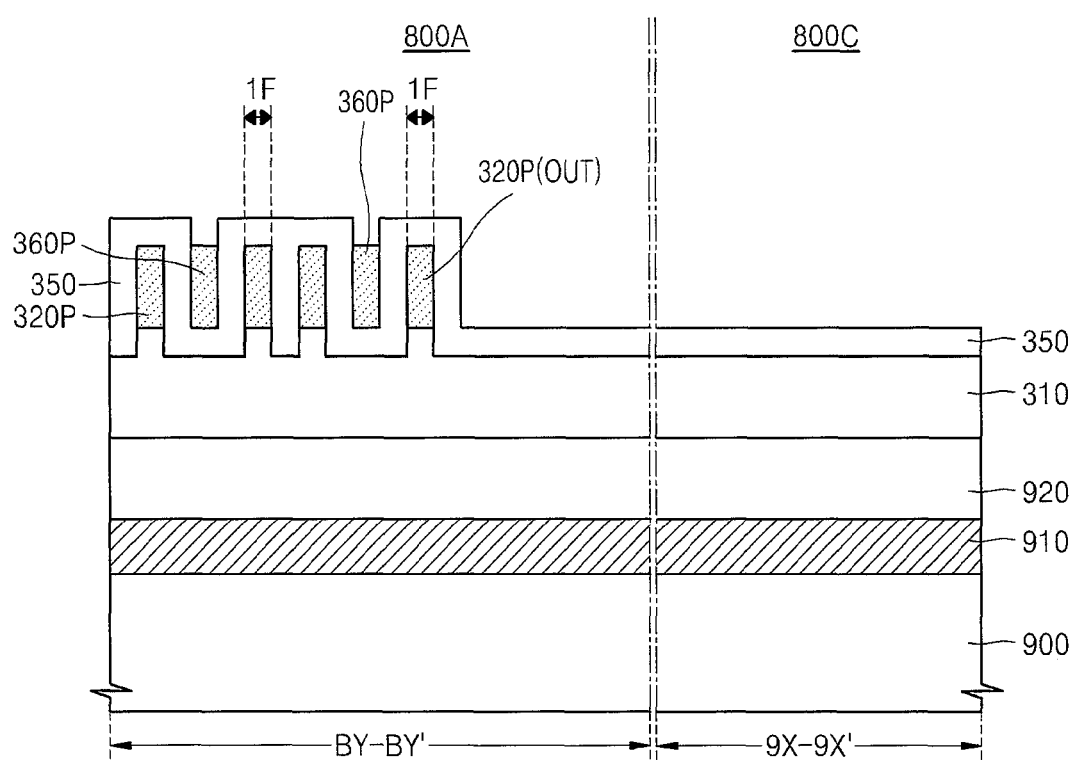
Figure 15C:
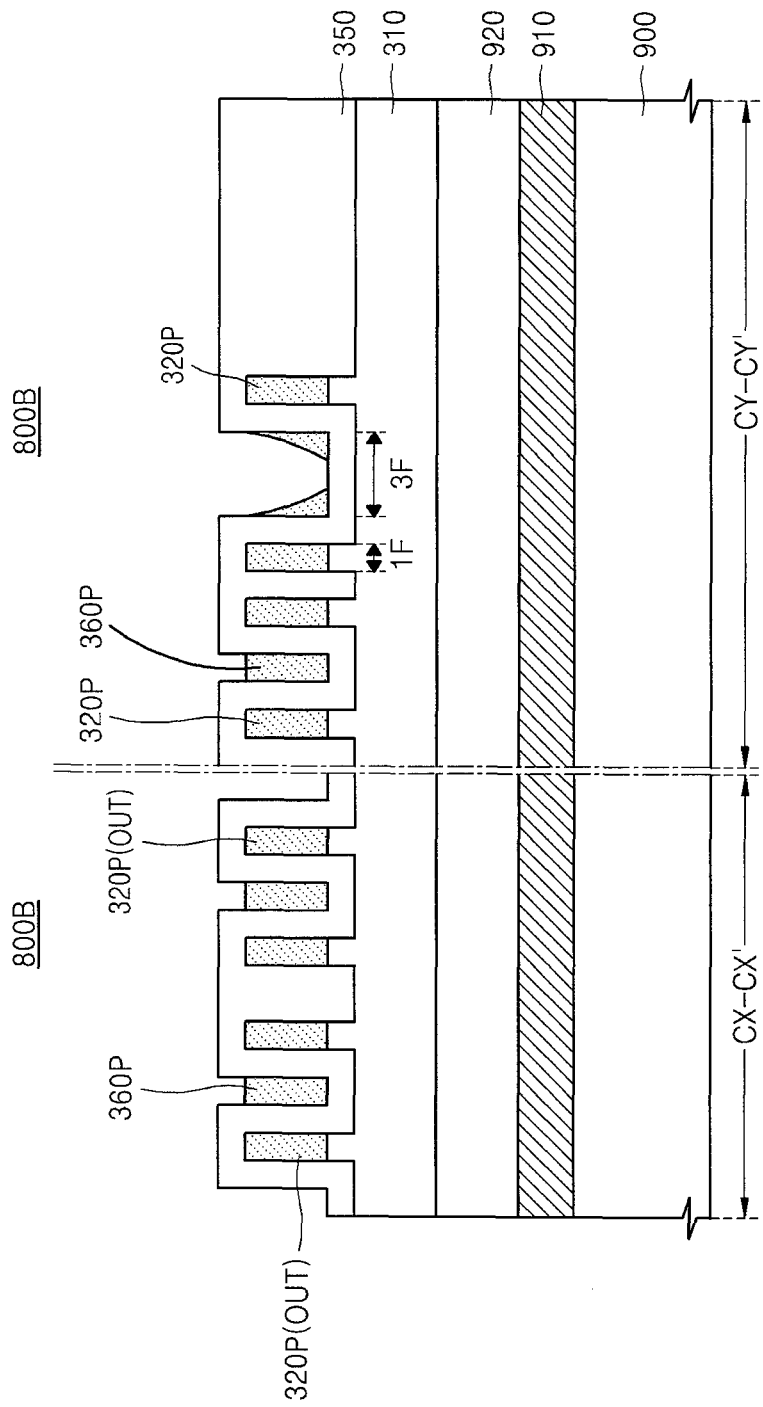

Referring to FIGS. 15A, 15B, and 15C, the remnant 360P_X and exposed portions of the second mask patterns 360P are etched away using the third mask layer 964 and the second buffer layer 350 as an etch mask. Isotropic wet or dry etching may be used to remove the exposed remnant 360P_X and the exposed portions of the second mask patterns 360P. After the remnant 360P_X is removed, the sidewall of the second buffer layer 350 covering the outer first mask pattern 320P(OUT) is exposed. Thereafter, the third mask layer 964 is removed.

Figure 16A:
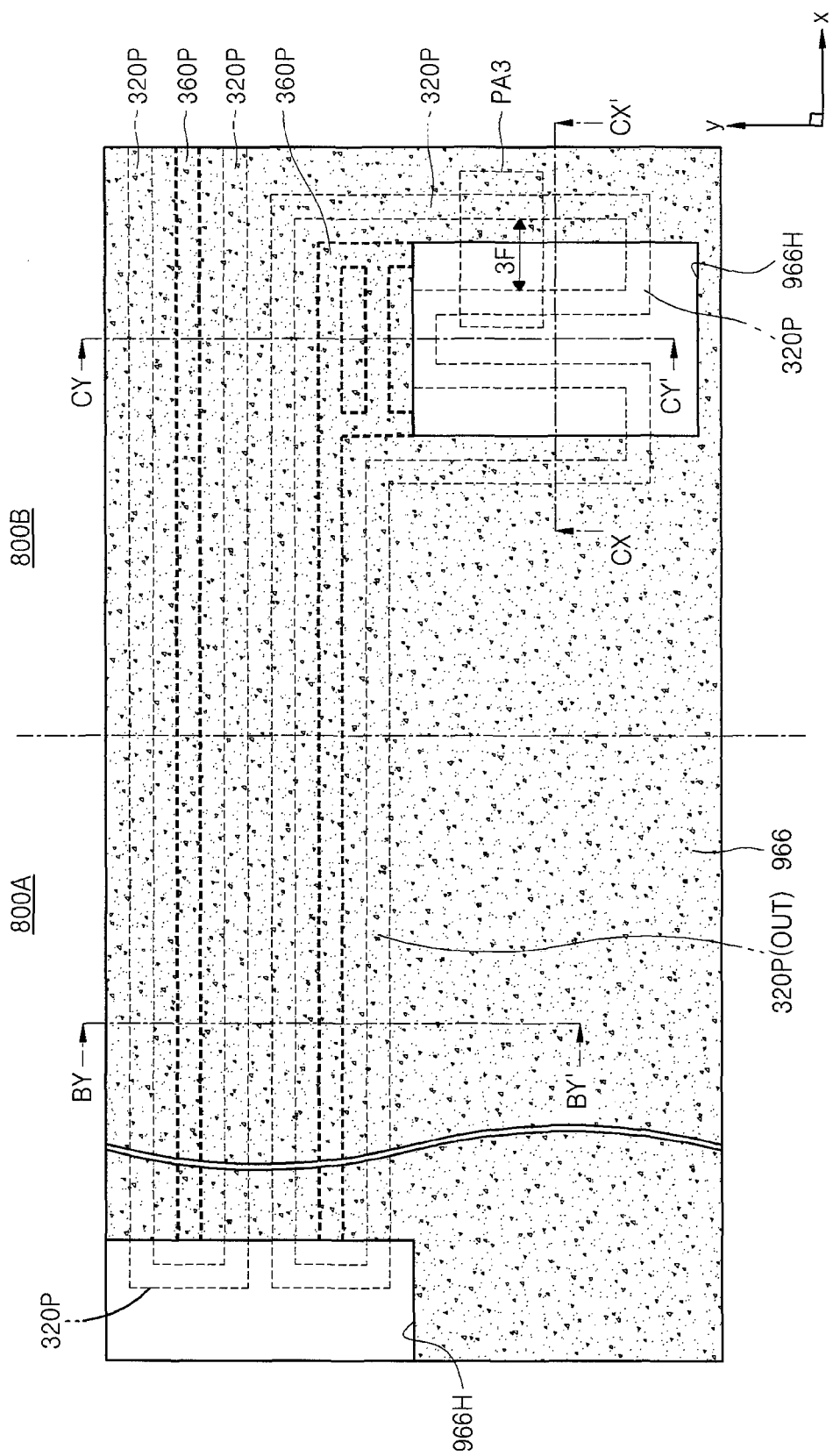
Figure 16B:
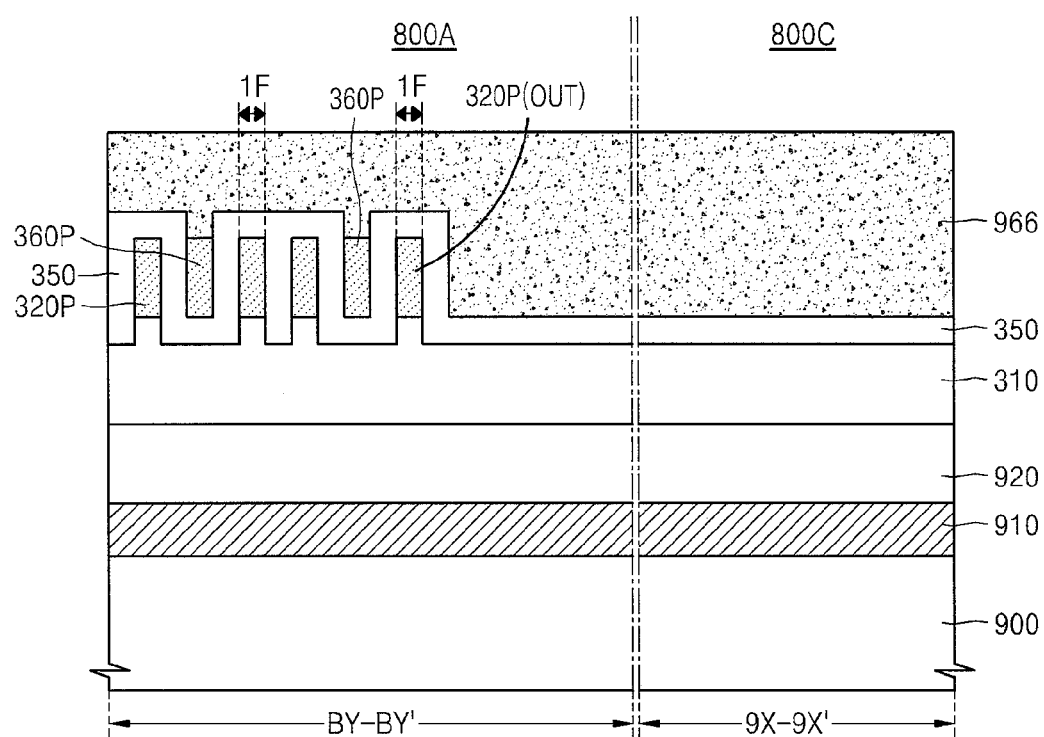
Figure 16C:
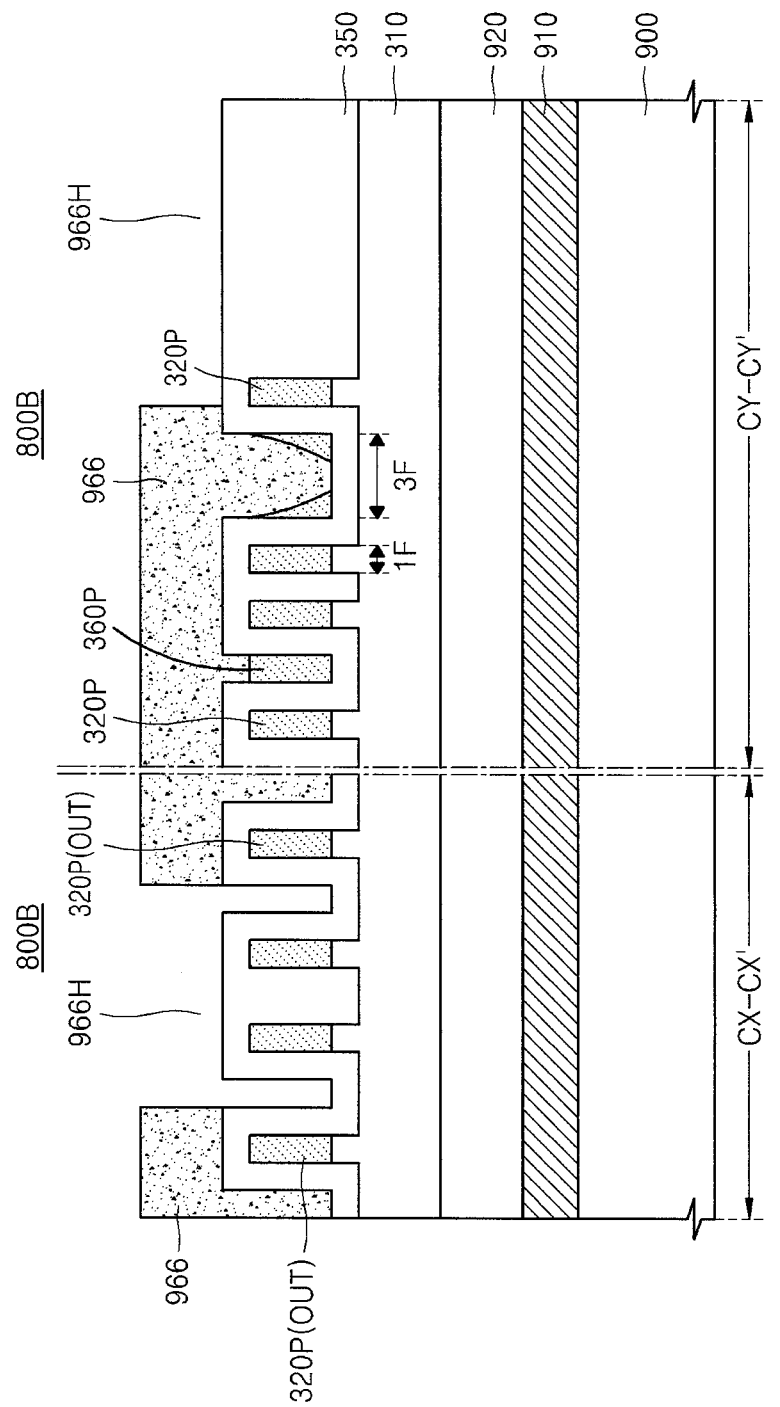

Referring to FIGS. 16A, 16B, and 16C, a trimming mask pattern 966 having a plurality of apertures 966H is formed on the second buffer layer 350 in the memory cell region 800A, the connection region 800B, and the peripheral circuit region 800C. Parts of the second buffer layer 350 covering portions of the first mask patterns 320P that are to be removed are exposed via the apertures 966H in the memory cell region 800A and the connection region 800B.

The trimming mask pattern 966 is desired to be aligned precisely such that only undesired parts of the first and second mask patterns 320P and 360P are selectively removed in the connection region 800B. According to an embodiment of the present invention, the apertures 966H in the connection region 800B are easily aligned with the first mask patterns 320P to be removed with a sufficient alignment margin.

In particular, as illustrated in a region labeled as "PA3" in FIG. 16A, the apertures 966H are aligned with the first mask patterns 320P in the connection region 800B with an alignment margin of at least 3F. The trimming mask pattern 966 is a photoresist pattern, according to an embodiment of the present invention.

Figure 17A:
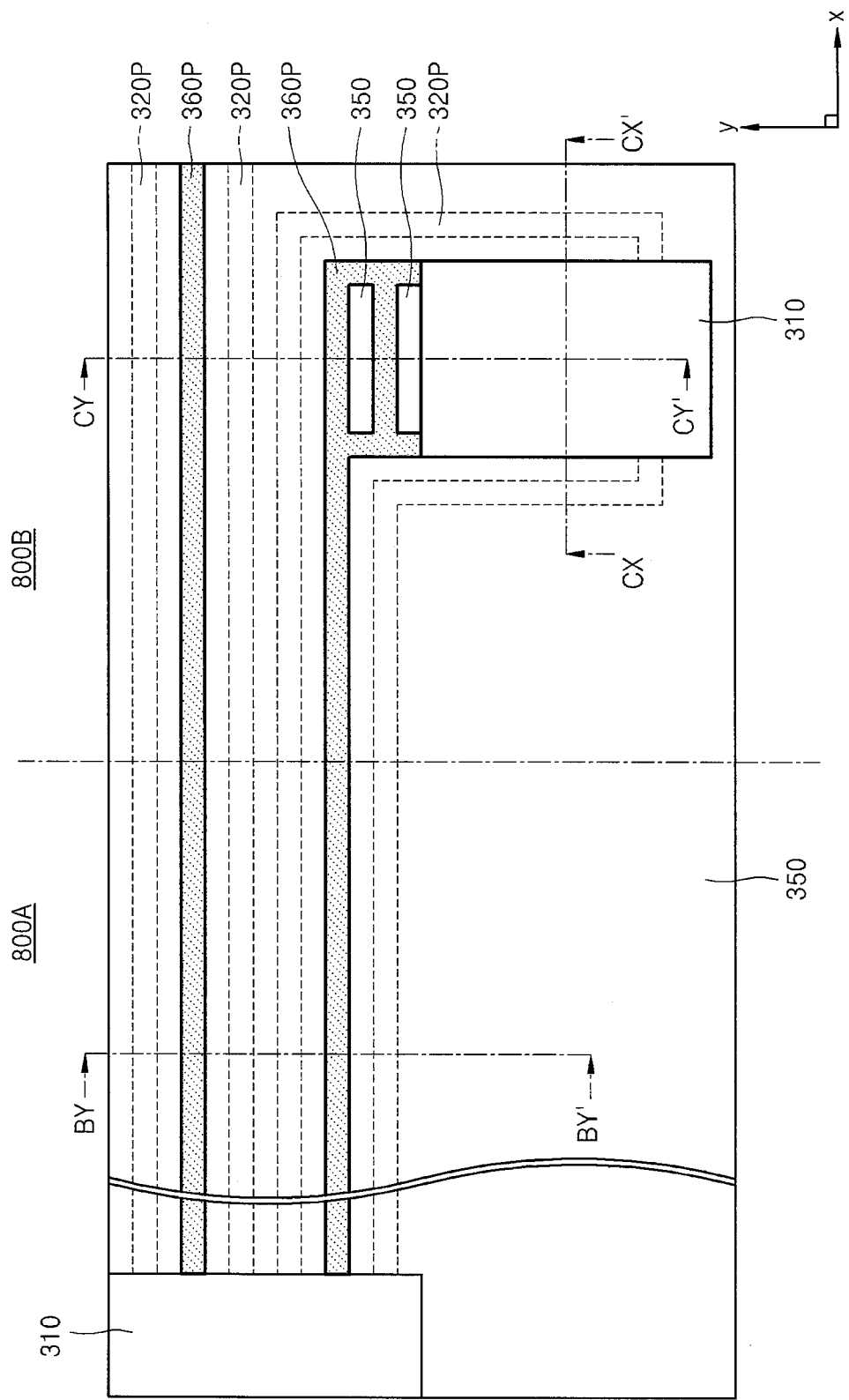
Figure 17B:
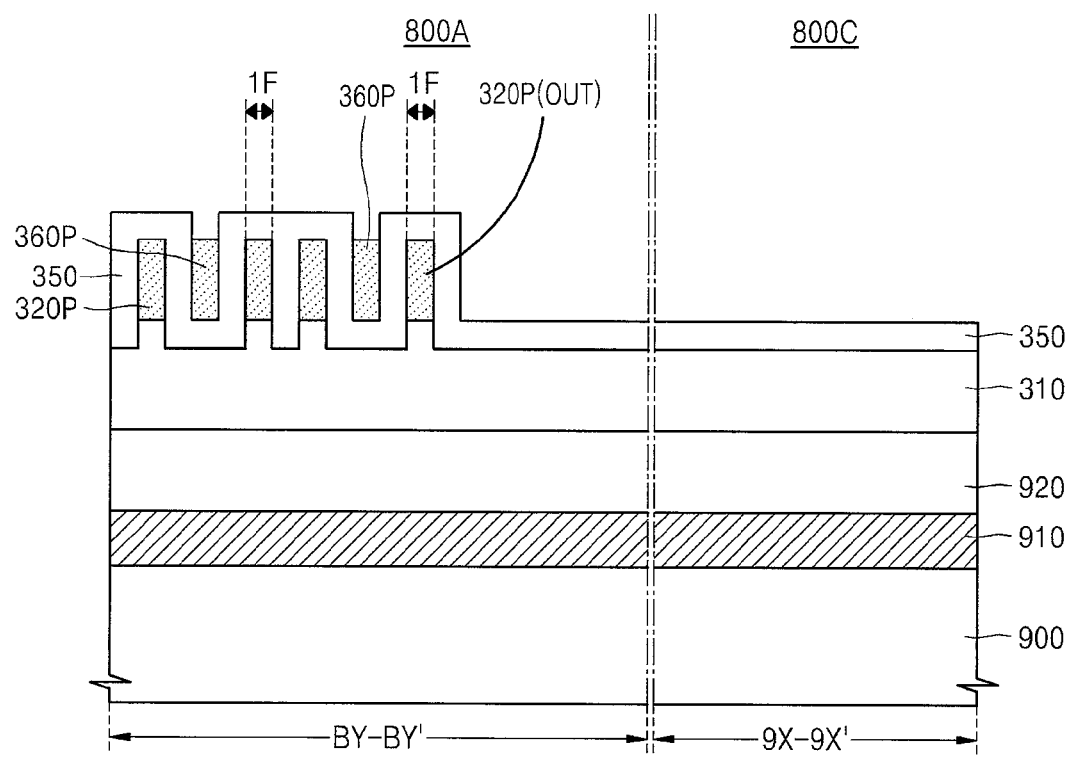
Figure 17C:
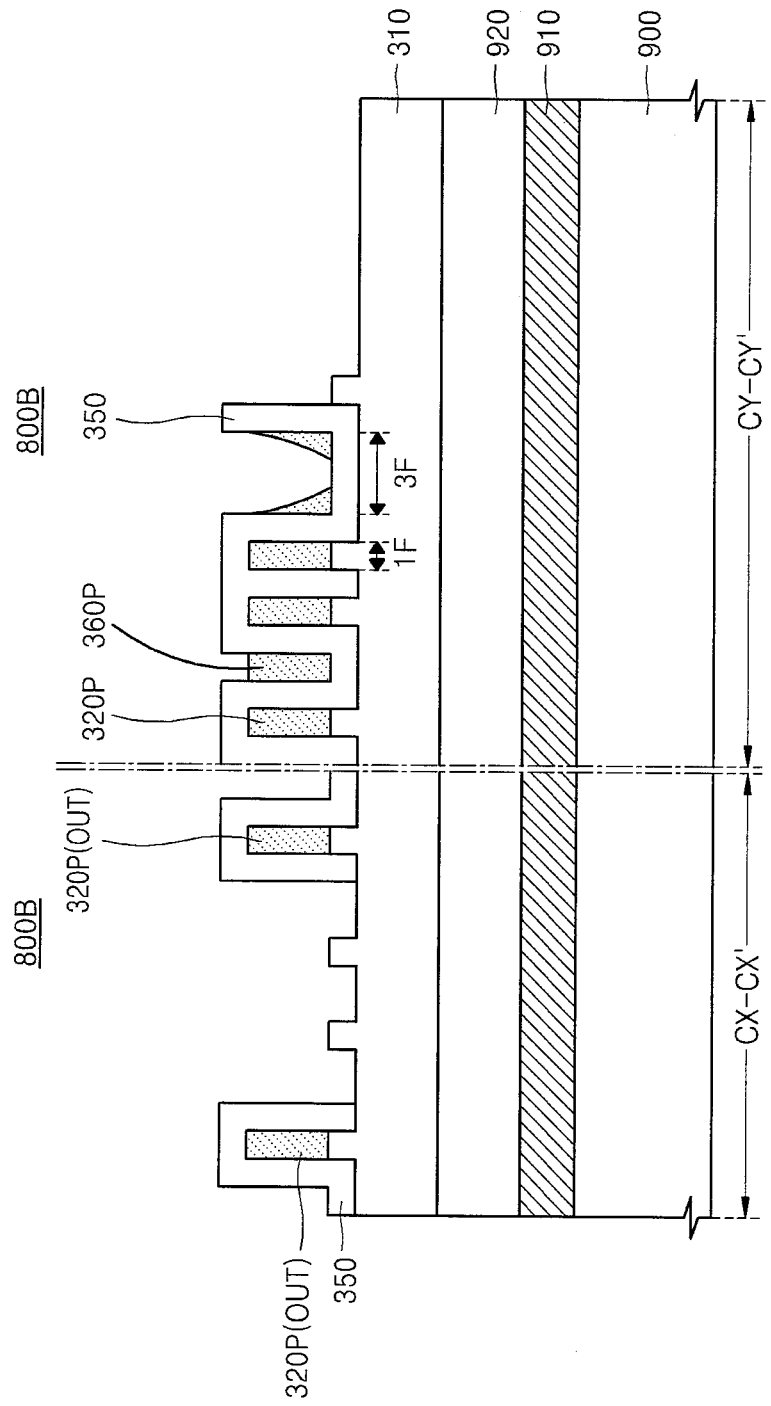

Referring to FIGS. 17A, 17B, and 17C, a trimming process is performed by etching away portions of the second buffer layer 350 and the first mask patterns 320P not under the trimming mask pattern 966 in the memory cell region 800A and the connection region 800B. Accordingly, the first mask patterns 320P that were connected to form a closed loop shape are divided into two parts in the memory cell region 800A and the connection region 800B. Subsequently, the trimming mask pattern 966 is removed.

Figure 18A:
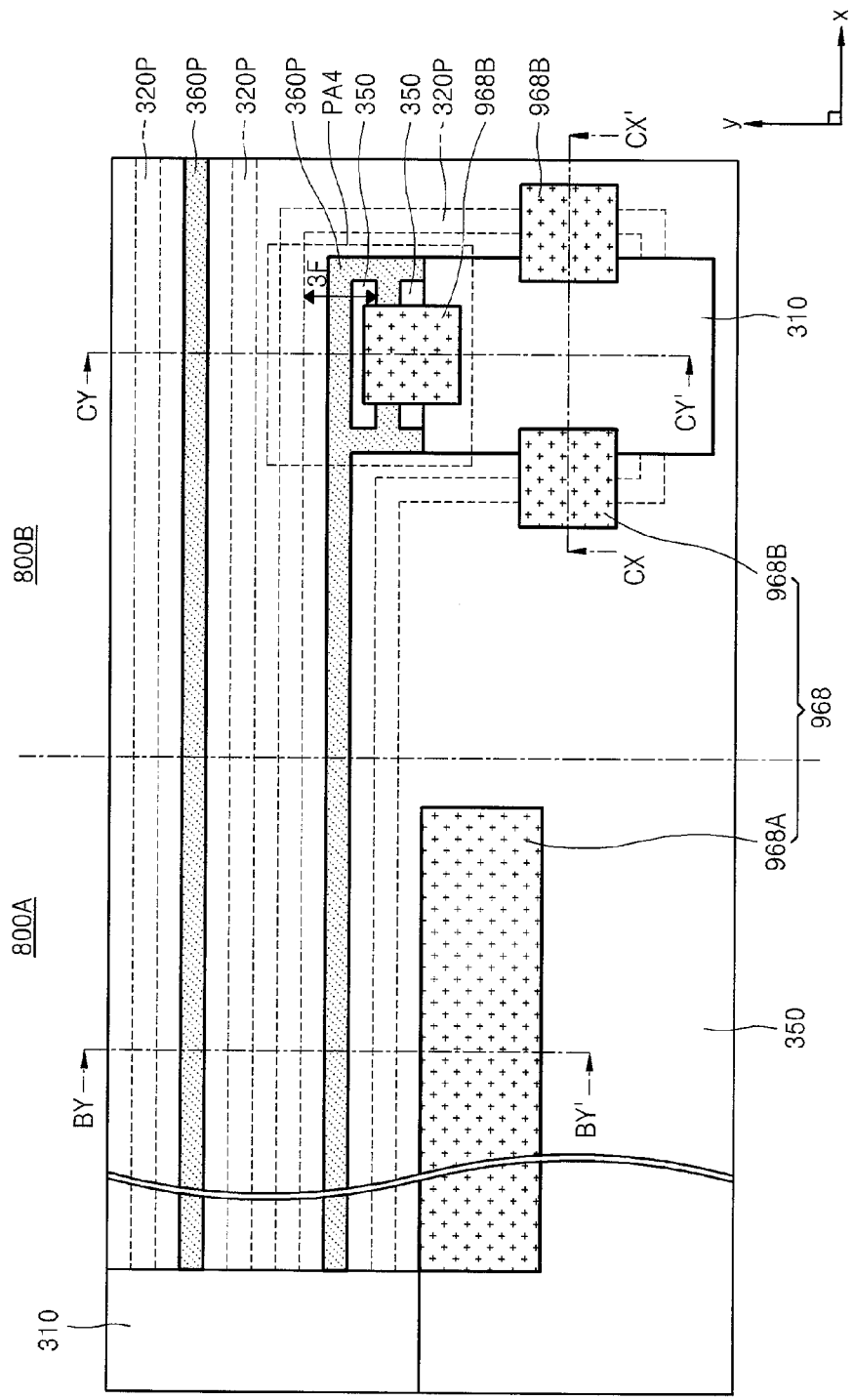
Figure 18B:
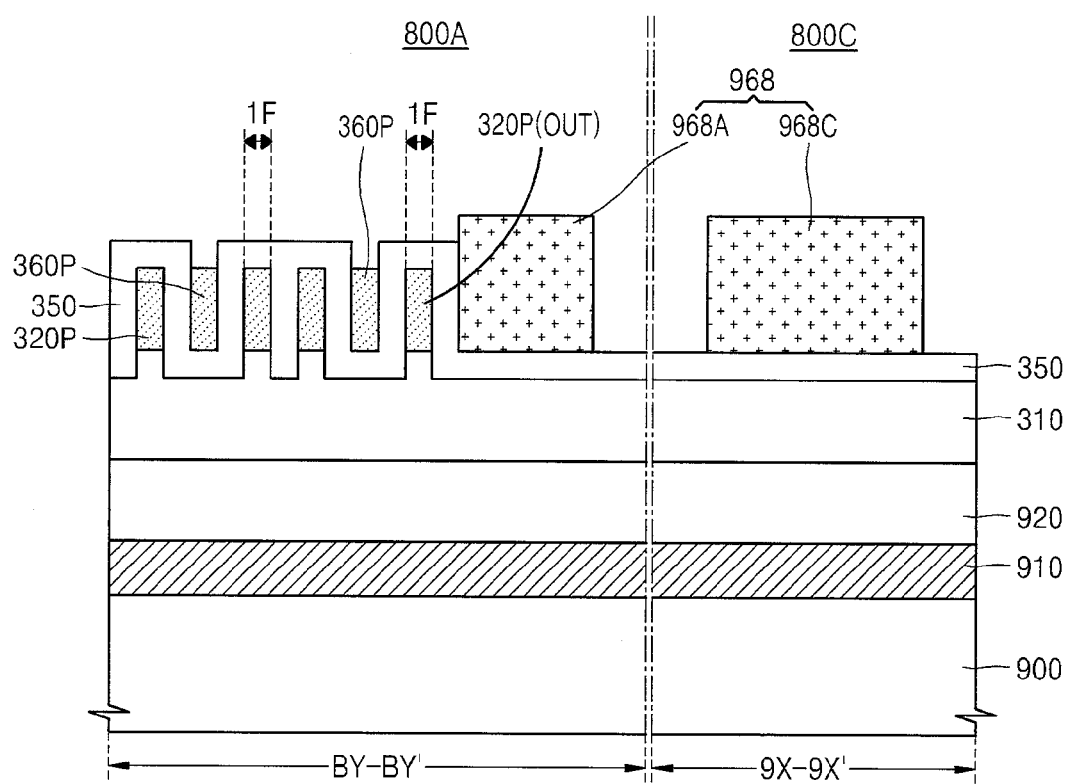

Referring to FIGS. 18A, 18B, and 18C, a plurality of wide mask patterns 968 are formed in the memory cell region 800A, the connection region 800B, and the peripheral circuit region 800C, similarly as the fourth mask pattern 366P described above with reference to FIGS. 4K and 4L. The wide mask patterns 968 include a first wide mask pattern 968A, a plurality of second wide mask patterns 968B, and a third wide mask pattern 968C.

The first wide mask pattern 968A is formed on the second buffer layer 350 in the memory cell region 800A adjacent to the outer first mask pattern 320P(OUT) and parallel with the first mask patterns 320P. The second wide mask patterns 968B are formed on the first and second mask patterns 320P and 360P in the connection region 800B. The third wide mask pattern 968C is formed on the second buffer layer 350 in the peripheral circuit region 800C.

The first wide mask pattern 968A is an etch mask for forming the ground selection line GSL of FIG. 8 with a relatively wide width in the memory cell region 800A. Although not shown, a respective wide mask pattern may also be formed in the memory cell region 800A for the string selection line SSL of FIG. 8. The second wide mask patterns 968B are also an etch mask for forming the contact pads 818, 828, and 838 of FIG. 8 in the connection region 800B. The third wide mask pattern 968C is an etch mask pattern for forming the peripheral circuit conductive pattern 870 of FIG. 8 in the peripheral circuit region 800C.

For preventing short-circuiting of the contact pads 818, 828, and 838 within a limited space, a sufficient process margin is desired between the second wide mask patterns 968B. Thus, the distance DF21 and the width DF22 in FIG. 9A are sufficient for providing the desired process margin. In particular, as illustrated by a region labeled as "PA4" in FIG. 18A, the second wide mask pattern 968 is formed to be easily aligned with the second mask patterns 360P with a process margin of at least 3F between the adjacent first and second mask patterns 320P and 360P.

The wide mask patterns 968 are comprised of a material having a different etch selectivity from the second buffer layer 350 and the feature layer 310. For example, the wide mask patterns 968 are comprised of an spin-on hardmask (SOH) material.

Figure 19A:
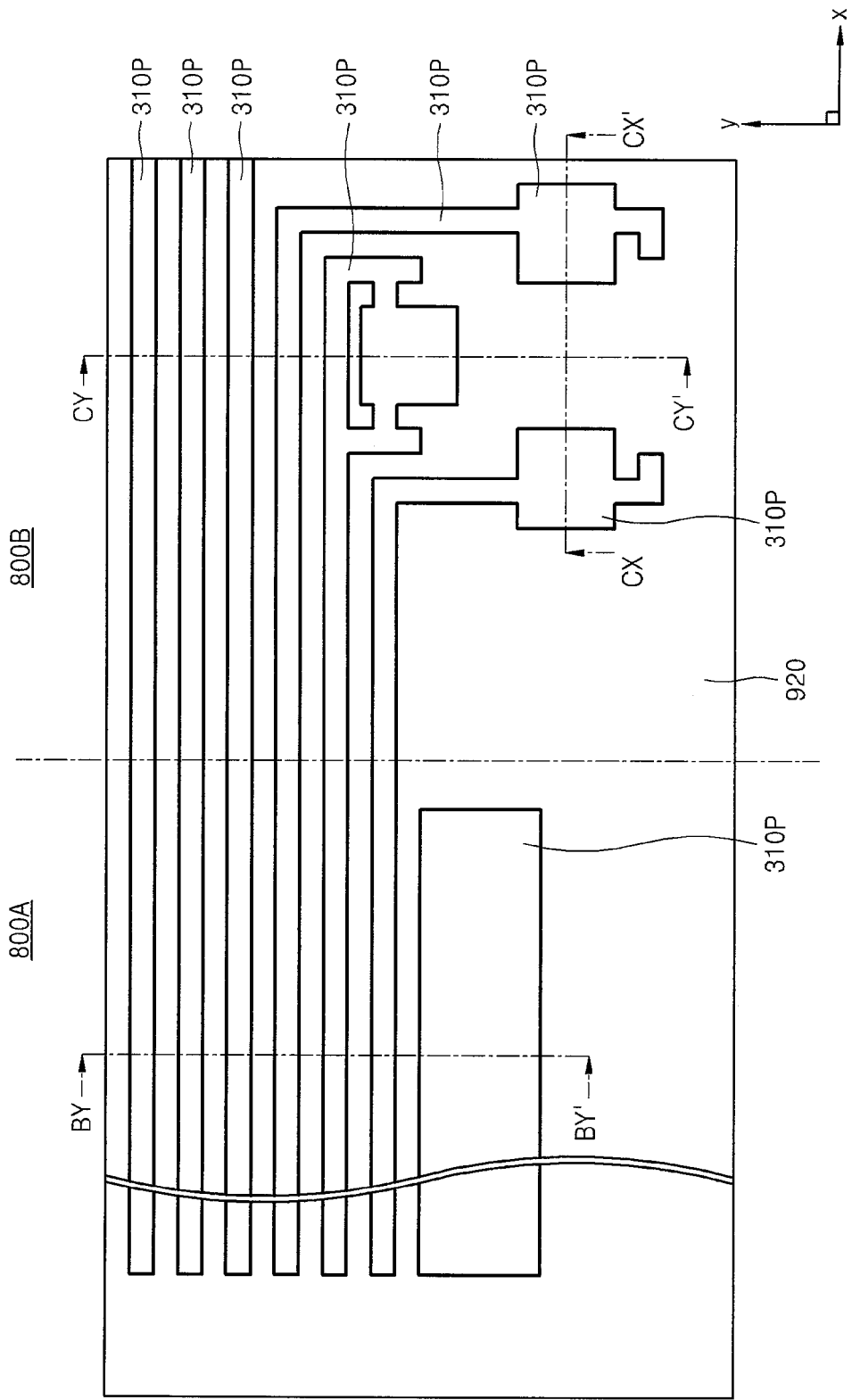
Figure 19B:
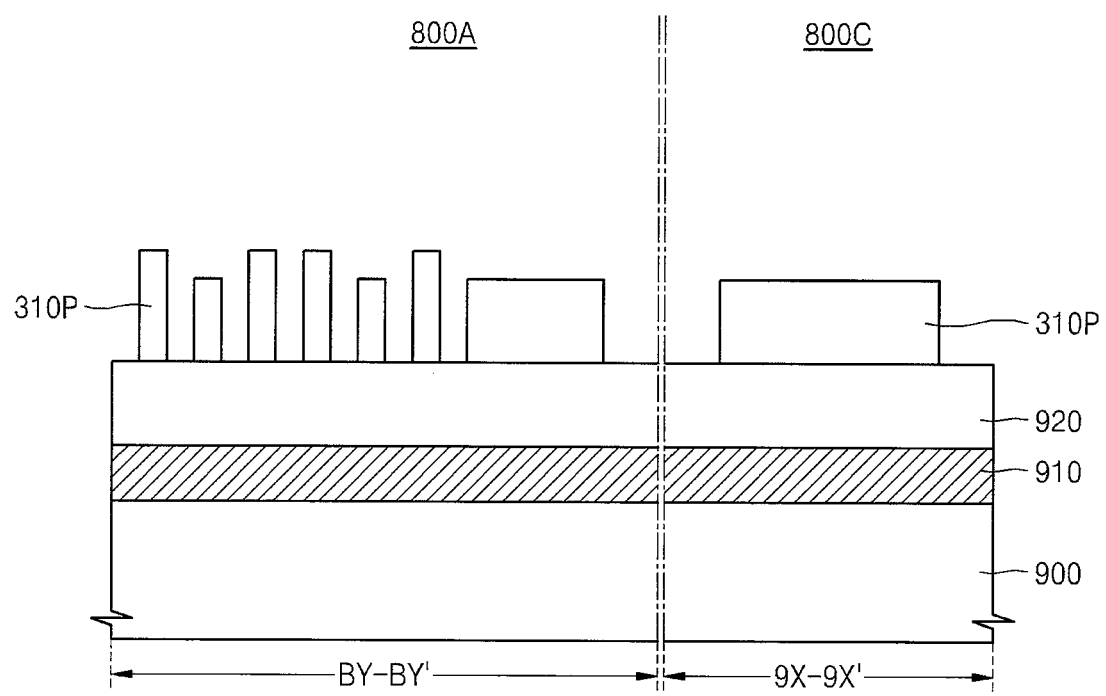
Figure 19C:
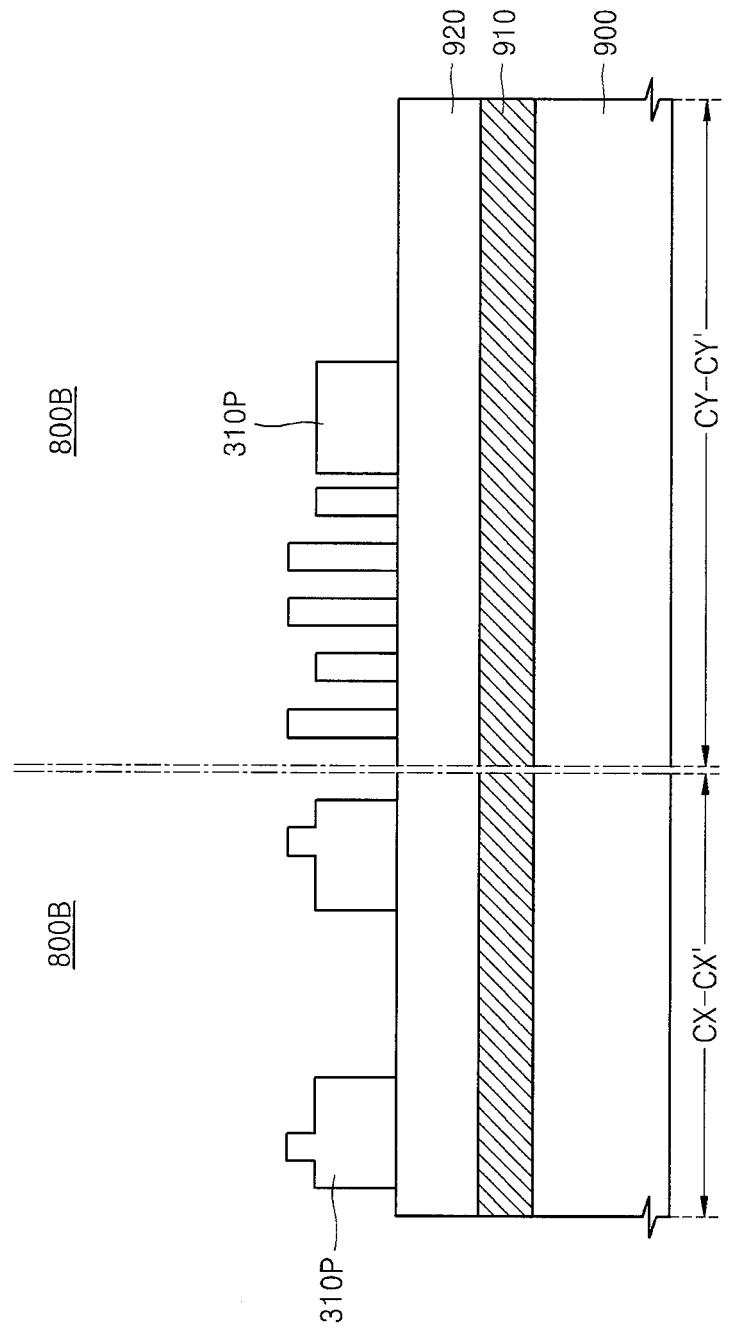

Referring to FIGS. 19A, 19B, and 19C, a plurality of feature patterns 310P are formed in the memory cell region 800A, the connection region 800B, and the peripheral circuit region 800C by patterning the second buffer layer 350 and the feature layer 310 under the second buffer layer 350 using the first and second mask patterns 320P and 360P and the wide mask patterns 968 as an etch mask, similarly as described above with reference to FIG. 4M.

Figure 20A:
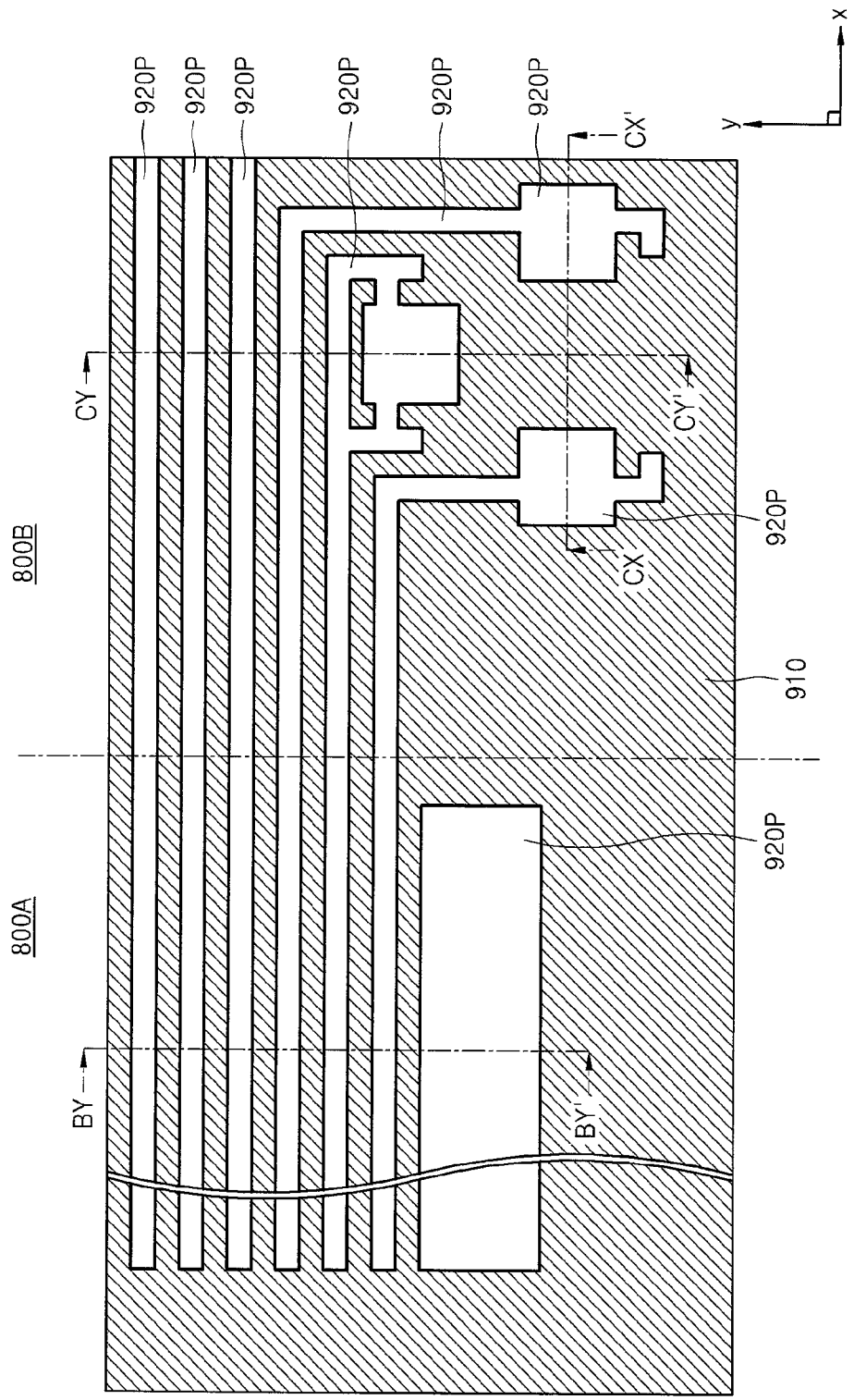
Figure 20B:
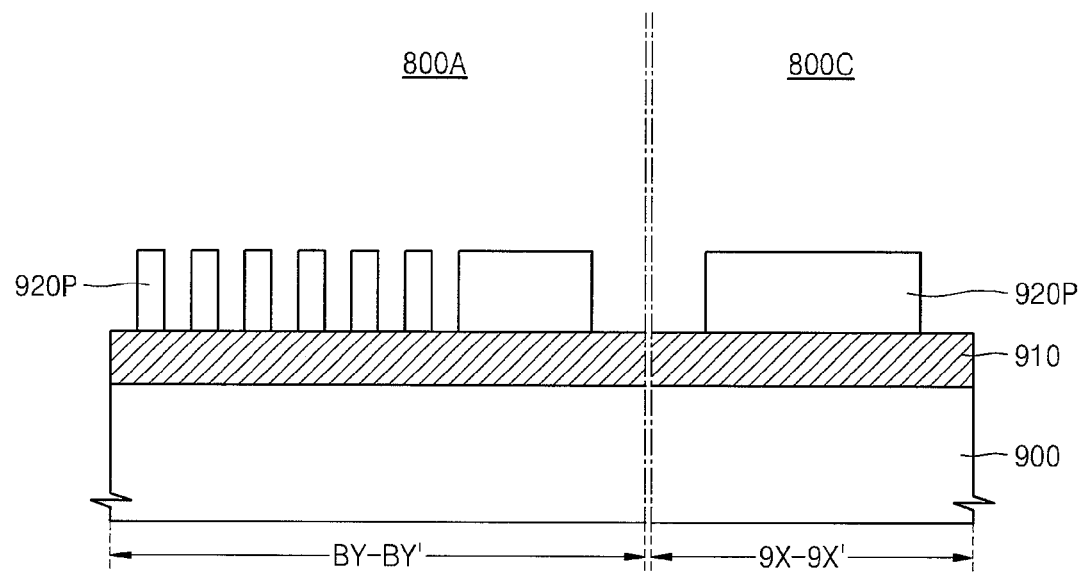
Figure 21A:
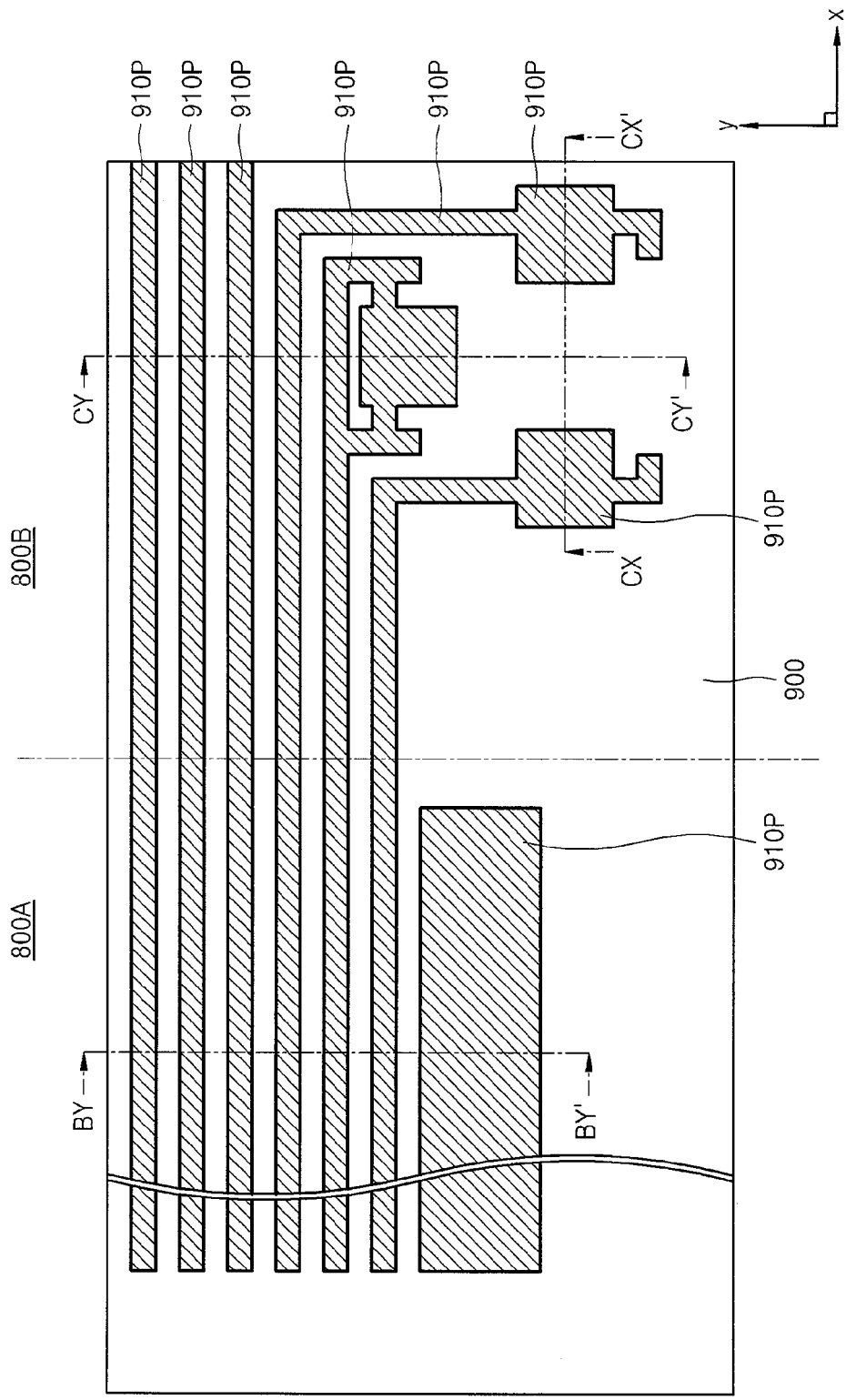
Figure 21B:
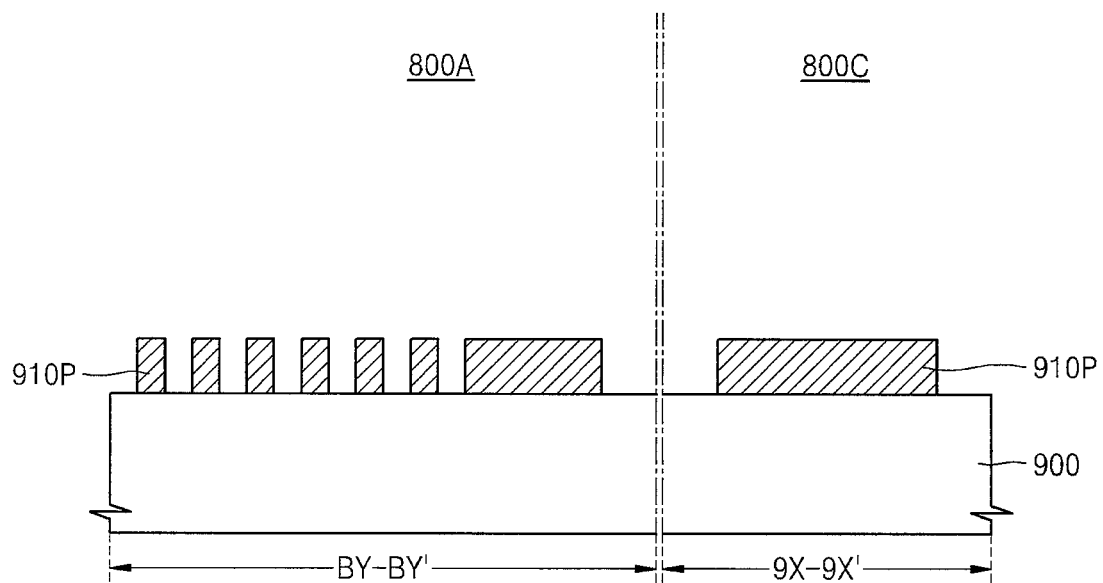

Referring to FIGS. 20A, 20B, and 20C, a plurality of hard mask patterns 920P are formed in the memory cell region 800A, the connection region 800B, and the peripheral circuit region 800C by patterning the hard mask layer 920 using the feature patterns 310P as an etch mask. Referring to FIGS. 21A, 21B, and 21C, a plurality of conductive patterns 910P are formed in the memory cell region 800A, the connection region 800B, and the peripheral circuit region 800C by patterning the conductive layer 910 using the hard mask patterns 920P as an etch mask.

The conductive patterns 910P form the plurality of conductive lines M00, M01, M02, . . . , M63, M64, and M65, the string selection line SSL, the ground selection line GSL, the first, second, and third contact pads 818, 828, and 838, and the peripheral circuit conductive pattern 870 of FIG. 8 in the memory cell region 800A, the connection region 800B, and the peripheral circuit region 800C. A respective contact pad is formed to be integral with each of the conductive lines M00, M01, M02, . . . , M63, M64, and M65.

The process steps of FIGS. 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, and 21C are described to include the process steps of FIGS. 4A, 4B, 4C, 4D, 4E, 4F, 4G, 4H, 4I, 4J, 4K, 4L, and 4M. However, the present invention may also be practiced when the process steps of FIGS. 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, and 21C include the process steps of FIGS. 5A, 5B, 5C, 5D, 5E, 5F, 5G, 5H, 5I, 5J, 5K, and 5L.

In the current embodiment described above, the first wide mask pattern 968A is formed on the second buffer layer 350 extending in parallel with the first mask patterns 320P to form the string selection line SSL or the ground selection line GSL of FIG. 8 (see FIGS. 18A to 18C). Here, the first wide mask pattern 968A is formed on the second buffer layer 350 adjacent the outer first mask pattern 320P(OUT) while not overlapping the first mask patterns 320P.

However, the present invention is not limited to the current embodiment described above and may be embodied in many different forms. For example, the string selection line SSL and the ground selection line GSL of FIG. 8 may be formed differently from the method steps described above. In addition, the location where each of the first and second mask patterns 320P and 360P is formed to overlap a respective one of the contact pads 818, 828, and 838 may vary from those as illustrated in FIG. 8.

Figure 22A:
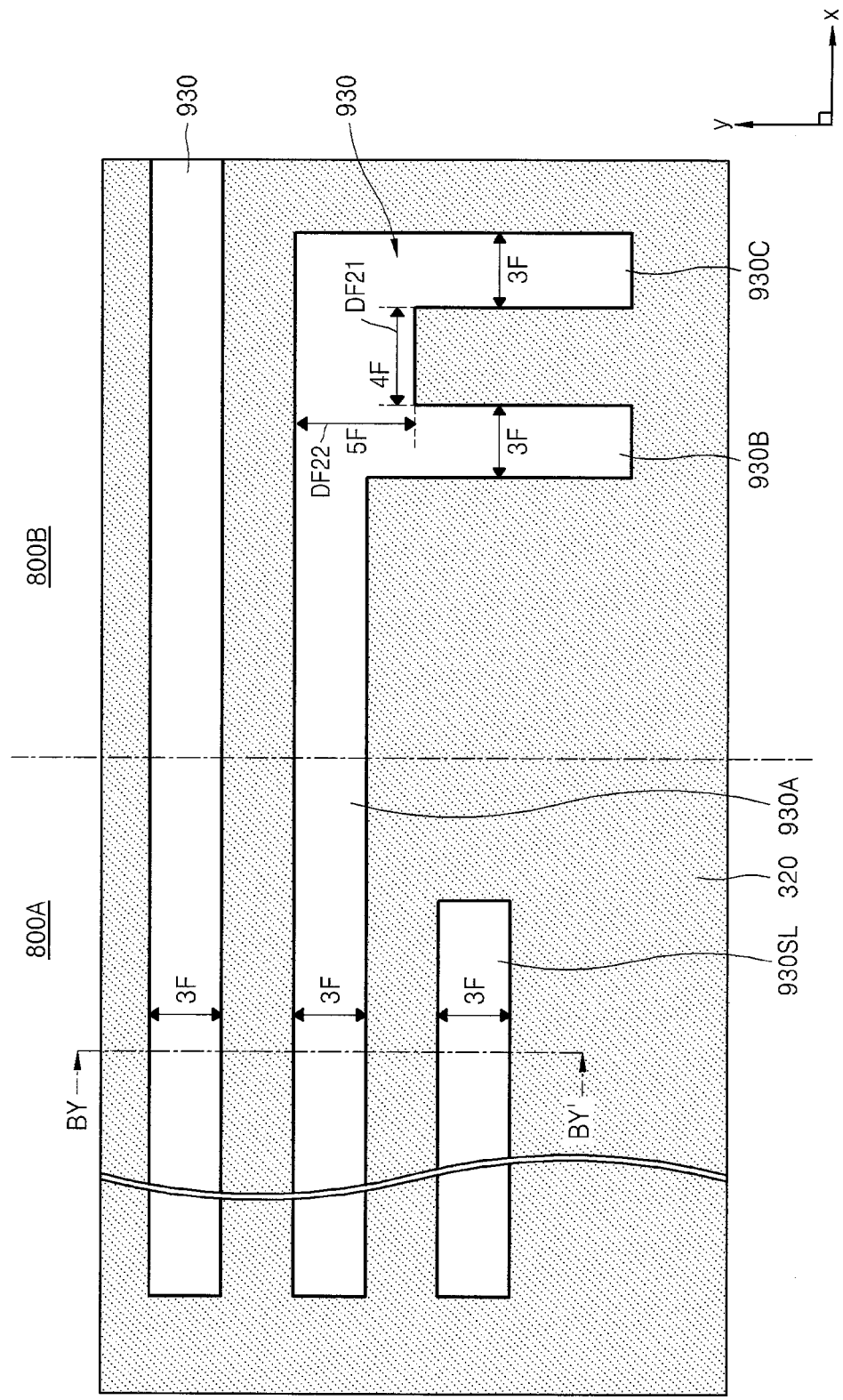
FIGS. 22A, 22B, 23A, 23B, 24A, and 24B are plan views and cross-sectional views illustrating steps for fabricating a portion of the conductive structures of FIG. 8, according to an alternative embodiment of the present invention.
Figure 22B:
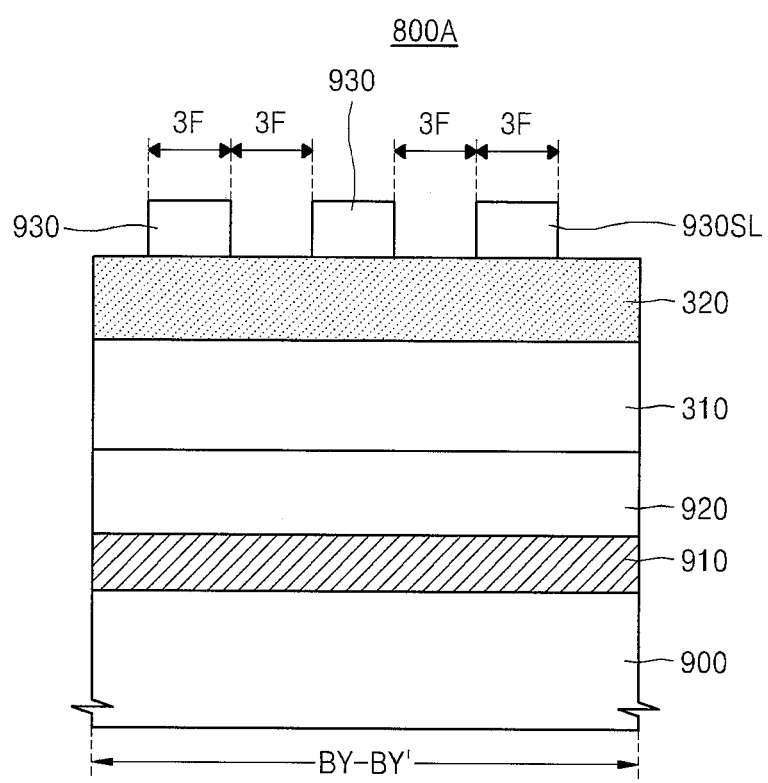
Figure 23A:
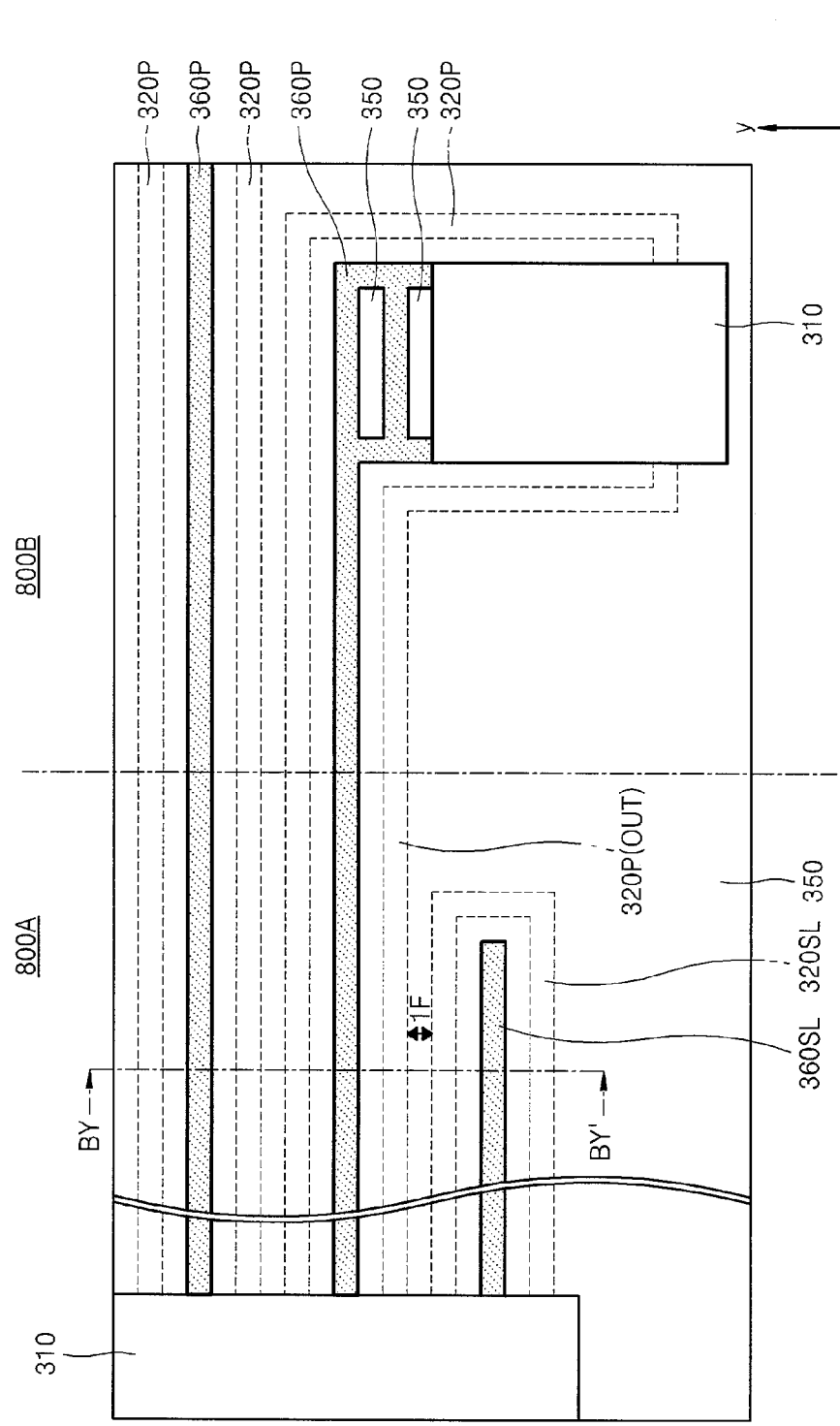
Figure 23B:
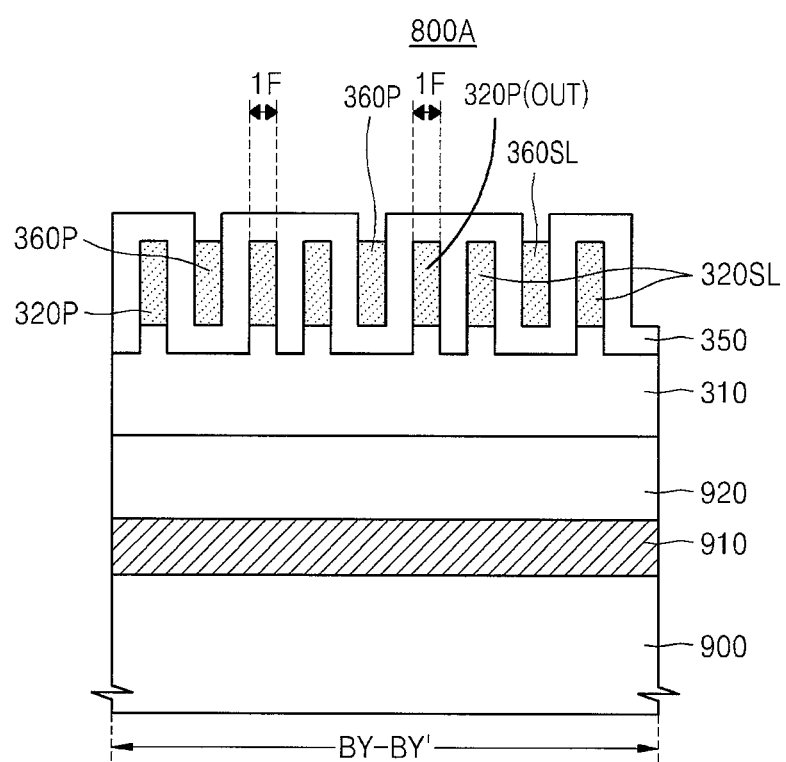
Figure 24A:
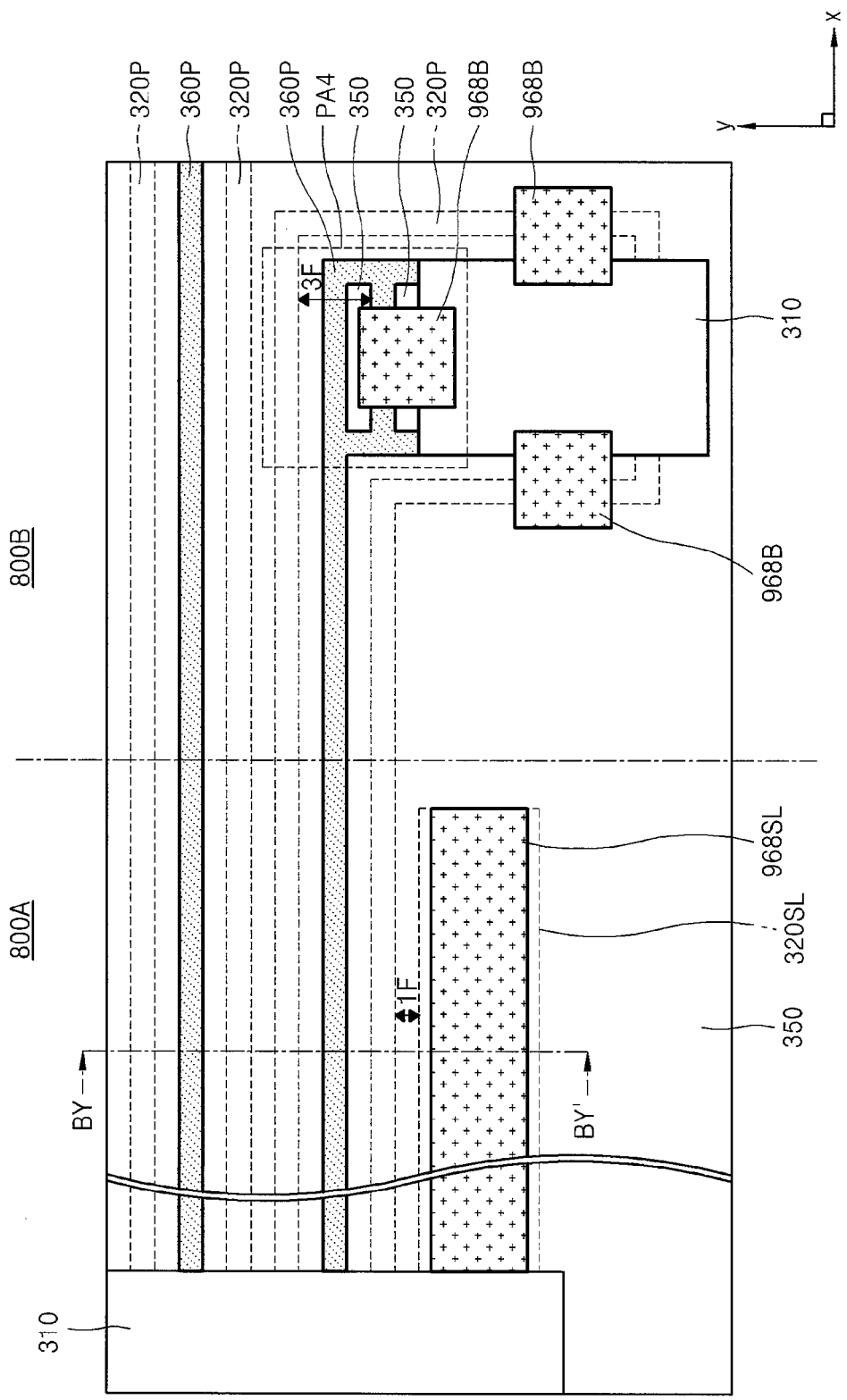
Figure 24B:
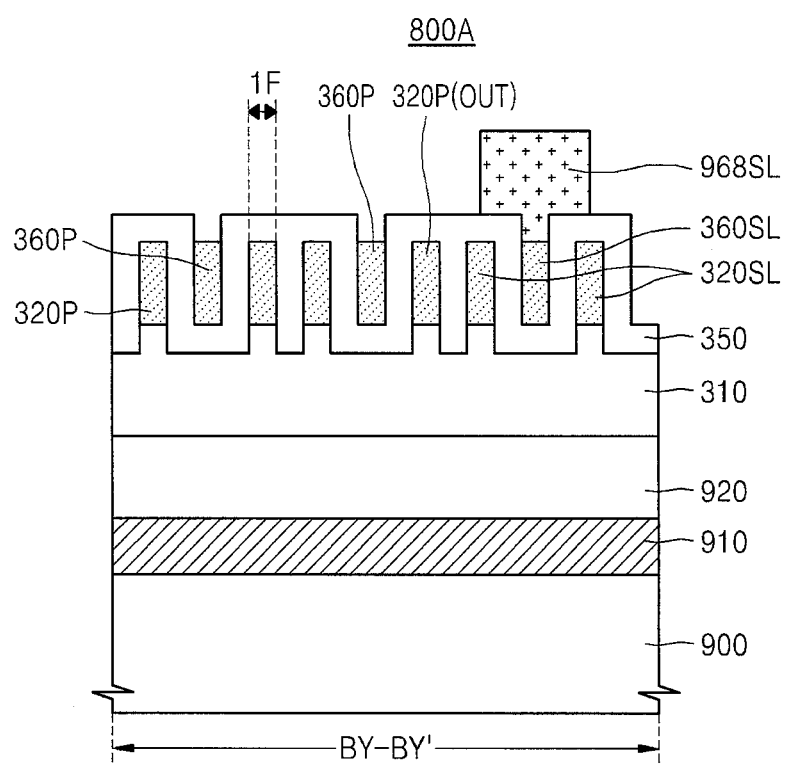

FIGS. 22A, 22B, 23A, 23B, 24A, and 24B are plan views and cross-sectional views illustrating steps for fabricating a portion of the conductive structures of FIG. 8, according to an alternative embodiment of the present invention for forming the string selection line SSL and the ground selection line GSL. In particular, FIGS. 22A, 23A, and 24A are plane views of the rectangular region labeled as "IX" in FIG. 8. FIGS. 22B, 23B, and 24B are cross-sectional views along lines BY-BY' of FIGS. 22A, 22A, and 23A, respectively.

In FIGS. 22A, 22B, 23A, 23B, 24A, and 24B, the reference numerals that are the same as those of FIGS. 4A, 4B, 4C, 4D, 4E, 4F, 4G, 4H, 4I, 4J, 4K, 4L, 4M, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, and 21C denote similar elements, and thus, a description of their operations or characteristics is not repeated.

Referring to FIGS. 22A and 22B, similarly as described above with reference to FIGS. 9A, 9B, to 9C, a conductive layer 910, a hard mask layer 920, a feature layer 310, and a first mask layer 320 are formed sequentially on a substrate 900 including the memory cell region 800A, the connection region 800B, and the peripheral circuit region 800C of FIG. 8. In addition, a plurality of first buffer structures 930 is formed on the first mask layer 320.

In an example embodiment of the present invention, when the first buffer structures 930 are formed, an alignment buffer structure 930SL is also formed adjacent an outermost one of the first buffer structures 930 in one memory cell block region. The alignment buffer structure 930SL has the width of 3F similarly as the first buffer structures 930 and is spaced from the outermost first buffer structure 930 by 3F. Although FIGS. 22A and 22B illustrate only one alignment buffer structure 930SL formed for the ground selection line GSL, the present invention may also be practiced with the alignment buffer structure 930SL being formed for the string selection line SSL of FIG. 8.

Referring to FIGS. 23A and 23B, similar process steps as described above with reference to FIGS. 10A, 10B, 10C, 11A, 11B, 11C, 12A, 12B, 12C, 13A, 13B, 13C, 14A, 14B, 14C, 15A, 15B, 15C, 16A, 16B, and 16C are performed after FIGS. 22A and 22B to form the first mask structures 320P and the second mask structures 360P. In addition, a trimming process similarly as described above with reference to FIGS. 17A, 17B, and 17C is performed to remove portions of the first and second mask structures 320P and 360P that were disposed in the exposed region of the feature layer 310.

During such trimming, a first alignment mask pattern 320SL may also be trimmed after being generated from the alignment buffer structure 930SL. The distance between the outer first mask pattern 320P(OUT) and the first alignment mask pattern 320SL is about 1F, according to an embodiment of the present invention. A second alignment mask pattern 360SL adjacent to the first alignment mask pattern 320SL is formed simultaneously with the second mask patterns 360P.

Referring to FIGS. 24A and 24B, a plurality of wide mask patterns 968 are formed after FIGS. 23A and 23B in the memory cell region 800A, the connection region 800B, and the peripheral circuit region 800C, similarly as described above with reference to FIGS. 18A, 18B, and 18C. In the example of FIGS. 24A and 24B, a first wide mask pattern 968SL is formed on the second buffer layer 350 to overlap the first alignment mask pattern 320SL and the second alignment mask pattern 360SL.

The first wide mask pattern 968SL is formed to overlap at least a portion of the first alignment mask pattern 320SL and a region defined by the first alignment mask pattern 320SL. Accordingly, a width of the first wide mask pattern 968SL in a Y-axis direction is less than 3F, according to an example embodiment of the present invention. In addition, a plurality of second wide mask patterns 968B are formed to overlap the first and second mask patterns 320P and 360P as illustrated in FIG. 24A.

Subsequently, similarly as described above with reference to FIGS. 19A, 19B, and 19C, a plurality of feature patterns 310P are formed by patterning the second buffer layer 350 and the feature layer 310 using the first mask patterns 320P, the second mask patterns 360P, the first alignment mask pattern 320SL, the first wide mask pattern 968SL, and the second wide mask patterns 968B as an etch mask. Thereafter, a plurality of conductive patterns 910P are formed similarly as described above with reference to FIGS. 20A, 20B, 20C, 21A, 21B, and 21C using the feature patterns 310P as an etch mask.

In FIGS. 22A, 22B, 23A, 23B, 24A, and 24B, a ground selection line GSL or a string selection line SSL is formed in the memory cell region 300A by using the first alignment mask pattern 320SL and the first wide mask pattern 968SL. The first wide mask pattern 968SL is formed on the first alignment mask pattern 320SL to form an etch mask. The first wide mask pattern 968SL is formed narrower than the first alignment mask pattern 320SL. In this manner, the distance between the ground selection line GSL and the conductive line M00 in FIG. 8 or the distance between the string selection line SSL and the conductive line M65 in FIG. 8 is aligned with respect to the distances between the first mask patterns 320P and the first alignment mask pattern 320SL.

Thus, the distance between the ground selection line GSL and the conductive line M00 and the distance between the string selection line SSL and the conductive line M65 are designed to be 1F. Accordingly in the memory cell block 840 of FIG. 8, misalignment between the group of conductive lines M00, M01, M02, . . . , M63, M64, and M65 and the ground selection line GSL or the string selection line SSL is prevented. Also, the respective distances between the respective group of conductive lines M00, M01, M02, . . . , M63, M64, and M65 and the ground selection line GSL or the string selection line SSL may be same in a plurality of memory cell blocks formed on the substrate 900.

The process steps of FIGS. 22A, 22B, 23A, 23B, 24A, and 24B are described herein to include the process steps of FIGS. 4A, 4B, 4C, 4D, 4E, 4F, 4G, 4H, 4I, 4J, 4K, 4L, and 4M. However, the present invention may also be practiced when the process steps of 22A, 22B, 23A, 23B, 24A, and 24B include the process steps of FIGS. 5A, 5B, 5C, 5D, 5E, 5F, 5G, 5H, 5I, 5J, 5K, and 5L.

Figure 25:
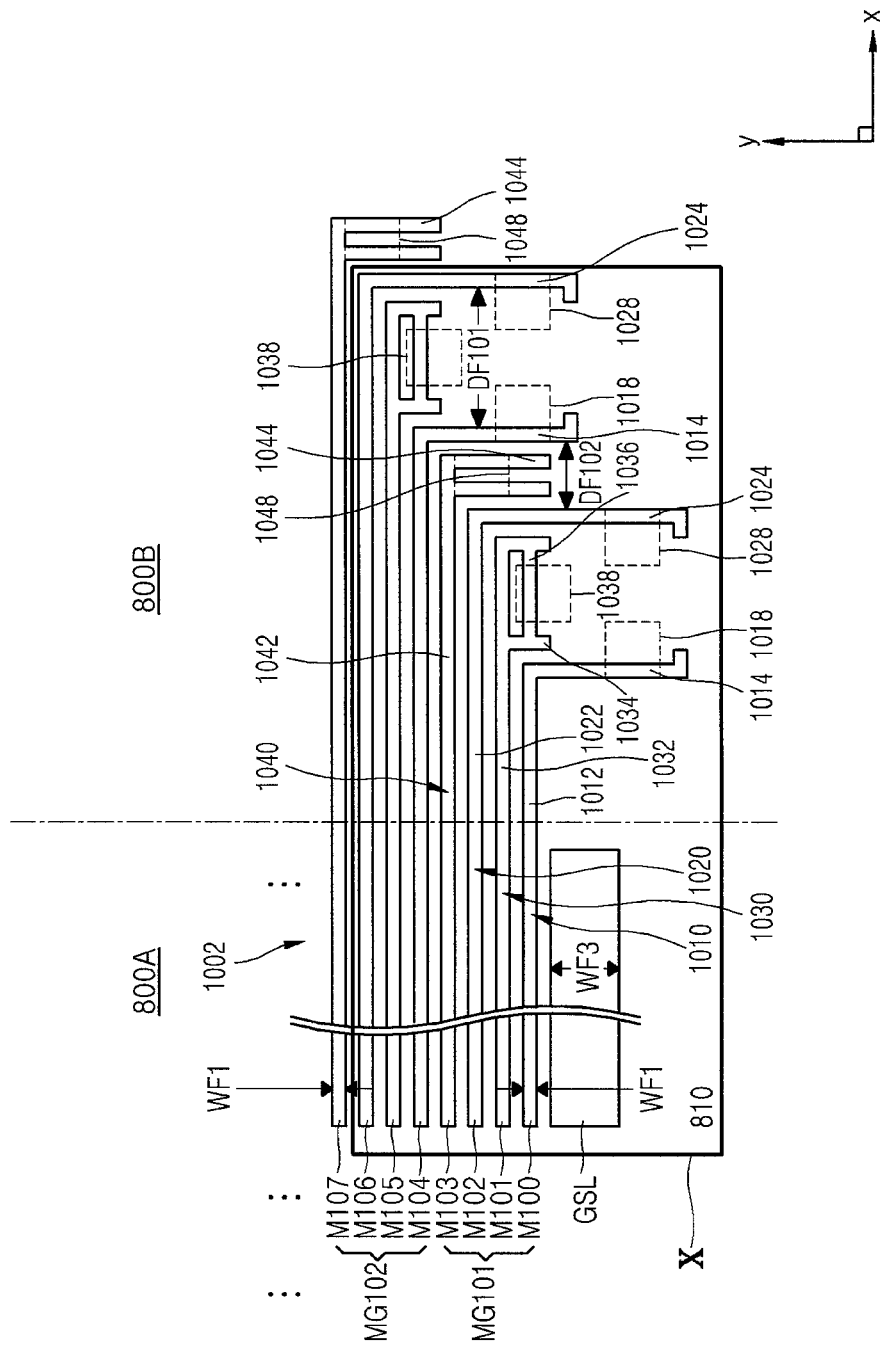
FIG. 25 is a plan view of conductive structures of a semiconductor device, according to an alternative embodiment of the present invention.

FIG. 25 is a plan view of conductive structures of a semiconductor device formed according to an alternative embodiment of the present invention. In FIG. 25, reference numerals that are same as those of FIG. 8 denote the same elements, and thus, a description of their operations or characteristics is not repeated.

FIG. 25 illustrates a layout of a part of the memory cell region 800A for a NAND flash memory device, and the connection region 800B for connecting a plurality of conductive lines that constitute a cell array of the memory cell region 800A, such as a plurality of word lines or bit lines, to an external circuit (not shown) such as a decoder. Referring to FIG. 25, a plurality of memory cell blocks 1002 are formed in the memory cell region 800A but for simplicity of description and illustration, only a part of one memory cell block 1002 is illustrated in FIG. 25.

In the memory cell block 1002, a plurality of conductive lines M100, M101, M102, . . . , and M107 forming one cell string 10 of FIG. 2 extend in parallel between a string selection line (not shown) and a ground selection line GSL in a first direction (an X-axis direction in FIG. 25) from the memory cell region 800A to the connection region 800B. Each of the conductive lines M100, M101, M102, . . . , and M107 has a respective integral contact pad (such as one of the contact pads 1018, 1028, 1038, and 1048 outlined in dashed lines in FIG. 25) in the connection region 800B for connection to the external circuit.

The conductive lines M100, M101, M102, . . . , and M107 are formed on a same plane, and are organized into a plurality of conductive line groups MG101, MG102, . . . , each consisting of a respective four of such conductive lines. Each of the plurality of conductive line groups MG101, MG102, . . . , includes a first conductive line 1010, a second conductive line 1020, a third conductive line 1030, and a fourth conductive line 1040.

The third conductive line 1030 is between the first and second conductive lines 1010 and 1020. The fourth conductive line 1040 is adjacent to the second conductive line 1020. The second conductive line 1020 is between the third and fourth conductive lines 1030 and 1040.

Each memory cell block 1002 may include, for example, eight, sixteen, or thirty-two conductive line groups but the present invention is not limited thereto. The present invention may be practiced with each memory cell block having various numbers of conductive line groups.

The first conductive line 1010 includes a first line portion 1012 and a first branch portion 1014. The first line portion 1012 extends from the memory cell region 800A to the connection region 800B in the first direction (the X-axis direction in FIG. 25). The first branch portion 1014 is formed in the connection region 800B to extend from one end of the first line portion 1012 in a different direction (such as perpendicular along the Y-axis direction in FIG. 25) from the first direction.

The second conductive line 1020 includes a second line portion 1022 and a second branch portion 1024. The second line portion 1022 extends from the memory cell region 800A to the connection region 800B in parallel with the first line portion 1012. The second branch portion 1024 is formed in the connection region 800B to extend from one end of the second line pattern 1022 in a different direction (such as perpendicular along the Y-axis direction in FIG. 25) from the first direction.

The third conductive line 1030 includes a third line portion 1032 and a third branch portion 1034. The third line portion 1032 extends parallel between the first and second line portions 1012 and 1022. The third branch portion 1034 is formed between the first and second branch portions 1014 and 1024 to extend from one end of the third line portion 1032 in a different direction (such as perpendicular along the Y-axis direction in FIG. 25) from the first direction. The third branch portion 1034 is shorter than the first and second branch portions 1014 and 1024.

The fourth conductive line 1040 includes a fourth line portion 1042 and a fourth branch portion 1044. The fourth line portion 1042 extends from the memory cell region 800A to the connection region 800B in parallel with the first line portion 1012. The fourth branch portion 1044 is formed in the connection region 800B to extend from one end of the fourth line portion 1042 in a different direction (such as perpendicular along the Y-axis direction in FIG. 25) from the first direction.

The fourth branch portion 1044 is shorter than the second branch portion 1024, and the fourth line portion 1042 is longer than the second line portion 1022. A portion of the second mask patterns is trimmed during fabrication of the fourth branch portion such that the fourth branch portion 1044 is shorter than the second branch portion 1024.

Further referring to FIG. 25, the first, second, third, and fourth branch portions 1014, 1024, 1034, and 1044 extend along the Y-axis direction, but the present invention is not limited thereto. The present invention may be practiced with the first, second, third, and fourth branch portions 1014, 1024, 1034, and 1044 extending along various directions.

In the example of FIG. 25, the third conductive line 1030 further includes a connection portion 1036 extending from the third branch portion 1034 in parallel with the third line portion 1032 in the connection region 800B. The present invention may be practiced with or without the connection portion 1036 being formed depending on the process for patterning the semiconductor device.

In each of the plurality of conductive line groups MG101, MG102, . . . , the first, second, and third conductive lines 1010, 1020, and 1030 of FIG. 25 are similar to the first, second, and third conductive lines 810, 820, and 830 of FIG. 8, and thus, a detailed description thereof is not repeated herein.

The respective widths WF1 of the respective fourth conductive lines 1040 in the conductive line groups MG101, MG102, . . . , are the same in the memory cell region 800A as in the connection region 800B, in an example embodiment of the present invention. For example, such a width WF1 is a minimum feature size 1F of the semiconductor device. Also, the conductive lines 1010, 1020, 1030, and 1040 are separated from each other by a distance of 1F in the memory cell region 800A, according to an example embodiment of the present invention.

In the connection region 800B, each of the plurality of conductive line groups MG101, MG102, . . . , includes one first contact pad 1018 formed integral with the first conductive line 1010, one second contact pad 1028 formed integral with the second conductive line 1020, one third contact pad 1038 formed integral with the third conductive line 1030, and one fourth contact pad 1048 formed integral with the fourth conductive line 1040.

In the example of FIG. 25, the first contact pad 1018 is formed integral with the first branch portion 1014. The second contact pad 1028 is formed integral with the second branch portion 1024. The third contact pad 1038 is formed integral with the connection portion 1036 of the third conductive line 1030. The fourth contact pad 1048 is formed integral with the fourth branch portion 1044. The first, second, third, and fourth contact pads 1018, 1028, 1038, and 1048 are formed to be separated from each other, according to an example embodiment of the present invention.

In FIG. 25, the conductive lines M100, M101, M102, ..., the ground selection line GSL, and the pads contact pads 1018, 1028, 1038, and 1048 are comprised of a same material, according to an example embodiment of the present invention. The conductive lines 1010, 1020, 1030, and 1040 form word lines or bit lines of the memory cells in the memory cell region 800A.

In the connection region 800B, a distance DF101 between the first and second branch portions 1014 and 1024 in each of the conductive line groups MG101, MG102, ..., is at least nine times the width WF1 of the conductive lines M100, M101, M102, ..., M63, M64, and M65. For example, the distance DF101 is equal to or greater than 9F.

A distance DF102 between the first branch portion 1014 of one conductive line group and the second branch portion 1024 of an adjacent conductive line group is at least five times the width WF1 of the conductive lines M100, M101, M102, .... For example, the distance DF102 is equal to or greater than 5F. Such distances DF101 and DF102 ensure a relatively large design margin for preventing short-circuiting between the contact pads 1018, 1028, 1038, and 1048.

FIGS. 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, 35C, 36A, 36B, 36C, 37A, 37B, and 37C are plan views and cross-sectional views illustrating steps for fabricating a portion of the conductive structures of FIG. 25, according to embodiments of the present invention.

FIGS. 26A, 27A, 28A, 29A, 30A, 31A, 32A, 33A, 34A, 35A, 36A, and 37A are plan views of a rectangular region labeled as "IX" in FIG. 25. FIGS. 26B, 27B, 28B, 29B, 30B, 31B, 32B, 33B, 34B, 35B, 36B, and 37B are cross-sectional views along line BY-BY' in FIGS. 26A, 27A, 28A, 29A, 30A, 31A, 32A, 33A, 34A, 35A, 36A, and 37A, respectively. FIGS. 26C, 27C, 28C, 29C, 30C, 31C, 32C, 33C, 34C, 35C, 36C, and 37C are cross-sectional views along line CY-CY' in FIGS. 26A, 27A, 28A, 29A, 30A, 31A, 32A, 33A, 34A, 35A, 36A, and 37A, respectively.

Process steps in FIGS. 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, 35C, 36A, 36B, 36C, 37A, 37B, and 37C are described to include similar process steps of FIGS. 5A, 5B, 5C, 5D, 5E, 5F, 5G, 5H, 5I, 5J, 5K, and 5L. The reference numerals that are the same in such figures denote same elements, and thus, their operations or characteristics are not repeated.

Figure 26A:
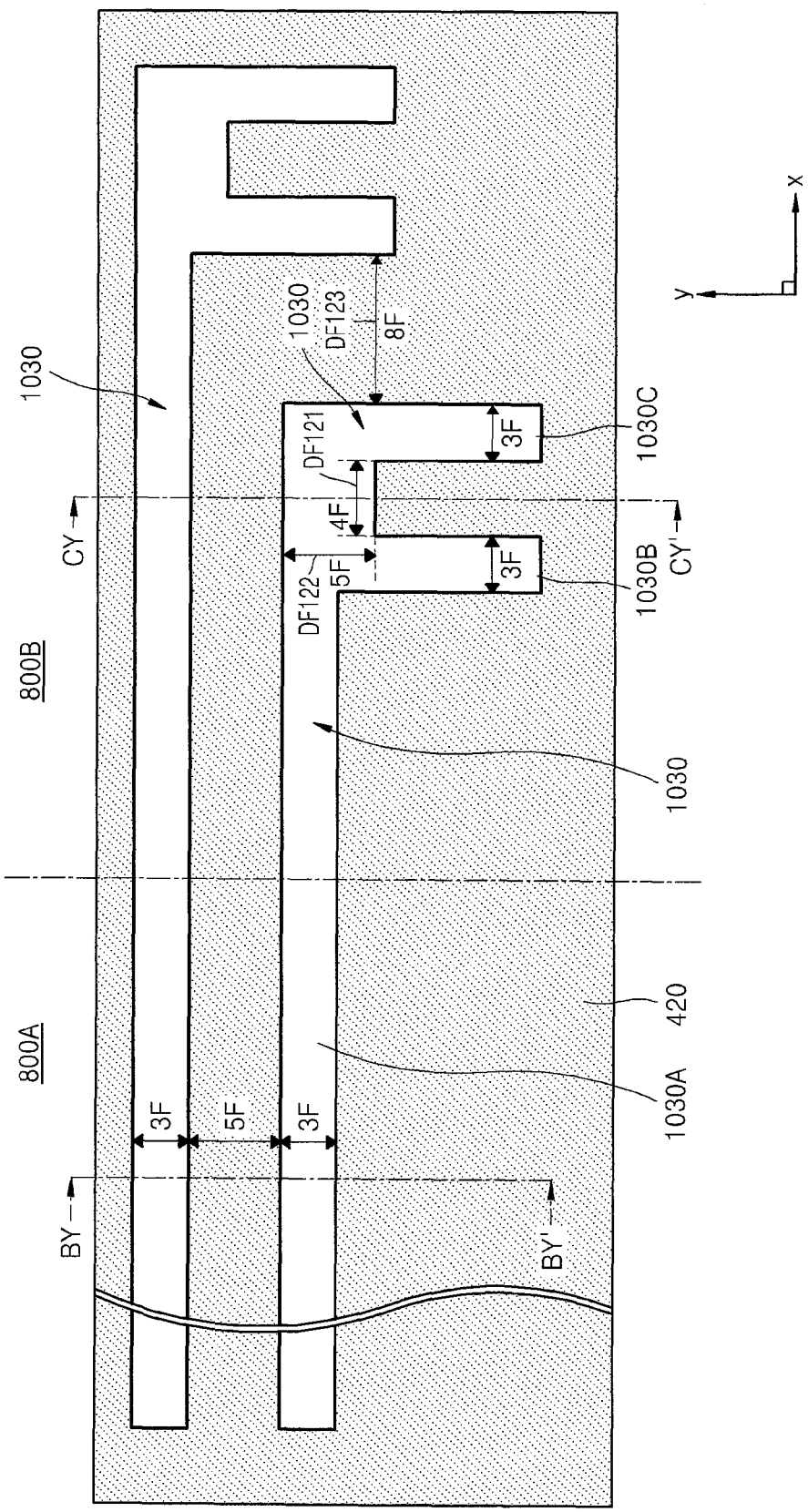
Figure 26B:
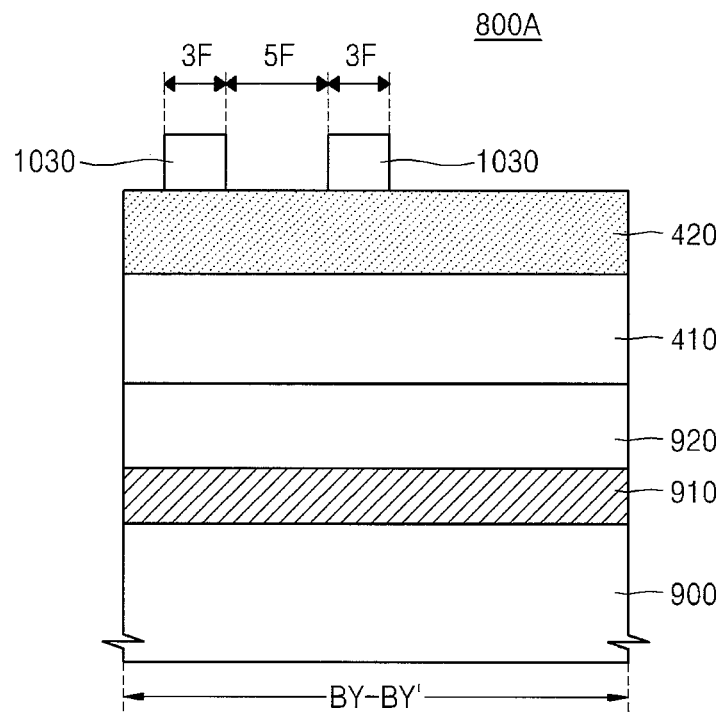
Figure 26C:
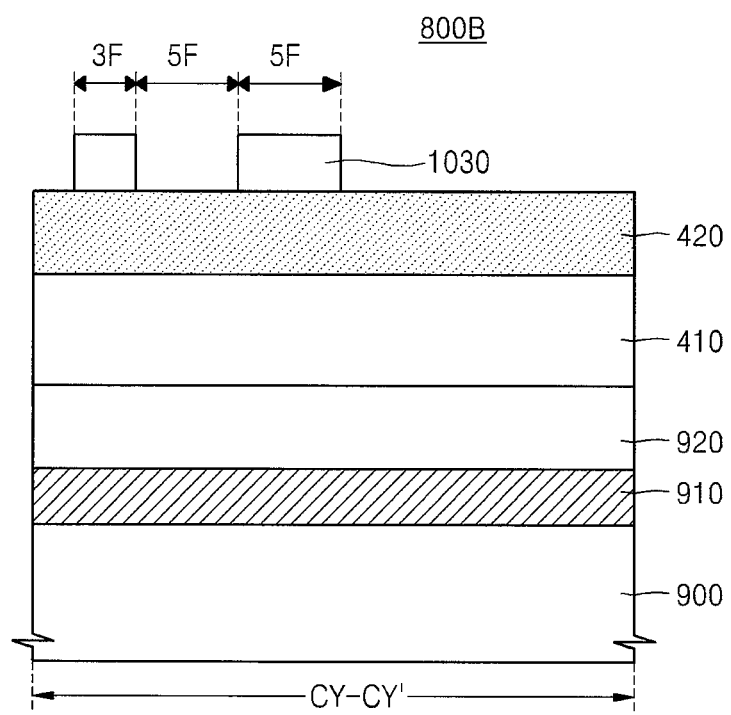

Referring to FIGS. 26A, 26B, and 26C, a substrate 900 includes the memory cell region 800A and the connection region 800B. A conductive layer 910 for forming a plurality of conductive lines is formed on the substrate 900, and a hard mask layer 920 is formed on the conductive layer 910. Next similarly as described above with reference to FIG. 5A, a feature layer 410 and a first mask layer 420 are formed sequentially on the hard mask layer 920 in the memory cell region 800A and the connection region 800B. Subsequently, a plurality of first buffer structures 1030 are formed on the first mask layer 420, similarly as described above with reference to FIG. 5A.

For each of the conductive line groups MG101, MG102, ..., a respective group of two first buffer structures 1030 are formed with each first buffer structure 1030 having an "F" shape similarly as described above in reference to in FIG. 9A. However, the present invention may also be practiced with the first buffer structures 1030 each having a reversed "F" shape that is line-symmetrical to "F", a "Y" shape, a reversed "Y" shape that is line-symmetrical to "Y", a fork shape, or a reversed fork shape that is line-symmetrical to the fork shape.

In FIG. 26A, each buffer structure 1030 includes a line buffer portion 1030A extending from the memory cell region 800A to the connection region 800B in the first direction (i.e., X-axis direction). Each buffer structure 1030 also includes branch buffer portions 1030B and 1030C that extend parallel with each other within the connection region 800B in a different direction such as in a perpendicular direction (i.e., Y-axis direction) from the first direction. The distance DF121 between the branch buffer portions 1030B and 1030C is at least 3F such as 4F to ensure sufficient process margins in the example of FIG. 26A.

The first buffer structures 1030 have a width that is at least three times greater than the target width of 1F of a fine pattern to be formed on the substrate 900. For example in FIG. 26A, the line portion 1030A and the branch portions 1030B and 1030C each have a width of 3F. In addition, the distance between the line portions of adjacent buffer structures 1030 is 5F.

Further in FIG. 26A, a width DF122 of a portion the first buffer structure 1030 from which the branch portions 1030B and 1030C extend is about 5F to ensure sufficient process margins. However, the present invention may be practiced with other widths of portions of the first buffer structure 1030. In the connection region 800B, a distance DF123 between the respective branch portions 1030B or 1030C of adjacent first buffer structures 1030 is at least 5F such as 8F as illustrated in the example of FIG. 26A.

Figure 27A:
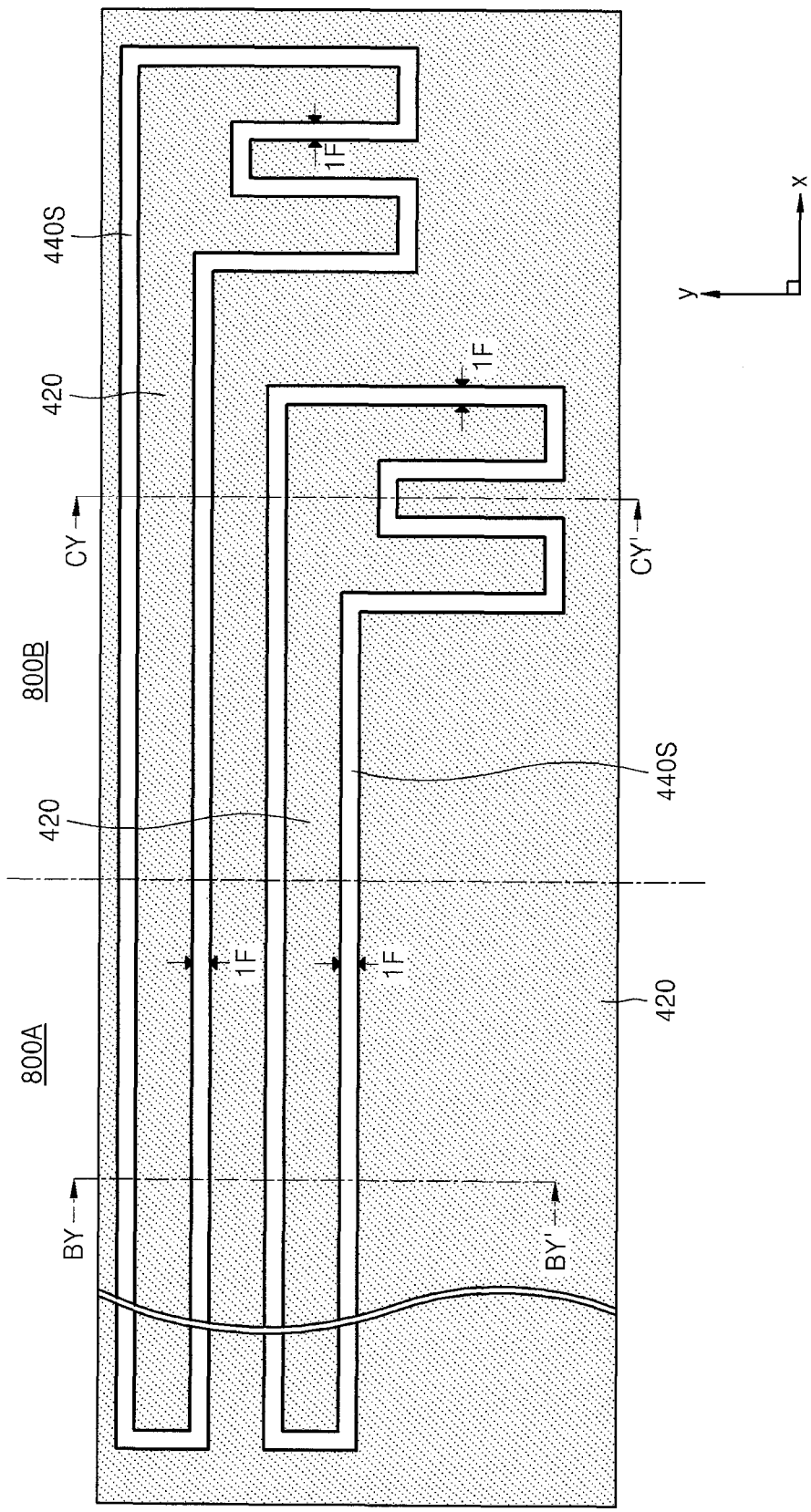
Figure 27B:
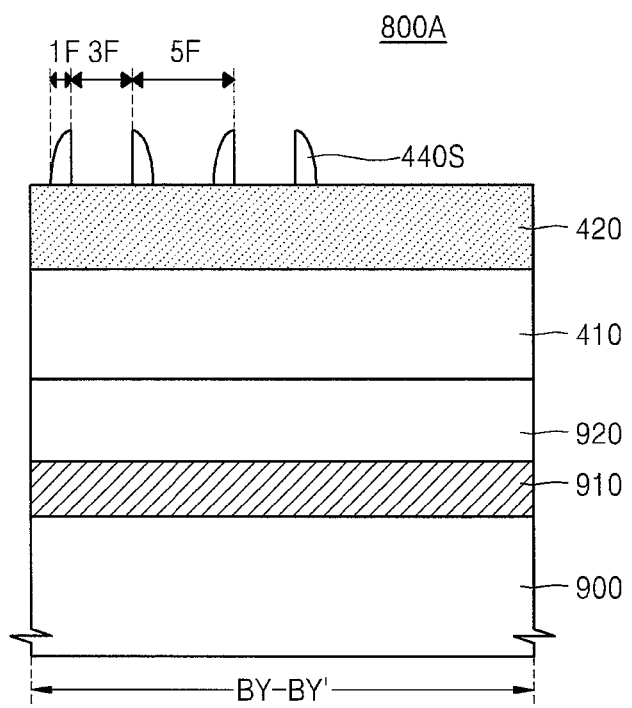
Figure 27C:
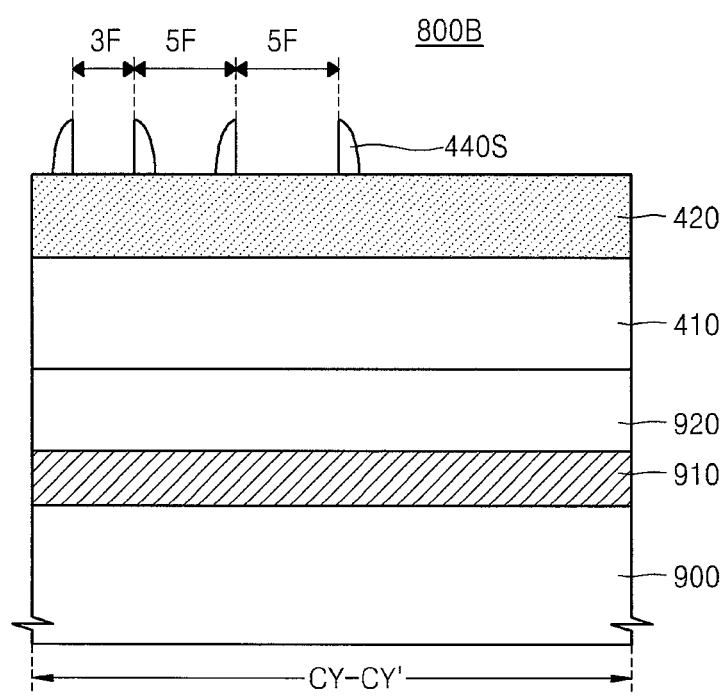

Referring to FIGS. 27A, 27B, and 27C, similarly as described above with reference to FIGS. 5B, 5C, and 5D, a spacer layer 440 is deposited onto exposed surfaces of the first buffer structures 1030 and the first mask layer 420 in the memory cell region 800A and the connection region 800B. Such a spacer layer 440 is then etched back until an upper surface of the first mask layer 420 is exposed to form a plurality of spacers 440S at sidewalls of the first buffer structures 1030 in the memory cell region 800A. Next, the first buffer structures 1030 are removed.

Each of the spacers 440S has the target width of 1F, in an example embodiment of the present invention. The spacers 440S as formed along the sidewalls of the first buffer structures 130 have a loop shape corresponding to the shape of first buffer structure 930.

Figure 28A:
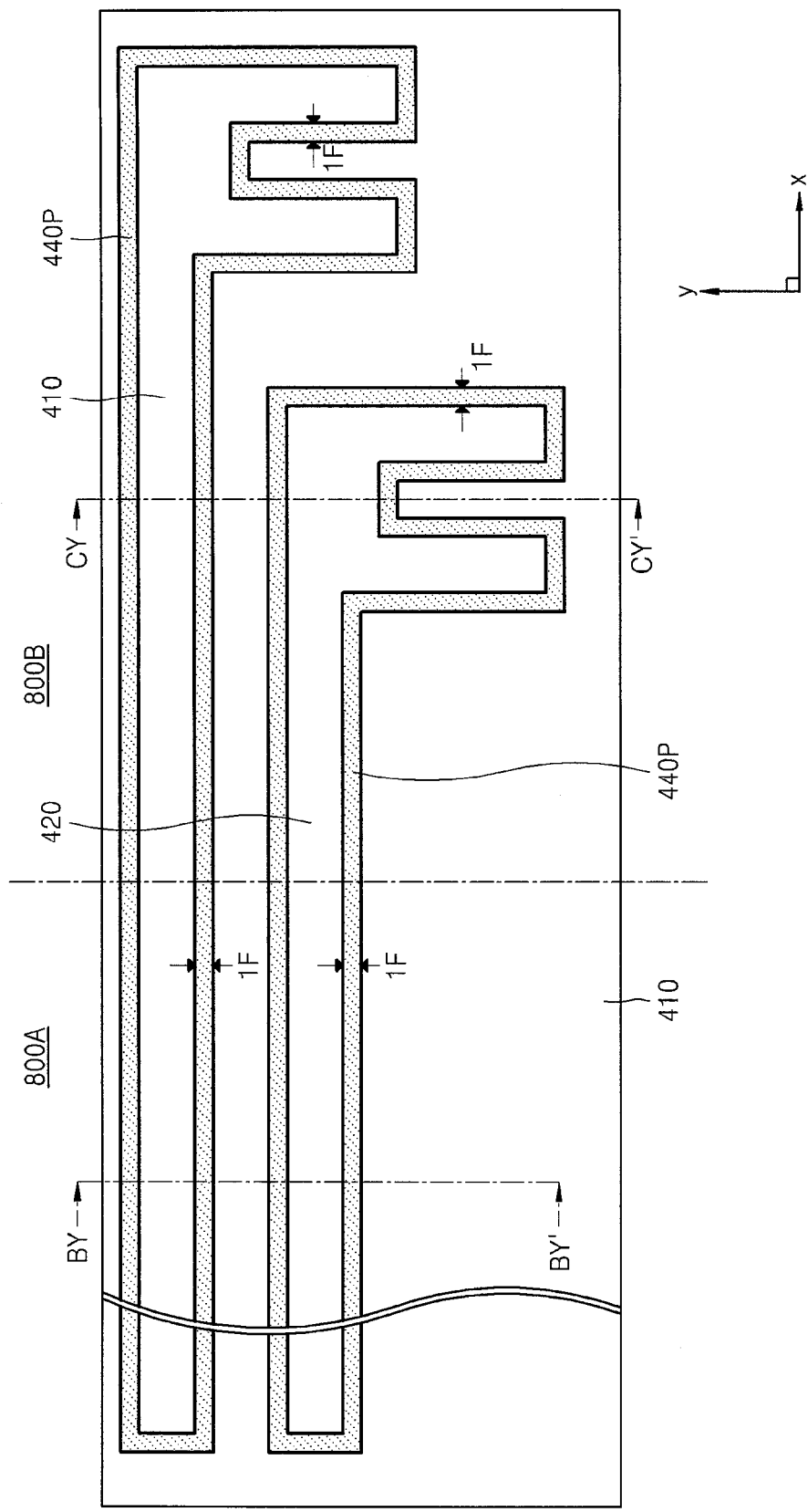
Figure 28B:
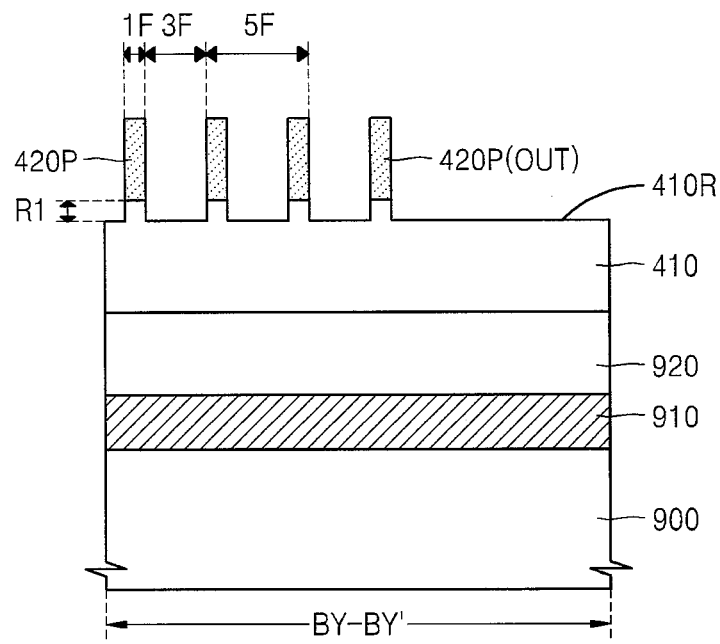
Figure 28C:
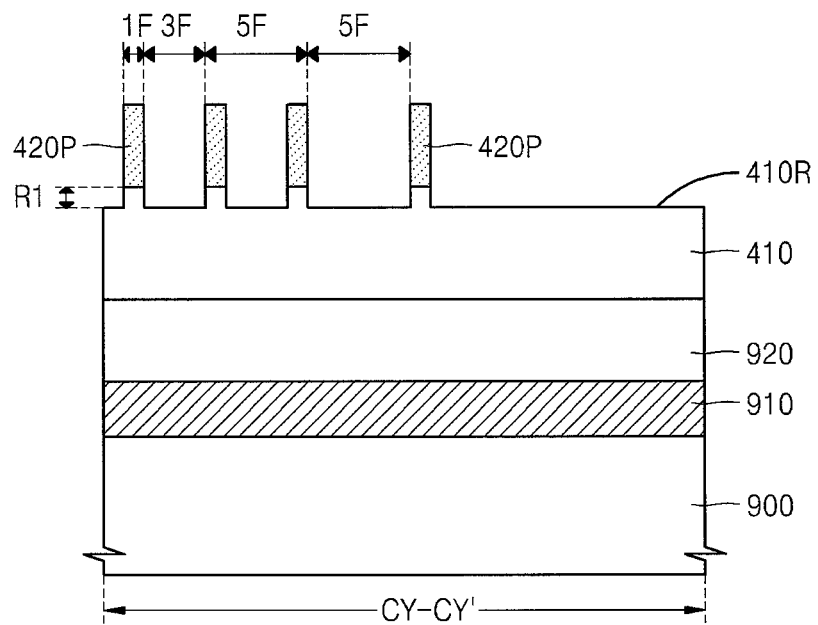

Referring to FIGS. 28A, 28B, and 28C, similarly as described above with reference to FIGS. 5E and 5F, a plurality of first mask patterns 420P are formed in the memory cell region 800A and the connection region 800B by patterning the first mask layer 420 using the spacers 440S as an etch mask. Subsequently, an upper surface of the feature layer 410 exposed via the first mask patterns 420P in the memory cell region 800A and the connection region 800B is removed by a first depth R1 to form low surfaces 410R of the feature layer 410. The first depth R1 is the target width of 1F, in an example embodiment of the present invention.

Next, the spacers 440S are removed to expose upper surfaces of the first mask patterns 420P. The first mask patterns 420P have a loop shape along the outline of the "F" shape of the first buffer structures 1030. In the memory cell region 800A and the connection region 800B, the first mask patterns 420P include an outer first mask pattern 420P(OUT) corresponding to an outer portion of one memory cell block 1002 (see FIG. 25).

Figure 29A:
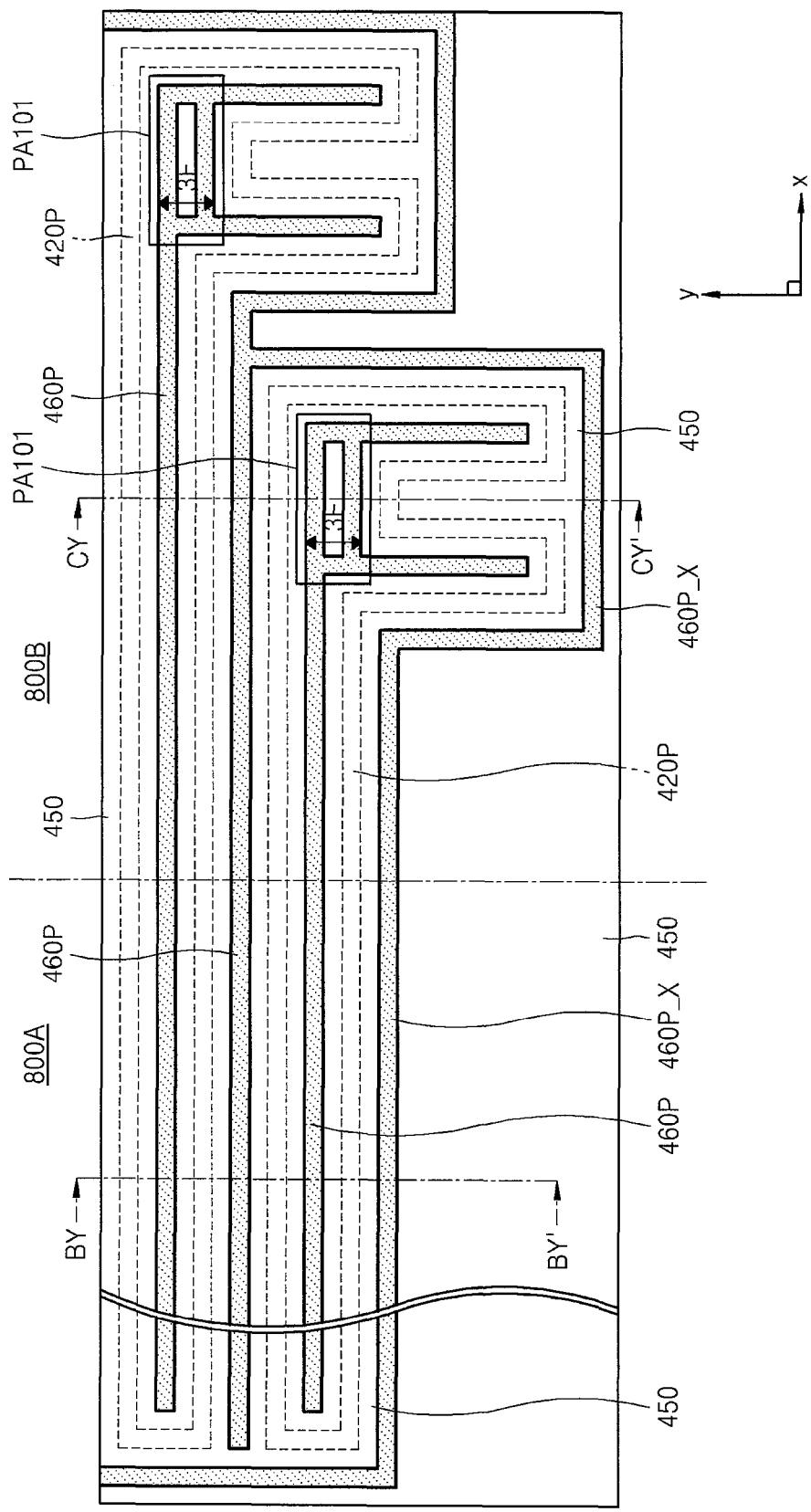
Figure 29B:
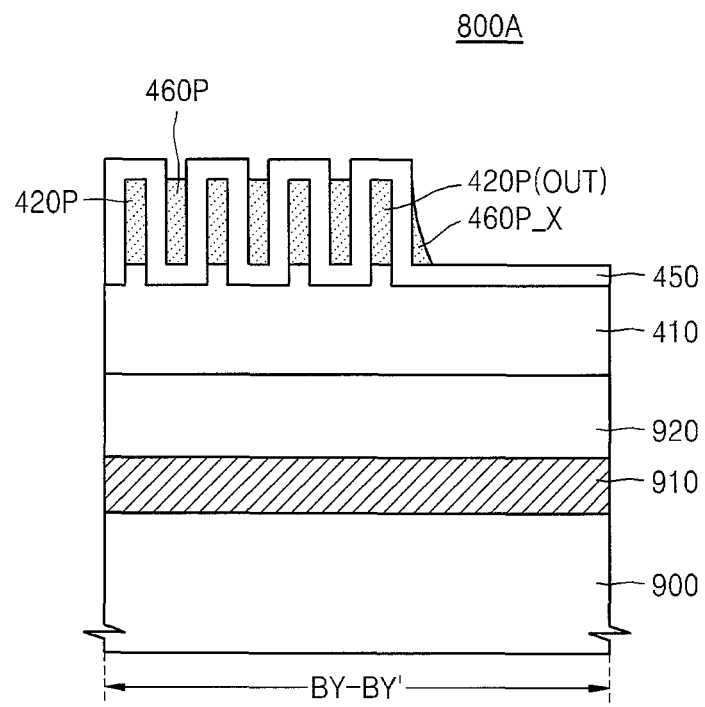
Figure 29C:
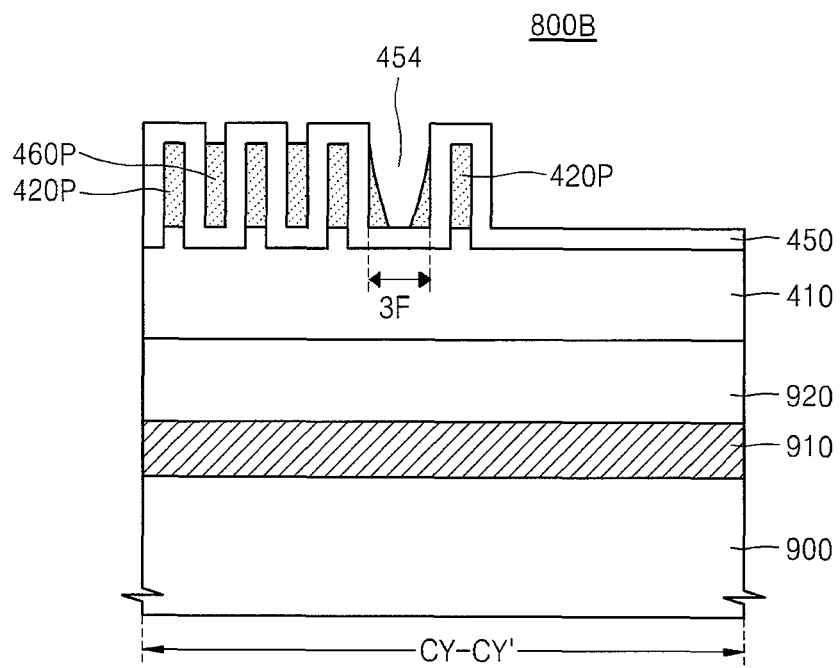

Referring to FIGS. 29A, 29B, and 29C, similarly as described above with reference to FIGS. 5G, 5H, and 5I, a second buffer layer 450 is deposited onto upper surfaces and sidewalls of the first mask patterns 420P and the low surfaces 410R of the feature layer 410 in the memory cell region 800A and the connection region 800B. Next in the memory cell region 800A and the connection region 800B, a second mask layer 460 (see FIG. 5H) is deposited on the second buffer layer 450 and is thereafter etched back until an upper portion of the second buffer layer 450 is exposed to form a plurality of second mask patterns 460P.

After the second mask patterns 460P are formed, an undesired remnant 460P_X of the second mask layer 460 may be present on a sidewall of the second buffer layer 350 covering the outer first mask pattern 420P(OUT) in the memory cell region 800A and the connection region 800B.

Referring to FIG. 29A, the width of the recessed space 454 in a region labeled as "PA101" is 3F in the Y-axis direction. Thus, after the second mask patterns 460P are formed, the second mask patterns 460P may remain as a spacer on sidewalls of the second buffer layer 450 in the recessed space 454 in the portion "PA101" of FIG. 29A.

Figure 30A:
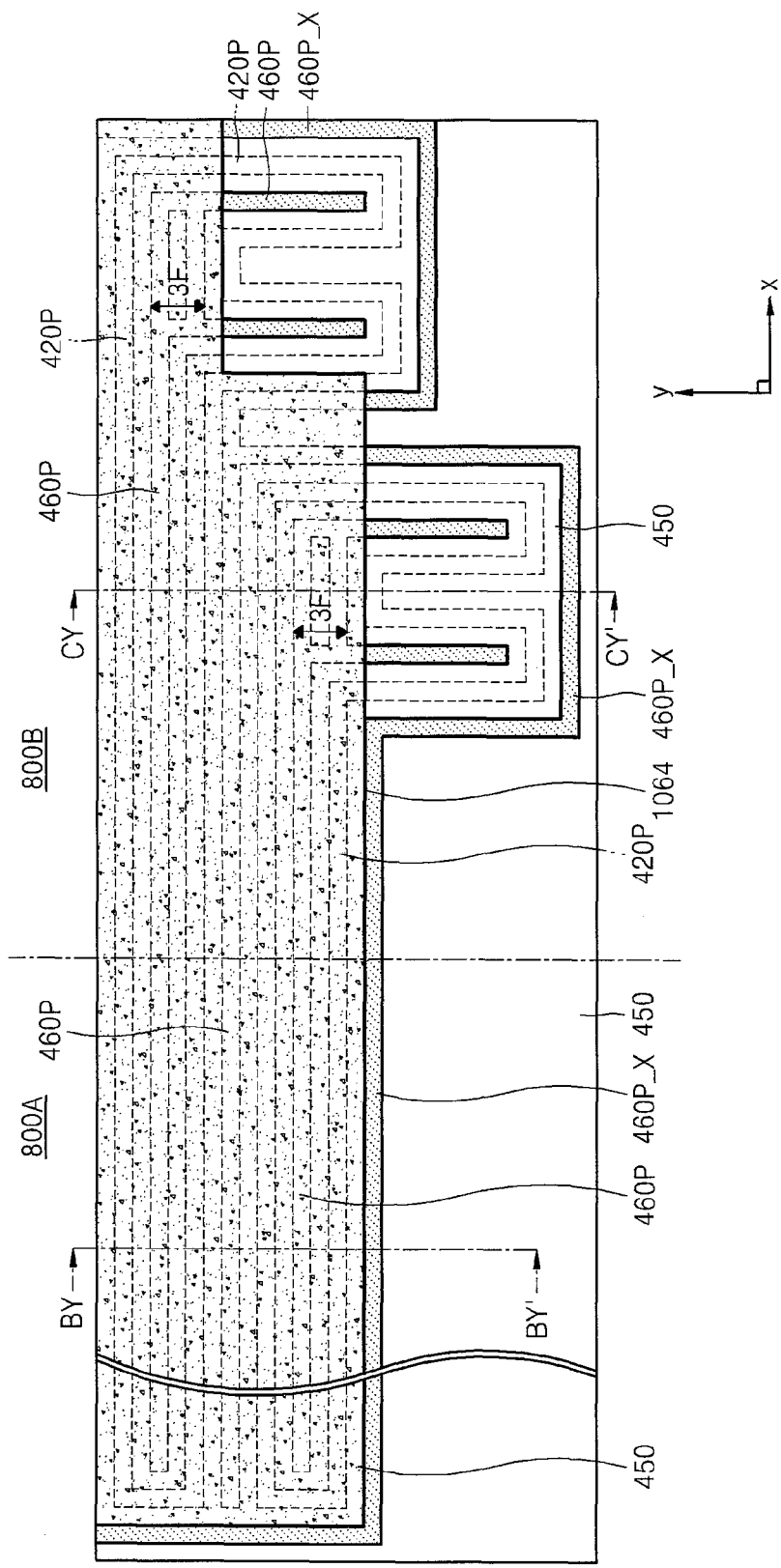
Figure 30B:
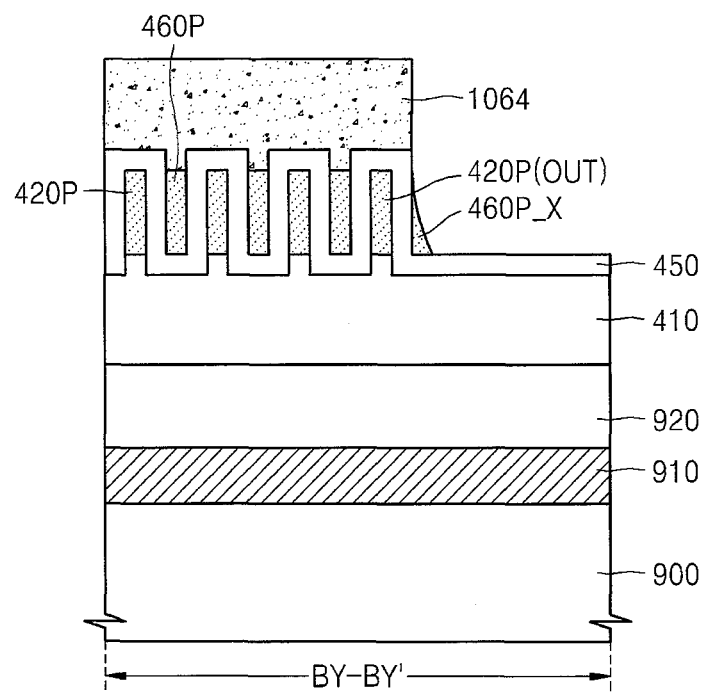
Figure 30C:
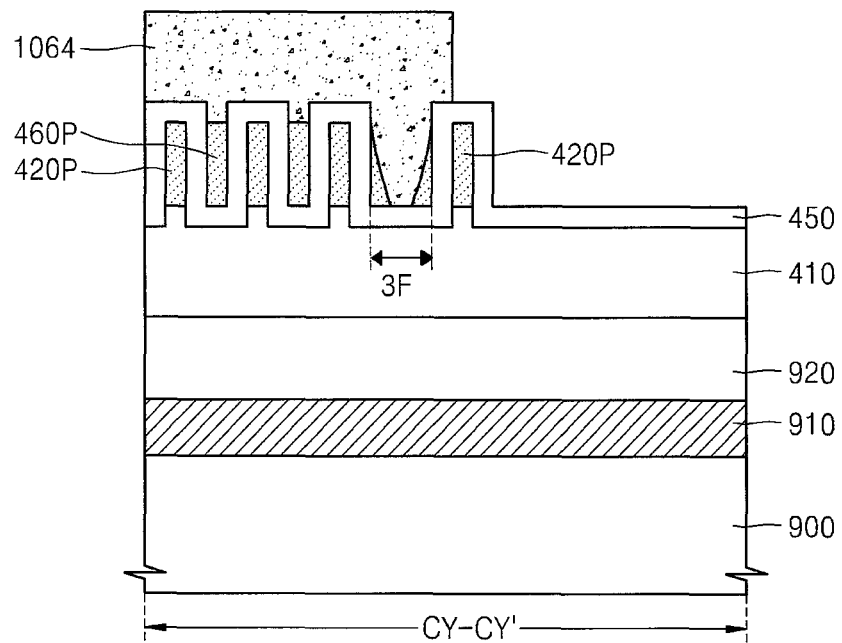

Referring to FIGS. 30A, 30B, and 30C, a third mask layer 1064 exposing the remnant 460P_X is formed in the memory cell region 800A and the connection region 800B. Accordingly, a portion of the second mask patterns 460P desired to be removed is exposed. The third mask layer 1064 of FIG. 30A is similar to the third mask layer 964 as described above with reference to FIGS. 14A, 14B, and 14C.

Figure 31A:
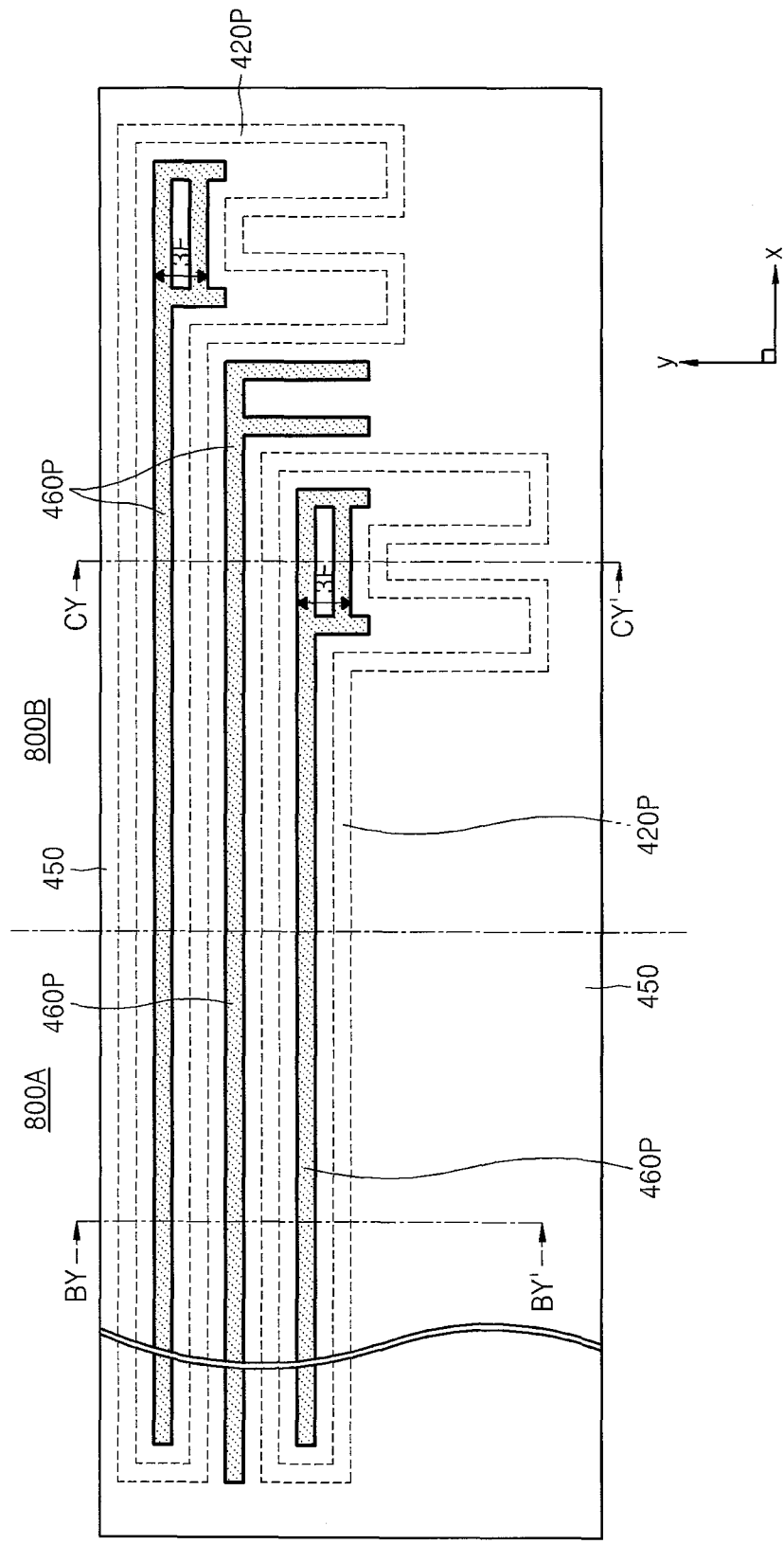
Figure 31B:
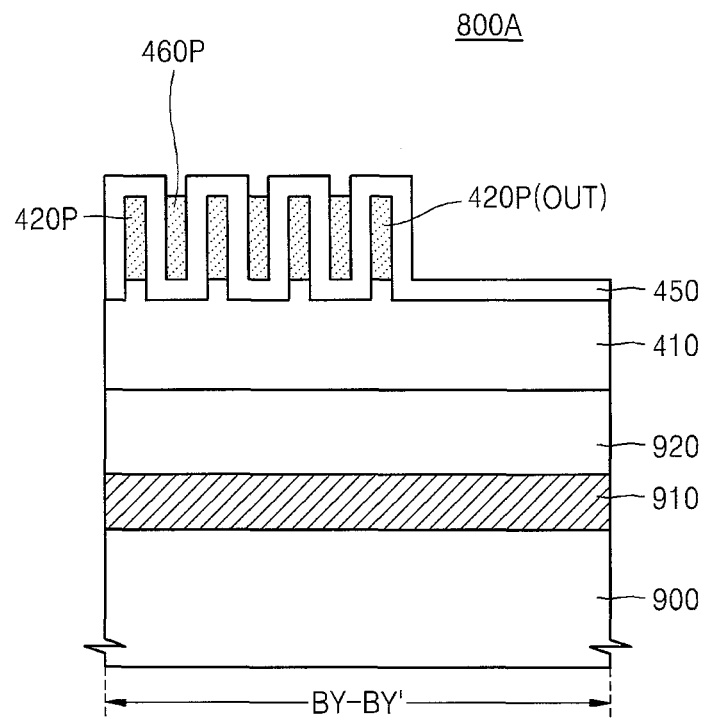
Figure 31C:
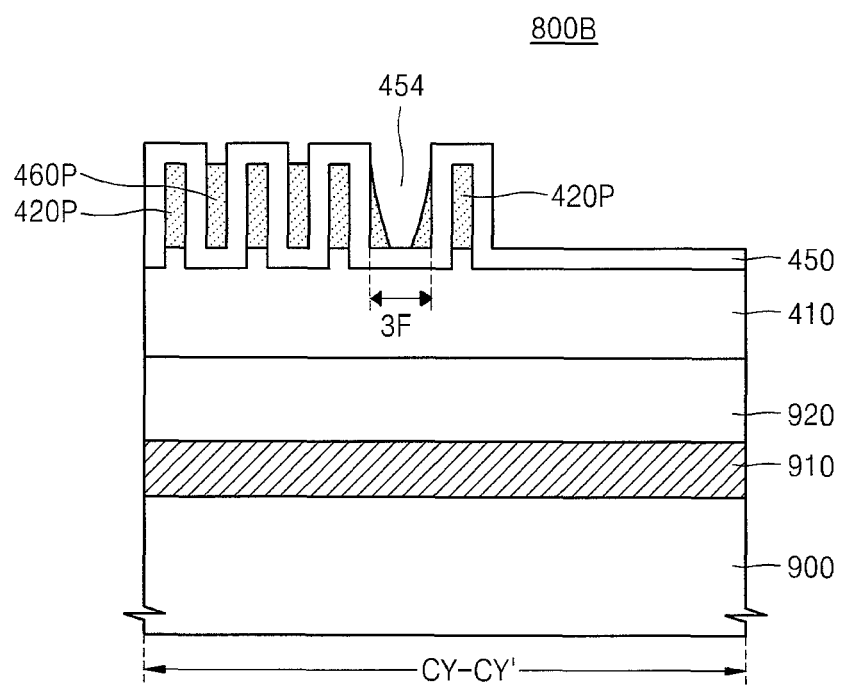

Referring to FIGS. 31A, 31B, and 31C, the remnant 460P_X and a portion of the second mask patterns 460P not disposed under the third mask layer 1064 are etched away. Isotropic wet or dry etching may be performed for removing such a portion of the second mask patterns 460P and the remnant 460P_X. After the remnant 460P_X is removed, the sidewall of the second buffer layer 450 covering the outer first mask pattern 420P(OUT) is exposed. Thereafter, the third mask layer 1064 is removed.

Figure 32A:
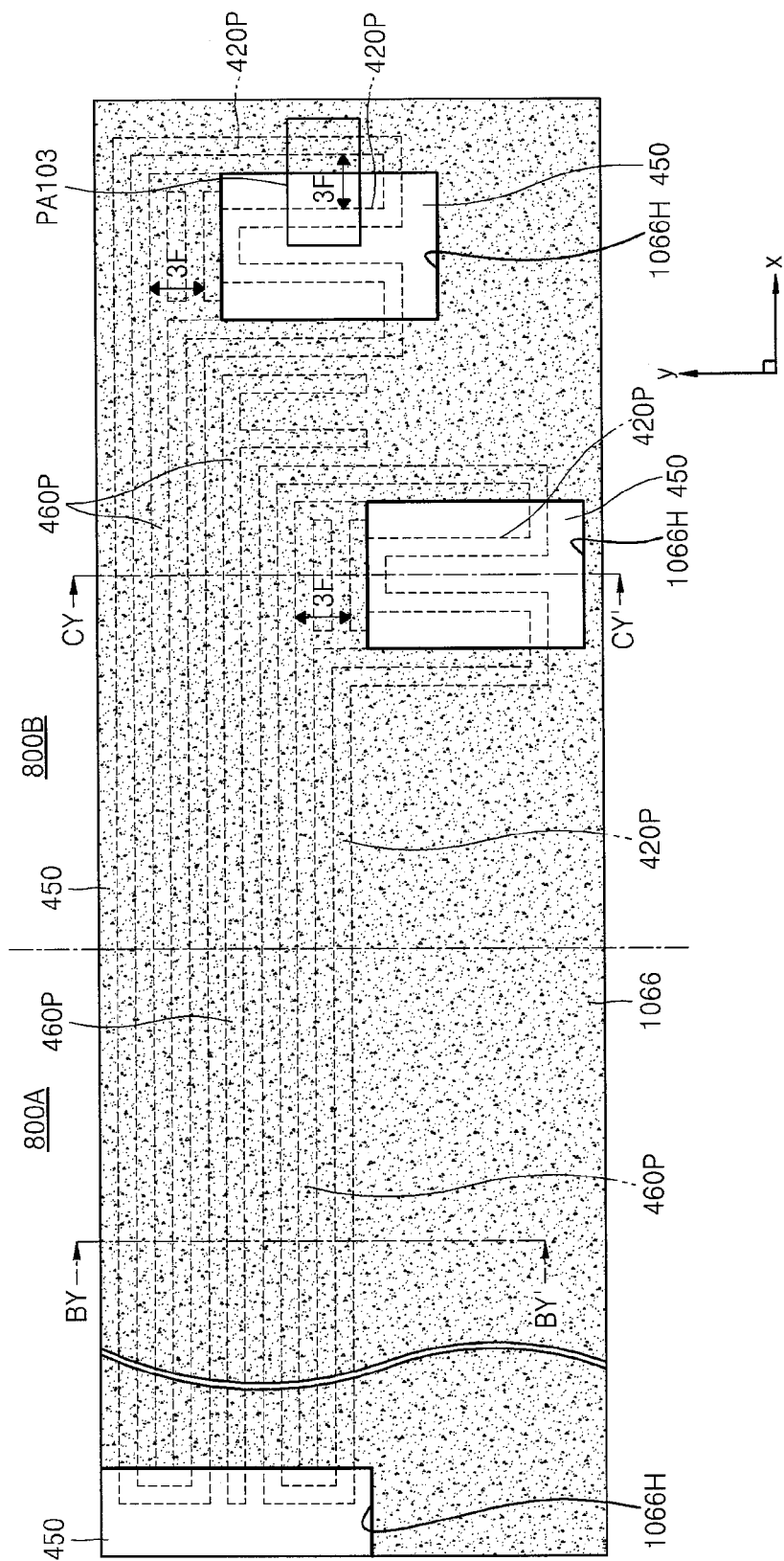
Figure 32B:
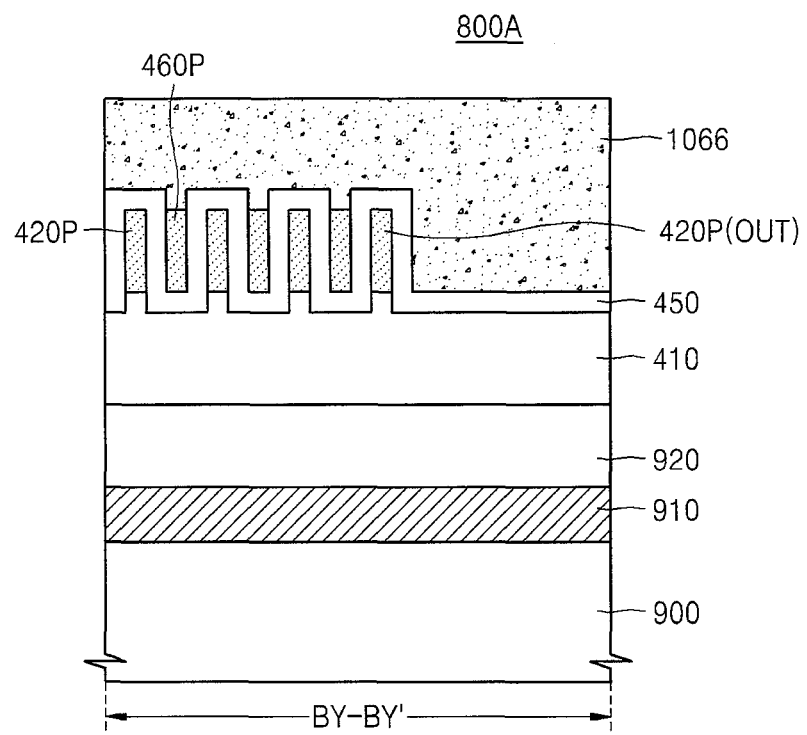
Figure 32C:
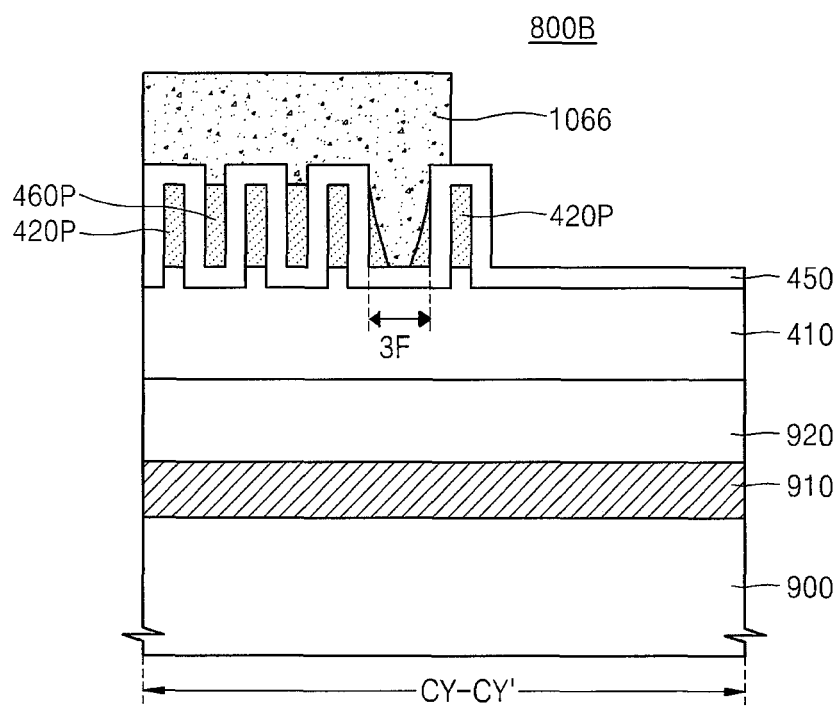

Referring to FIGS. 32A, 32B, and 32C, a trimming mask pattern 1066 having a plurality of apertures 1066H is formed on the second buffer layer 450 in the memory cell region 800A and the connection region 800B. A portion of the second buffer layer 450 covering a part of the first mask patterns 420P desired to be removed is exposed via the apertures 1066H in the memory cell region 800A and the connection region 800B.

The trimming mask pattern 1066 is desired to be aligned precisely such that only the undesired parts of the first and second mask patterns 420P and 460P are selectively removed in the connection region 800B. The apertures 1066H of the trimming mask pattern 1066 are easily aligned with a sufficient alignment margin of 3F as illustrated in a region labeled as "PA103" in FIG. 32A. The trimming mask pattern 1066 may be a photoresist pattern, in an example embodiment of the present invention.

Figure 33B:
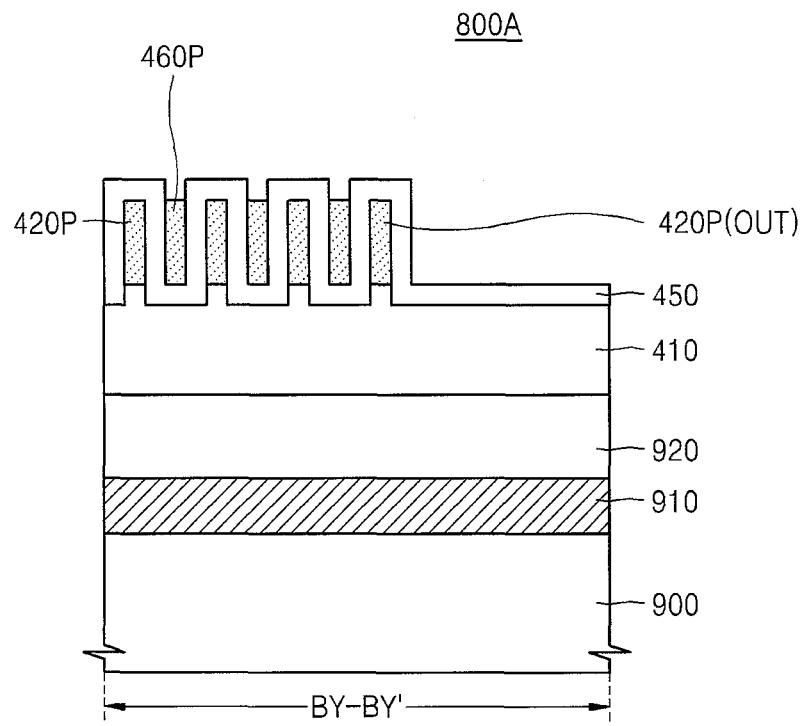
Figure 33C:
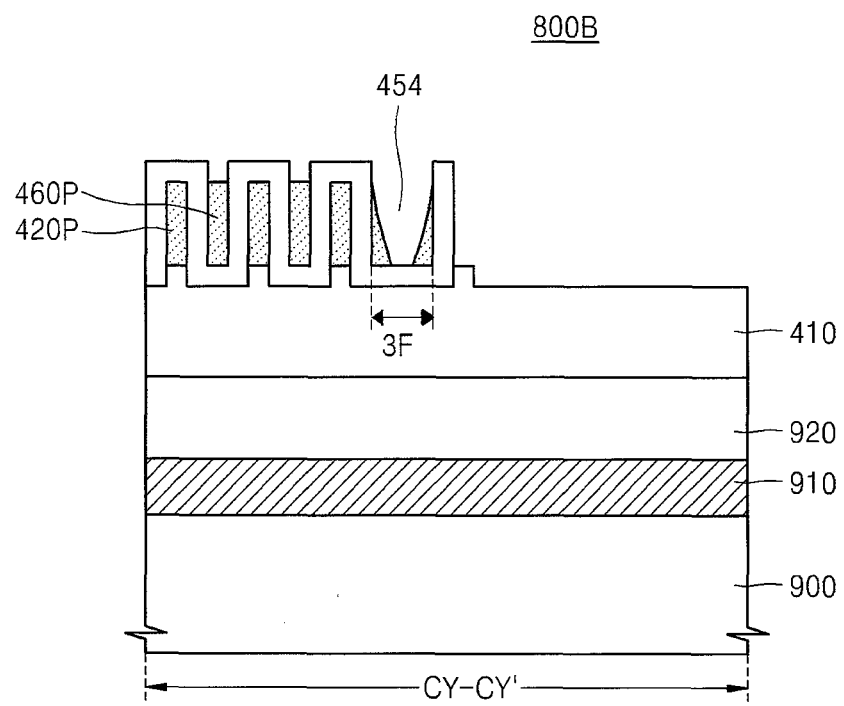

Referring to FIGS. 33A, 33B, and 33C, a trimming process is performed by etching away structures within the apertures 1066H until the feature layer 410 is exposed therein. Subsequently, the trimming mask pattern 1066 is removed. A portion of the second mask patterns is trimmed during fabrication of the fourth branch portion such that the fourth branch portion 1044 is shorter than the second branch portion 1024 in FIG. 25.

Figure 34B:
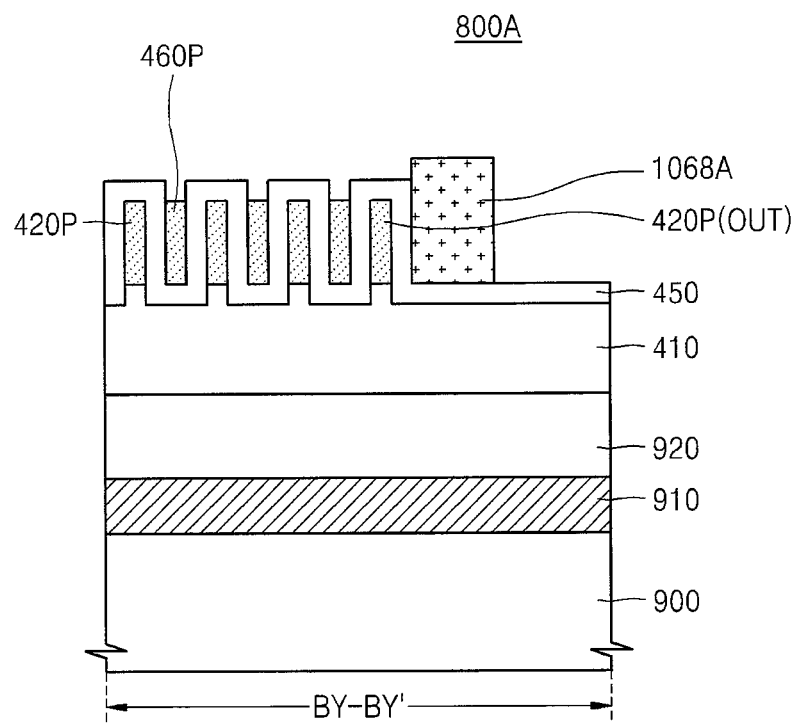
Figure 34C:
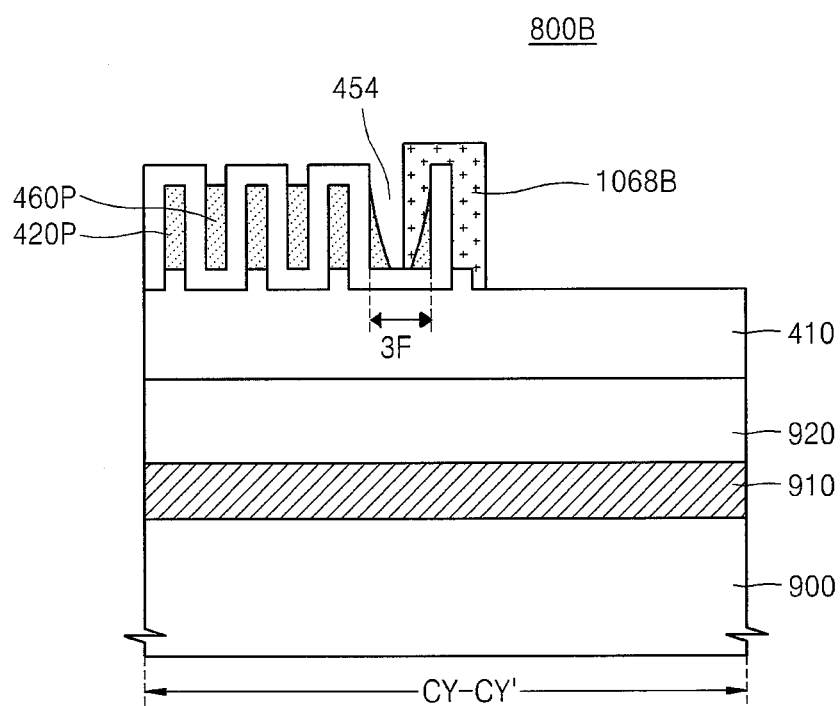

Referring to FIGS. 34A, 34B, and 34C, a plurality of wide mask patterns 1068 are formed in the memory cell region 800A and the connection region 800B, similarly as described above with reference to FIG. 5K. The wide mask patterns 1068 include a first wide mask pattern 1068A and a plurality of second wide mask patterns 1068B.

The first wide mask pattern 1068A is formed on the second buffer layer 450 in the memory cell region 800A adjacent to the outer first mask pattern 420P(OUT) and parallel with the first mask patterns 420P. The plurality of second wide mask patterns 1068B are formed on the first and second mask patterns 420P and 460P in the connection region 800B. Although not shown, one wide mask pattern 1068 may be formed in a peripheral circuit region (similar as the peripheral circuit region 800C in FIG. 8 for example).

The first wide mask pattern 1068A is an etch mask pattern for forming the relatively wide ground selection line GSL of FIG. 25 in the memory cell region 800A. Although not shown, a relatively wide string selection line SSL may also be formed with a corresponding wide mask pattern. The second wide mask patterns 1068B are etch mask patterns for forming the plurality of first, second, third, and fourth contact pads 1018, 1028, 1038, and 1048 of FIG. 25 in the connection region 800B.

According to an example embodiment of the present invention, the distances or widths DF121, DF122, and DF123 of FIG. 26A are sufficient for forming a desired number of the wide mask patterns 1068B on a limited space without causing electrical short circuiting of the resulting contact pads 1018, 1028, 1038, and 1048. The wide mask patterns 1068 are comprised of a material having a different etch selectivity from the second buffer layer 450 and the feature layer 410. For example, the wide mask patterns 1068 are comprised of a spin-on hardmask (SOH) material.

Figure 35A:
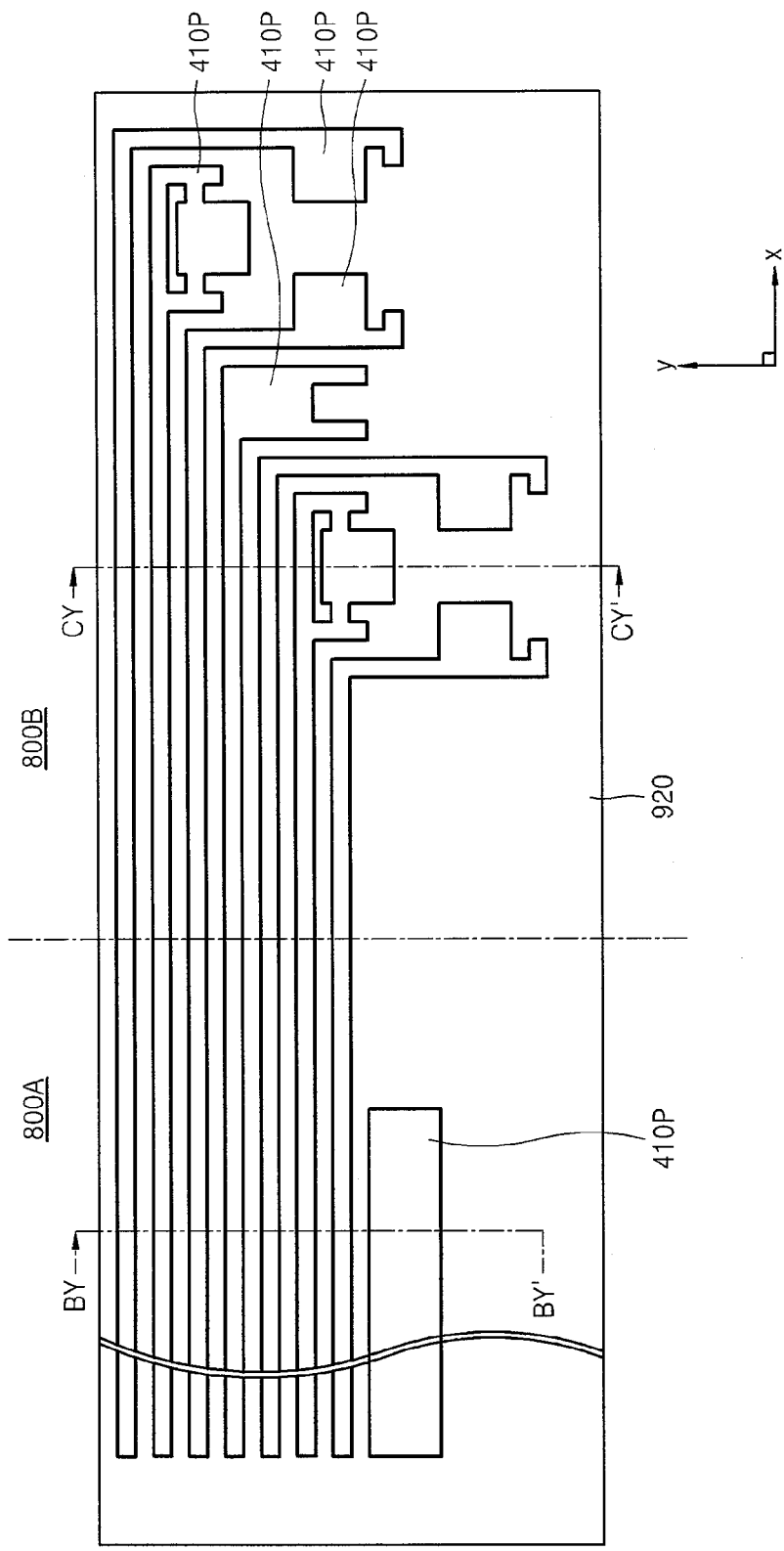
Figure 35B:
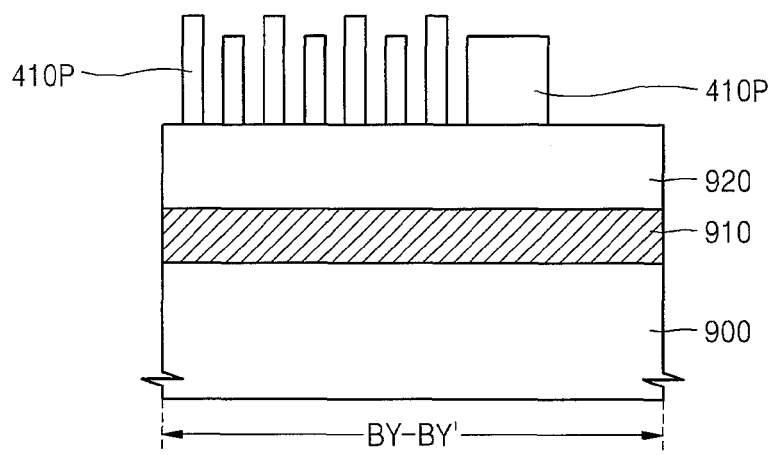
Figure 35C:
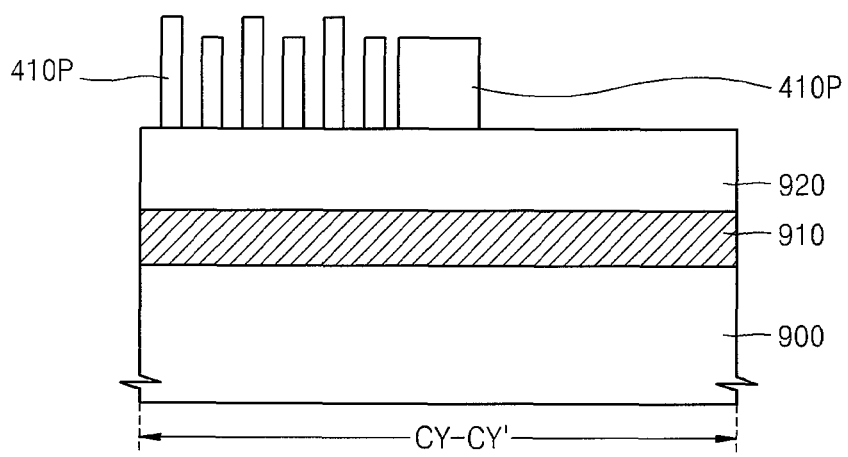

Referring to FIGS. 35A to 35C, a plurality of feature patterns 410P is formed in the memory cell region 800A and the connection region 800B by etching away portions of the second buffer layer 450 and the feature layer 410 using the first mask patterns 420P, the second mask patterns 460P, and the wide mask patterns 1068 as an etch mask, similarly as described above with reference to FIG. 5L.

Figure 36A:
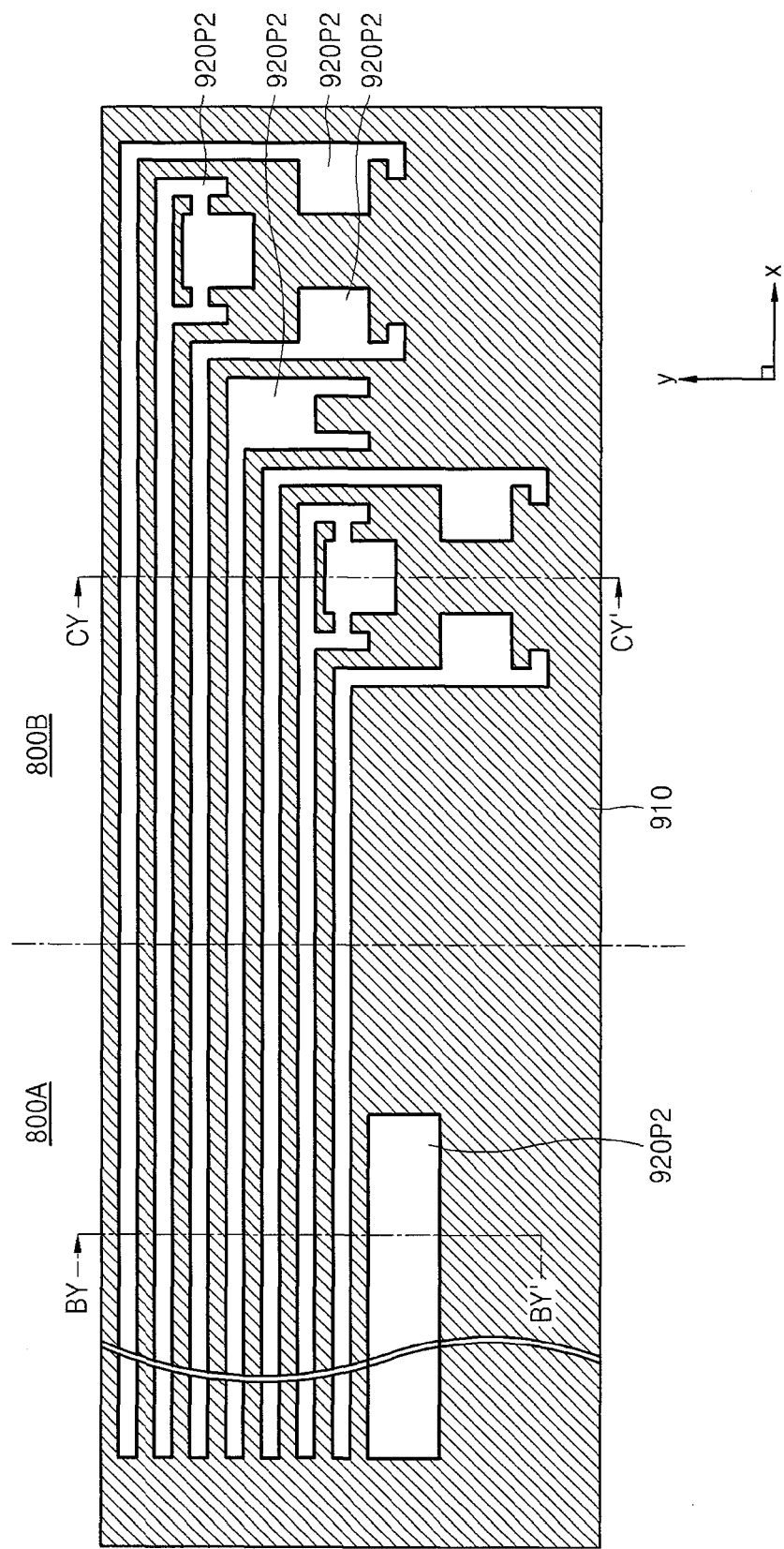
Figure 36B:
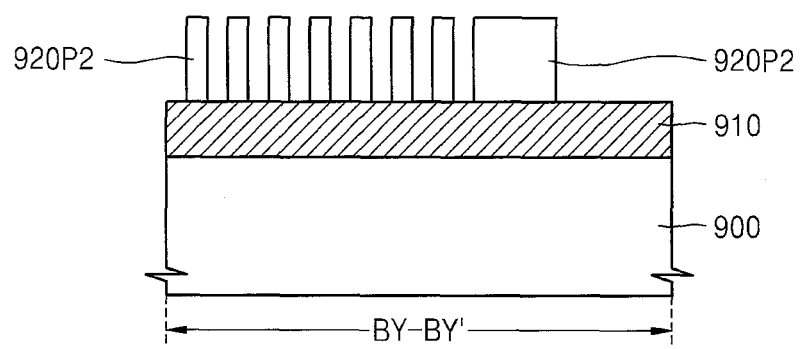
Figure 36C:
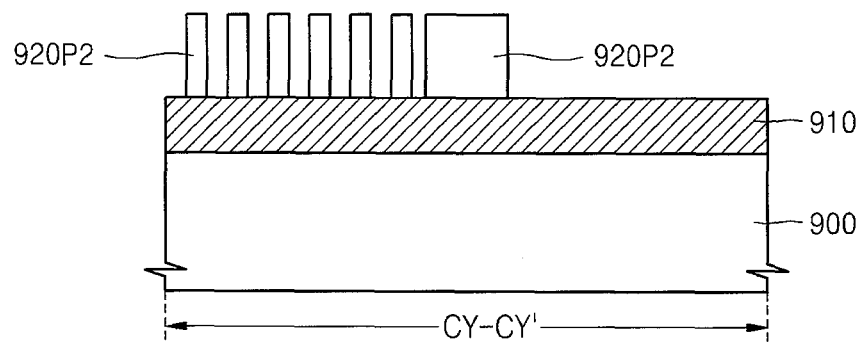

Referring to FIGS. 36A, 36B, and 36C, a plurality of hard mask patterns 920P2 is formed in the memory cell region 800A and the connection region 800B by patterning the hard mask layer 920 using the feature patterns 410P as an etch mask.

Figure 37A:
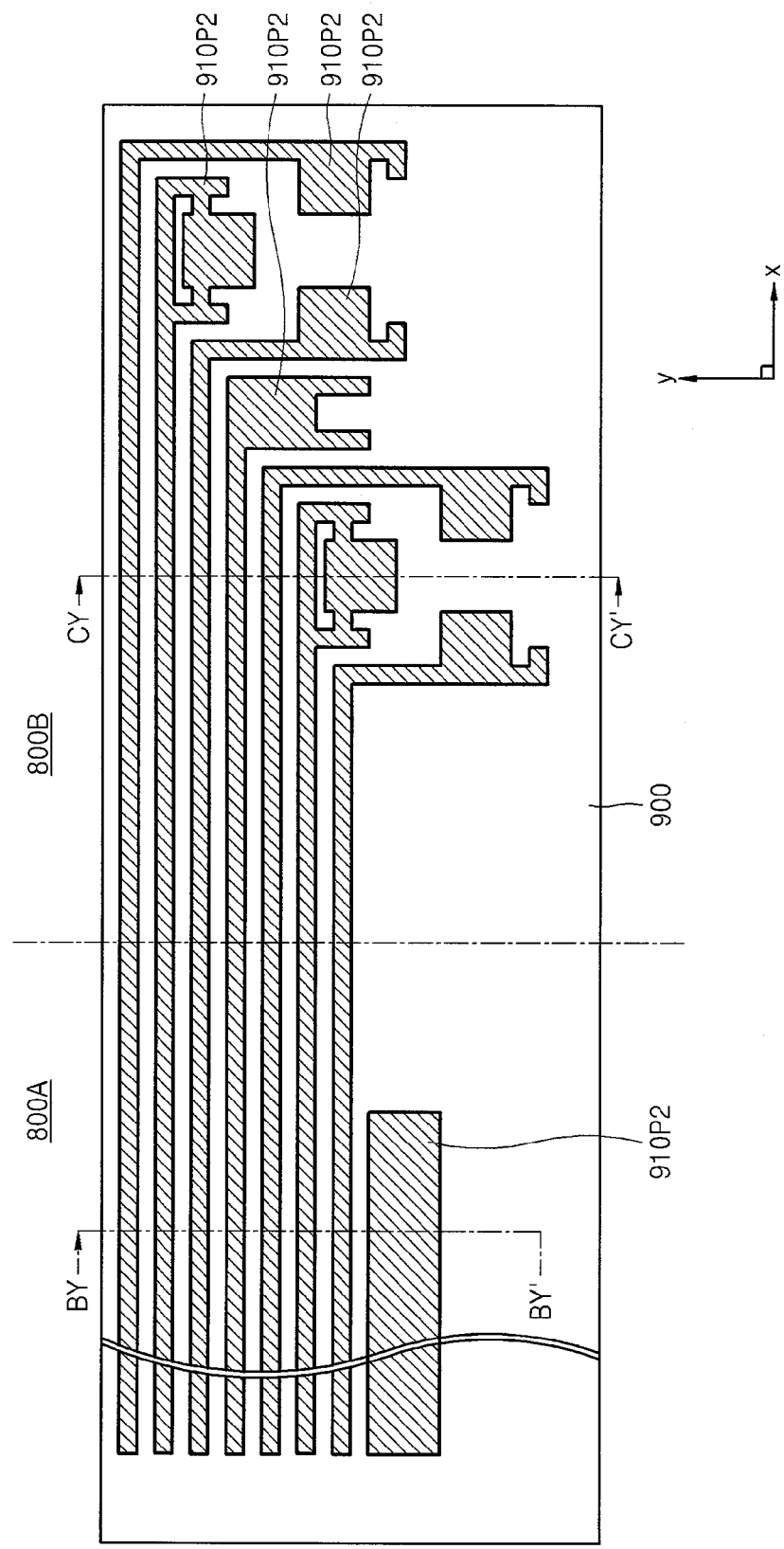
Figure 37B:
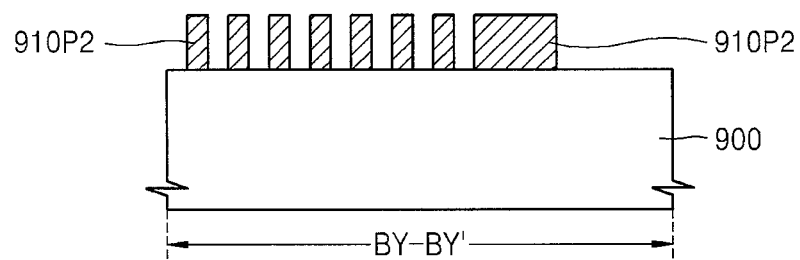
Figure 37C:
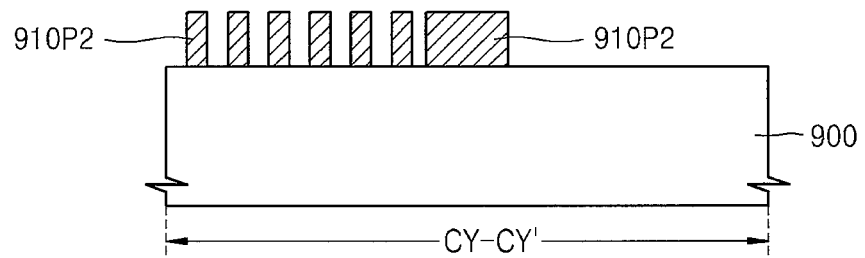

Referring to FIGS. 37A, 37B, and 37C, a plurality of conductive patterns 910P2 is formed in the memory cell region 800A and the connection region 800B by patterning the conductive layer 910 using the hard mask patterns 920P2 as an etch mask.

The plurality of conductive patterns 910P2 includes the conductive lines M100, M101, M102, . . . , the ground selection line GSL, and the contact pads 1018, 1028, 1038, and 1048 of FIG. 25 in the memory cell region 800A and the connection region 800B. Although not shown, the conductive patterns 910P2 may also include a string selection line SSL in the memory cell region 800A. Although not shown, the plurality of conductive patterns 910P2 may further include a peripheral circuit conductive pattern in the peripheral circuit region (not shown). A respective contact pad such as 1018, 1028, 1038, or 1048 is formed to be integral with each of the conductive lines M100, M101, M102, . . . .

Figure 38:
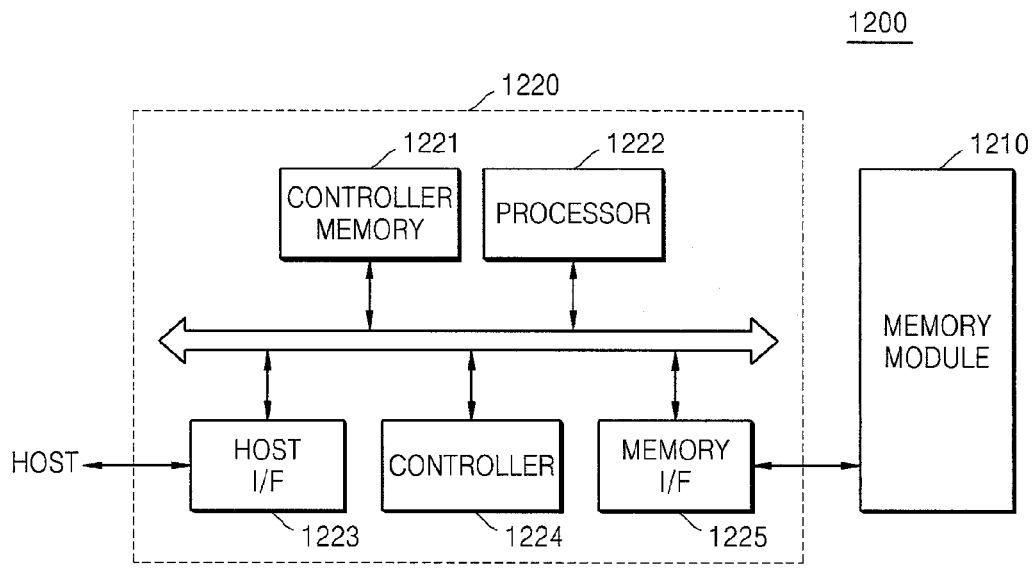
FIG. 38 is a block diagram of a memory card including a semiconductor device formed according to embodiments of the present invention.

FIG. 38 is a block diagram of a memory card 1200 including a semiconductor device according to an embodiment of the present invention. The memory card 1200 includes a memory controller 1220 and a memory module 1210. The memory controller 1220 generates a command or address signal C/A. The memory module 1210 includes at least one flash memory device in an example embodiment of the present invention.

The memory controller 1220 includes a host interface 1223 that transmits a command or address signal C/A to a host (not shown) or receives the command or address signal C/A from the host, and a memory interface 1225 that transmits a command or address signal C/A to a host (not shown) or receives the command or address signal C/A from the memory module 1210.

The host interface 1223, a controller 1224, and the memory interface 1225 communicate with a controller memory 1221 and a processor 1222 via a common bus. The controller memory 1221 may be a static random access memory (SRAM), and the processor 1222 may be a central processing unit (CPU).

The memory module 1210 receives a command or address signal C/A from the memory controller 1220, and stores data in at least one of memory devices included in the memory module 1210. Alternatively, the memory module 1210 searches at least one of the memory devices for data in response to the command or address signal C/A. Each of the memory devices includes a plurality of addressable memory cells, and a decoder that receives a command or address signal C/A to generate a row or column signal for accessing at least one of the addressable memory cells during a program or read operation.

The devices 1221, 1222, 1223, 1224, and 1225 included in the memory controller 1220, and the memory module 1210 may include fine patterns formed according to the embodiments of present invention as described herein.

Figure 39:
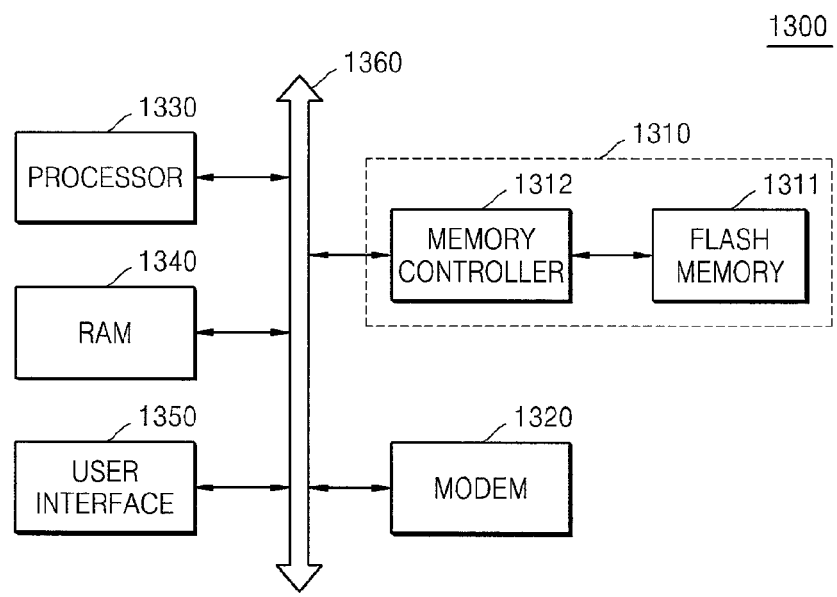
FIG. 39 is a block diagram of a memory system that includes a memory card including a semiconductor device formed according to embodiments of the present invention.

FIG. 39 is a block diagram of a memory system 1300 including a memory card 1310 with a semiconductor device formed according to an embodiment of the present invention. The memory system 1300 includes a processor 1330 such as a CPU (central processing unit) that communicates via a common bus 1360. The memory system 1300 also includes a random access memory unit 1340, a user interface 1350, and a modem 1320 that transmit/receive a signal to/from the memory card 1310 via the common bus 1360.

The elements of the memory system 1300 such as the memory card 1310, the processor 1330, the random access memory unit 1340, the user interface 1350, and the modem 1320 may include fine patterns formed according to the embodiments of present invention as described herein. The memory system 1300 may be used in various fields of the electronics industry. For example, the memory system 1300 may be used in solid state drives (SSDs), CMOS image sensors (CISs), and computer application chip sets.

Memory systems or memory devices, such as those disclosed in the present specification, may be packaged in the form of one of various types of packages such as ball grid arrays (BGAs), chip scale packages (CSPs), plastic leaded chip carriers (PLCCs), plastic dual in-line packages (PDIPs), multi-chip packages (MCP), wafer-level fabricated packages (WFPs), or wafer-level processed stock packages (WSP).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept.

Accordingly, all such modifications are intended to be included within the scope of the present inventive concept as defined in the claims. In the claims, means-plus-function clauses are intended to cover the structures described herein as performing the recited function and not only structural equivalents but also equivalent structures.

Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

The present invention is limited only as defined in the following claims and equivalents thereof.

The invention claimed is:

1. A semiconductor device comprising:
   a first structure including a first line portion extending in a first direction, and including a first branch portion extending from the first line portion in a second direction different from the first direction, wherein lines of said first and second directions define a plane parallel with a semiconductor substrate;
   a second structure including a second line portion extending in the first direction, and including a second branch portion extending from the second line portion in a direction different from the first direction; and
   a third structure including a third line portion extending in the first direction, and including a third branch portion with first and second parts extending from the third line portion in a direction different from the first direction,
   wherein the first and second parts of the third branch portion are disposed between the first and second branch portions;
   and wherein the third structure further includes a connection portion connecting the first and second parts of the third branch portion, and wherein facing edges of the connection portion and the third line portion are parallel along the first direction and are separated by a distance of a width of the third line portion;
   and wherein the first branch portion and the first part of the third branch portion are disposed next to each other, and wherein the second branch portion and the second part of the third branch portion are disposed next to each other;
   and wherein the first line portion and the third line portion are disposed next to each other, and wherein the second line portion and the third line portion are disposed next to each other,
   and wherein the first and second branch portions extend along said second direction to respective points, and wherein the third branch portion extends along said second direction to a respective end point shorter than said respective points of the first and second branch portions, and wherein a material of said third branch portion is not formed beyond said respective end point of the third branch portion.

2. The semiconductor device of claim 1, wherein the first, second, and third structures are comprised of a same material and are formed on said plane that is parallel with said semiconductor substrate.

3. The semiconductor device of claim 1, wherein the first part of the third branch portion extends from a middle section of the third line portion, and wherein the second part of the third branch portion extends from an end of the third line portion.

4. The semiconductor device of claim 3, wherein the first branch portion extends from an end of the first line portion, and wherein the second branch portion extends from an end of the second line portion.

5. The semiconductor device of claim 1, further comprising, a first contact pad formed to be integral with the first branch portion;

a second contact pad formed to be integral with the second branch portion; and a third contact pad formed to be integral with the third branch portion.

6. The semiconductor device of claim 1, wherein a distance between facing edges of the first and second parts of the third branch portion is greater than a distance between facing edges of the first branch portion and the first part of the third branch portion.

7. The semiconductor device of claim 6, wherein a distance between facing edges of the first and second parts of the third branch portion is greater than a distance between facing edges of the second branch portion and the second part of the third branch portion.

8. The semiconductor device of claim 7, wherein the first, second, and third structures have a first width.

9. The semiconductor device of claim 8, wherein a distance between facing edges of the first and third structures is the first width, and wherein a distance between facing edges of the second and third structures is the first width.

10. The semiconductor device of claim 1, further comprising, a fourth structure including a fourth line portion extending in the first direction, and including a fourth branch portion extending from the fourth line portion in a direction different from the first direction;

wherein the fourth branch portion and the second branch portion are disposed next to each other;

and wherein a distance between the first and second parts of the third branch portion is greater than a distance between the fourth branch portion and the second branch portion;

and wherein the first, second, third, and fourth structures have a same width.

11. The semiconductor device of claim 10, wherein the width of the fourth structure is same as a distance between the fourth branch portion and the second branch portion.

12. The semiconductor device of claim 10, wherein a distance between the fourth branch portion and the second branch portion is same as the width of the first, second, third, and fourth structures.

13. A semiconductor device comprising:

a first structure comprised of a first material and formed on a first plane;

a second structure comprised of the first material and formed on the first plane; and a third structure including a third line portion extending in a first direction and formed on the first plane, and including a third branch portion with first and second parts extending from the third line portion in a second direction different from the first direction and disposed between the first and second structures, wherein the first plane is parallel to a semiconductor substrate, and wherein lines of said first and second directions define the first plane parallel with the semiconductor substrate;

wherein the first structure and the first part of the third branch portion are disposed next to each other;

and wherein the second structure and the second part of the third branch portion are disposed next to each other, and wherein the third structure further includes a connection portion connecting the first and second parts of the third branch portion, and wherein facing edges of the connection portion and the third line portion are parallel along the first direction and are separated by a distance of a width of the third line portion;

and wherein the first and second structures include first and second branch portions extending along said second direction to respective points, and wherein the third branch portion extends along said second direction to a respective end point shorter than said respective points of the first and second branch portions, and wherein a material of said third branch portion is not formed beyond said respective end point of the third branch portion.

14. The semiconductor device of claim 13, further comprising, a first contact pad formed to be integral with the first structure;

a second contact pad formed to be integral with the second structure; and a third contact pad formed to be integral with the third branch portion.

15. The semiconductor device of claim 14, wherein the third branch portion further includes a third part that is the connection portion extending between the first and second parts of the third branch portion.

16. The semiconductor device of claim 15, wherein the third contact pad is formed to be integral with the third part of the third branch portion.

* * * * *